US010559652B2

(12) United States Patent
Fukui et al.

(10) Patent No.: US 10,559,652 B2
(45) Date of Patent: Feb. 11, 2020

(54) SEMICONDUCTOR DEVICE

(71) Applicant: Mitsubishi Electric Corporation, Chiyoda-ku (JP)

(72) Inventors: Yutaka Fukui, Tokyo (JP); Katsutoshi Sugawara, Tokyo (JP); Shiro Hino, Tokyo (JP); Kazuya Konishi, Tokyo (JP); Kohei Adachi, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/063,733

(22) PCT Filed: Nov. 22, 2016

(86) PCT No.: PCT/JP2016/084570
§ 371 (c)(1),
(2) Date: Jun. 19, 2018

(87) PCT Pub. No.: WO2017/138215
PCT Pub. Date: Aug. 17, 2017

(65) Prior Publication Data
US 2019/0333986 A1    Oct. 31, 2019

(30) Foreign Application Priority Data
Feb. 9, 2016    (JP) .................................. 2016-022668

(51) Int. Cl.
*H01L 29/06*    (2006.01)
*H01L 29/423*   (2006.01)
(Continued)

(52) U.S. Cl.
CPC ...... *H01L 29/0619* (2013.01); *H01L 29/0865* (2013.01); *H01L 29/1095* (2013.01);
(Continued)

(58) Field of Classification Search
CPC ............. H01L 29/0619; H01L 29/0865; H01L 29/1095; H01L 29/1608; H01L 29/36;
(Continued)

(56) References Cited

U.S. PATENT DOCUMENTS 10,424,642 B2 *  9/2019  Shiomi ............... H01L 29/1095
2011/0291110 A1 * 12/2011  Suzuki ............... H01L 29/0878
                                                            257/77

(Continued)

FOREIGN PATENT DOCUMENTS

JP    2013-243213 A    12/2013
JP    2014-175314 A     9/2014
(Continued)

OTHER PUBLICATIONS

Written Opinion of the International Searching Authority issued in PCT/JP2016/0847570 dated Feb. 21, 2017 (with English translation).

*Primary Examiner* — Allan R Wilson
(74) *Attorney, Agent, or Firm* — Oblon, McClelland, Maier & Neustadt, L.L.P.

(57) ABSTRACT

A gate connection layer (14) includes a portion placed on an outer trench (TO) with a gate insulating film (7) being interposed. A first main electrode (10) includes a main contact (CS) electrically connected to a well region (4) and a first impurity region (5) within an active region (30), and an outer contact (CO) being spaced away from the active region (30) and in contact with a bottom face of the outer trench (TO). A trench-bottom field relaxing region (13) is provided in a drift layer (3). A trench-bottom high-concentration region (18) has an impurity concentration higher than that of the trench-bottom field relaxing region (13), is provided on the trench-bottom field relaxing region (13), and extends from a position where it faces the gate connection layer (14) with the gate insulating film (7) being
(Continued)

interposed, to a position where it is in contact with the outer contact (CO) of the first main electrode (10).

12 Claims, 41 Drawing Sheets

(51) Int. Cl.
| | |
|---|---|
| *H01L 29/417* | (2006.01) |
| *H01L 29/08* | (2006.01) |
| *H01L 29/36* | (2006.01) |
| *H01L 29/16* | (2006.01) |
| *H01L 29/78* | (2006.01) |
| *H01L 29/739* | (2006.01) |
| *H01L 29/10* | (2006.01) |
| *H01L 21/04* | (2006.01) |
| *H01L 21/02* | (2006.01) |
| *H01L 23/544* | (2006.01) |
| *H01L 29/66* | (2006.01) |

(52) U.S. Cl.
CPC .......... *H01L 29/1608* (2013.01); *H01L 29/36* (2013.01); *H01L 29/41741* (2013.01); *H01L 29/4236* (2013.01); *H01L 29/7397* (2013.01); *H01L 29/7811* (2013.01); *H01L 29/7813* (2013.01); *H01L 21/02378* (2013.01); *H01L 21/02529* (2013.01); *H01L 21/02634* (2013.01); *H01L 21/049* (2013.01); *H01L 21/0465* (2013.01); *H01L 21/0475* (2013.01); *H01L 23/544* (2013.01); *H01L 29/66068* (2013.01); *H01L 2223/54426* (2013.01)

(58) Field of Classification Search
CPC .......... H01L 29/41741; H01L 29/4236; H01L 29/7397; H01L 29/7811; H01L 29/7813
See application file for complete search history.

(56) References Cited

U.S. PATENT DOCUMENTS

| | | |
|---|---|---|
| 2015/0072485 A1 | 3/2015 | Takeuchi et al. |
| 2015/0221731 A1* | 8/2015 | Zeng .................... H01L 29/407 257/139 |
| 2016/0020289 A1 | 1/2016 | Nakano et al. |
| 2016/0190307 A1 | 6/2016 | Kagawa et al. |
| 2016/0225854 A1* | 8/2016 | Wada ................ H01L 29/66068 |
| 2017/0133466 A1* | 5/2017 | Shiomi .............. H01L 29/0607 |
| 2018/0315813 A1* | 11/2018 | Shiomi .............. H01L 21/0465 |

FOREIGN PATENT DOCUMENTS

| | | |
|---|---|---|
| WO | WO 98/35390 A1 | 8/1998 |
| WO | WO 2015/015808 A1 | 2/2015 |

* cited by examiner

F I G . 2
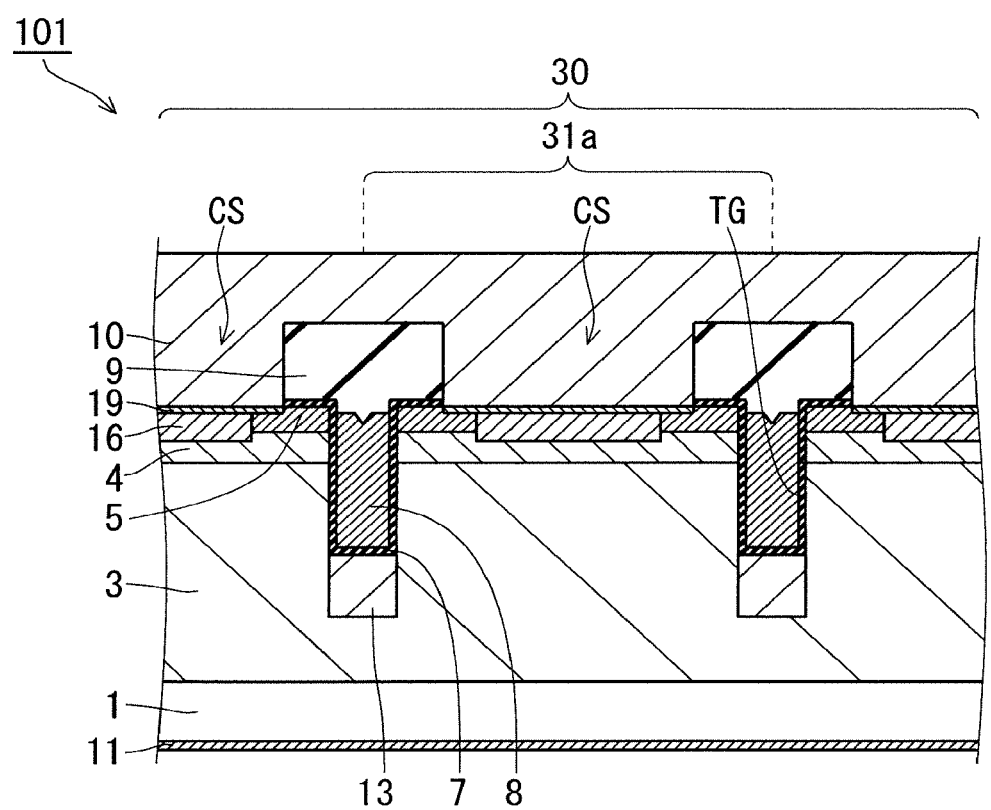

F I G . 1 3
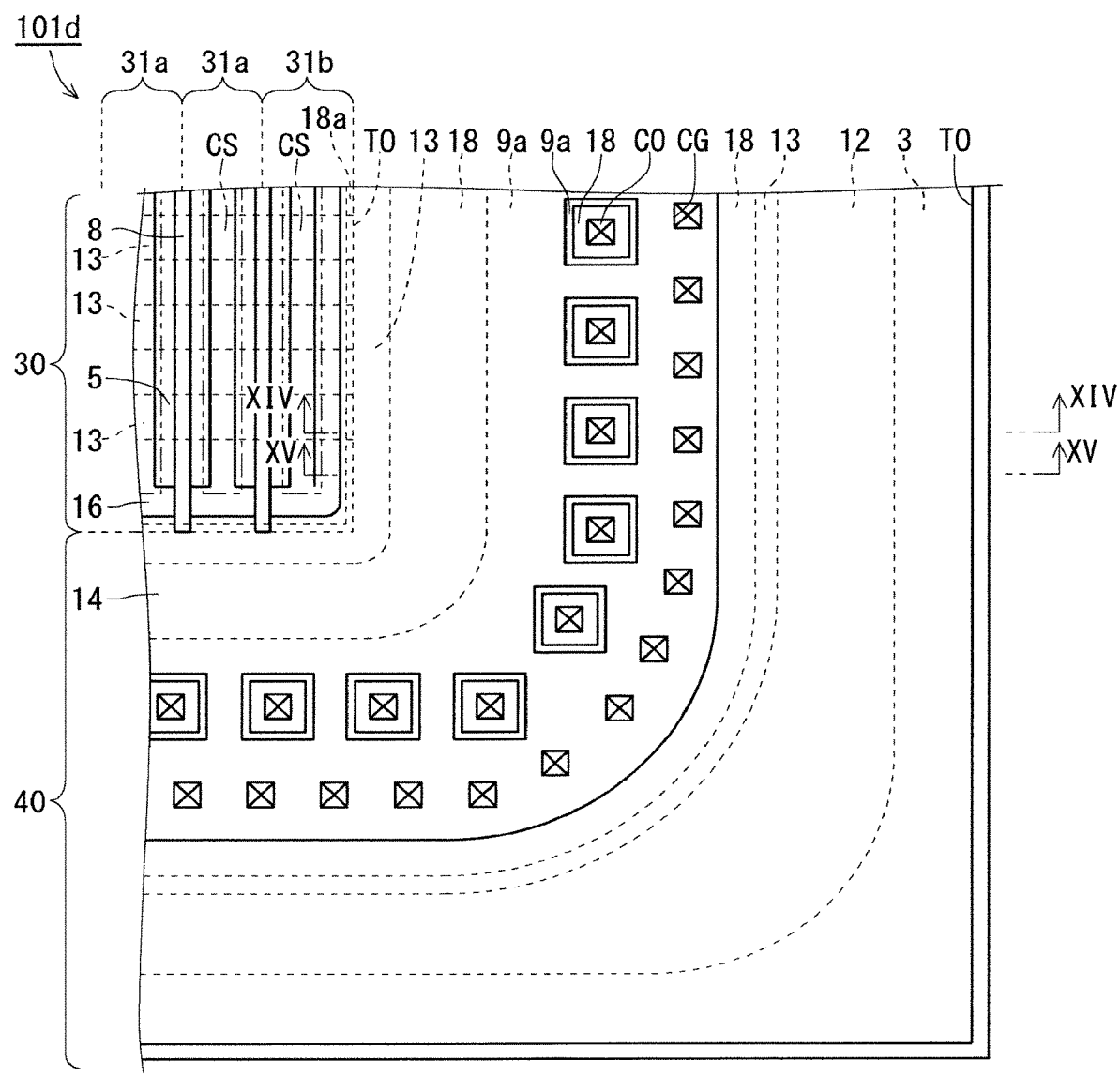

F I G. 3 1
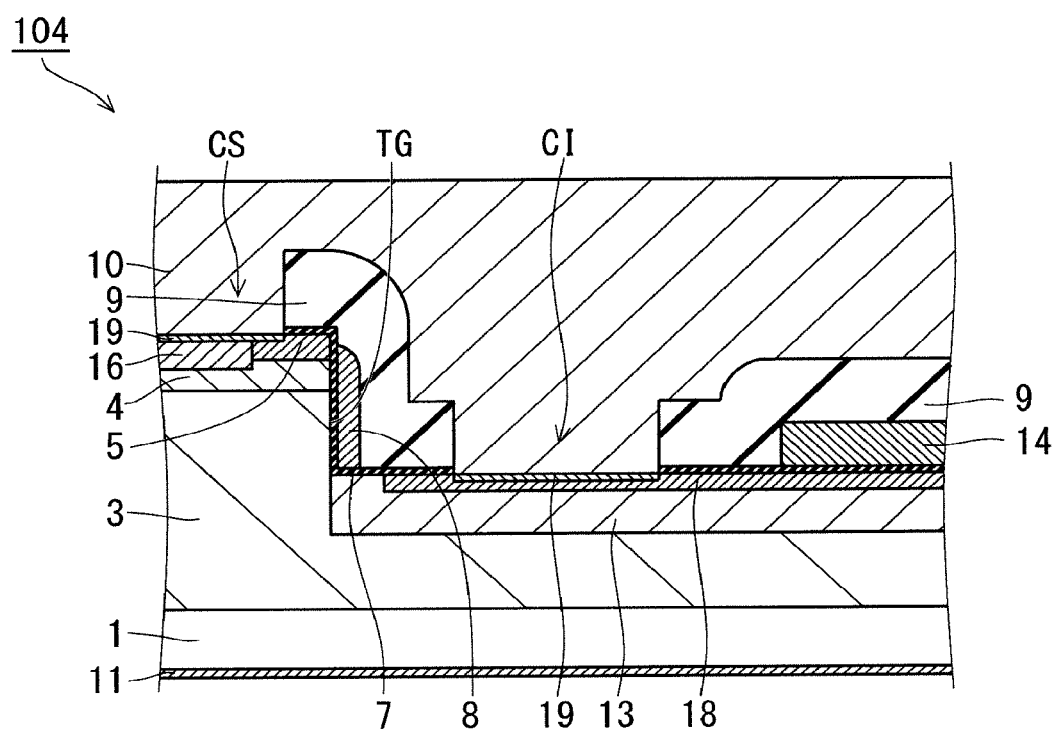

SEMICONDUCTOR DEVICE

TECHNICAL FIELD

The present invention relates to a semiconductor device, and particularly to a trench-gate semiconductor device.

BACKGROUND ART

In a power electronics apparatus, it is necessary to switch back and forth between execution and stop of power supply in order to drive a load such as an electric motor. To this end, a semiconductor switching element such as a metal-oxide-semiconductor field-effect transistor (MOSFET) or an insulated gate bipolar transistor (IGBT) is used. A current path of a semiconductor switching element is composed of a vertical structure or a lateral structure. In a vertical structure, a withstand voltage is ensured in a vertical direction, that is, a thickness direction, so that a high withstand voltage can be easily obtained. As a structure for a switching element, a structure having an insulated gate is employed in many cases, and there are two types of a planar switching element and a trench-gate switching element. A trench-gate switching element has an improved channel density, and so, can easily obtain low on-resistance. Such being the case, a vertical and trench-gate switching element is employed in many cases. As a semiconductor material for a switching element, silicon (Si) is typically used, and in recent years, also a wide-band-gap semiconductor typified by silicon carbide (SiC) is used.

International Application Laid-Open No. WO98/35390 (A1) (Patent Document 1) discloses a vertical and a trench-gate MOSFET using SiC. On a wall portion and a bottom portion of a trench of the MOSFET, a trench oxide (gate insulating film) is provided. In a region below the gate oxide film, a protective region (field relaxing region) of a conductivity type reverse to a conductivity type of each of a source and a drain, is provided. The foregoing document suggests that the protective region protects the gate oxide film from degradation or dielectric breakdown which is likely to be caused by a high voltage applied to the drain.

As described above, known is a technique of providing a field relaxing region for protecting a gate insulating film in a vertical and trench-gate switching element. Because of such a configuration, a depletion layer extends from a field relaxing region toward a drift layer in an off state of a switching element. This depletion layer can reduce an electric field applied to a gate insulating film on a bottom face of a gate trench. This behavior is particularly useful for a switching element using SiC, as compared to a switching element using Si. This is because, in a case where SiC is used, dielectric breakdown of a switching element is more likely to occur in a gate insulating film than in an SiC region being as a semiconductor region. The reason for this is that an avalanche field intensity of SiC is approximately ten times as high as that of Si. Thus, in a case where SiC is used as a semiconductor region, a gate insulating is likely to be subjected to dielectric breakdown earlier than a semiconductor region.

For a gate trench located inside an active region of a semiconductor element, the above-described field relaxing effect can be attained from not only a field relaxing region provided therein, but also a field relaxing region provided in another gate trench adjacent thereto. Meanwhile, for a gate trench located in an outermost edge of an active region, such additional effect as described above cannot be attained. Accordingly, there is vulnerability in that a gate insulating film is easily broken down in an outermost edge of an active region.

International Application Laid-Open No. WO2015/015808 (A1) (Patent Document 2) discusses a structure for a semiconductor device which has been devised considering the above-described problem. More specifically, a trench is provided in an active region, and further, a terminating trench is formed so as to surround the foregoing trench in a terminating region in a perimeter of the active region. A protective diffusion layer (field relaxing region) is provided below not only the trench in the active region, but also the terminating trench. As a result of this, the above-described vulnerability in a gate trench located in an outermost edge of an active region can be overcome. The protective diffusion layer may be connected to a source electrode via a contact hole, and effects in this case are described in Patent Document 2 as follows.

Upon a switching operation of a silicon-carbide semiconductor device, an on state and an off state alternate in a switching period. In an off state, carriers are diffused from a protective diffusion layer so that a depletion layer extends, while in an on state, the diffused carriers return back to an original state. If carriers are slow in returning at a time of switching to an on state, a switching speed is correspondingly reduced, to cause an increase of switching loss. Because of connection of the protective diffusion layer to the source electrode, the carriers are drawn back to the protective diffusion layer by virtue of a source potential, so that switching loss is reduced.

PRIOR ART DOCUMENTS

Patent Documents

Patent Document 1: International Application Laid-Open No. WO98/35390 (A1)
Patent Document 2: International Application Laid-Open No. WO2015/015808 (A1)

SUMMARY

Problem to be Solved by the Invention

During high-speed switching or a short circuit of a load, a transient current which charges a pn junction formed by a field relaxing region and a drift layer, flows. Because of voltage drop associated with a transient current, an electric field applied to an insulating film on a field relaxing region is instantaneously increased. Such a high electric field may possibly cause dielectric breakdown of a gate-drain insulating film, particularly a gate insulating film, on a field relaxing region.

The present invention has been devised in order to overcome the above-described problems, and it is an object of the present invention to provide a semiconductor device which can suppress dielectric breakdown of a gate-drain insulating film, particularly a gate insulating film, on a field relaxing region, during high-speed switching or a short circuit of a load.

Means to Solve the Problem

A semiconductor device according to the present invention includes a drift layer, a well region, a first impurity region, a gate trench, an outer trench, a gate insulating film, a gate electrode, a gate connection layer, a first main electrode, a second main electrode, a trench-bottom field relaxing region, and a trench-bottom high-concentration region. The drift layer lies over an active region and a region outside the active region and is of a first conductivity type. The well region is provided on the drift layer within the active region and is of a second conductivity type different from the first conductivity type. The first impurity region is provided on the well region, is separated from the drift layer by the well region and is of the first conductivity type. The gate trench is provided within the active region and includes a sidewall facing the first impurity region, the well region, and the drift layer. The outer trench is provided in the drift layer outside the active region. The gate insulating film is provided in the gate trench and the outer trench. The gate electrode is provided in the gate trench with the gate insulating film being interposed. The gate connection layer is in contact with the gate electrode and includes a portion placed on the outer trench with the gate insulating film being interposed. The first main electrode includes a main contact that is electrically connected to the well region and the first impurity region within the active region, and an outer contact that is spaced away from the active region and is in contact with a bottom face of the outer trench. The second main electrode is electrically connected to the drift layer, is separated from the well region by at least the drift layer, and faces the first main electrode with the drift layer being interposed. The trench-bottom field relaxing region is provided in the drift layer, is separated from the second main electrode by the drift layer, and is of the second conductivity type. The trench-bottom high-concentration region is of the second conductivity type, has an impurity concentration higher than an impurity concentration of the trench-bottom field relaxing region, is provided on the trench-bottom field relaxing region, and extends from a position where the trench-bottom high-concentration region faces the gate connection layer with the gate insulating film being interposed, to a position where the trench-bottom high-concentration region is in contact with the outer contact of the first main electrode.

Effects of the Invention

According to the present invention, the trench-bottom high-concentration region on the trench-bottom field relaxing region extends from a position where the trench-bottom high-concentration region faces the gate connection layer with the gate insulating film being interposed, to a position where the trench-bottom high-concentration region is in contact with the outer contact of the first main electrode. As a result of this, during high-speed switching or a short-circuit of a load, voltage drop caused by a transient current which charges a pn junction formed by the field relaxing region and the drift layer is reduced. Therefore, breakdown of an insulating film, particularly a gate insulating film, below the gate connection layer, can be suppressed. The objects, features, aspects, and advantages the present invention shall be further clarified by the following detailed description and the accompanying drawings.

BRIEF DESCRIPTION OF DRAWINGS

FIG. 2 is a partial cross-sectional view taken along a line II-II in FIG. 1.
FIG. 13 is a partial plan view schematically showing a configuration of a semiconductor device according to a fourth modification of the first embodiment of the present invention.

FIG. 31 is a partial cross-sectional view taken along a line XXXI-XXXI in FIG. 30.

DESCRIPTION OF EMBODIMENTS

Figure 1:
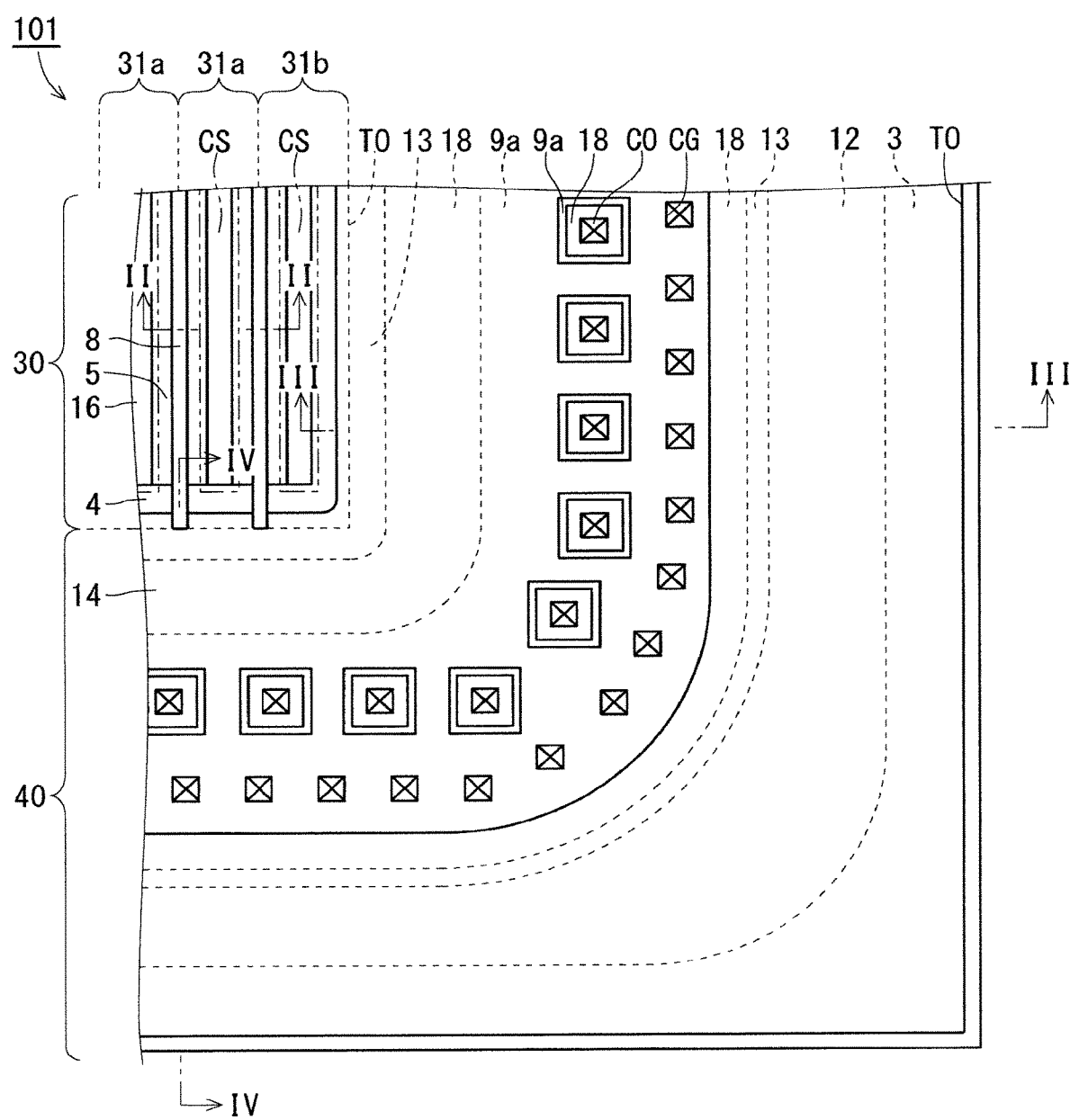
FIG. 1 is a partial plan view schematically showing a configuration of a semiconductor device according to a first embodiment of the present invention.

Hereinafter, embodiments will be described with reference to the accompanying drawings. It is noted that the drawings provide schematic representations, and respective sizes and positional interrelationships of figures in different drawings are not necessarily shown exactly and can be appropriately changed. Also, in the following description, the same components will be shown in the drawings while being denoted by the same reference symbols, and names and functions thereof shall be similar. Thus, detailed description for such components will be occasionally omitted.

Also, while the following description will use terms which mean specific positions and directions such as "upper", "lower", "side", "bottom", "front", and "back" in some portions, those terms are used for the sake of convenience in order to facilitate understanding of contents of the embodiments, and are not pertinent to directions for actual implementation.

First Embodiment (Configuration)

Figure 3:
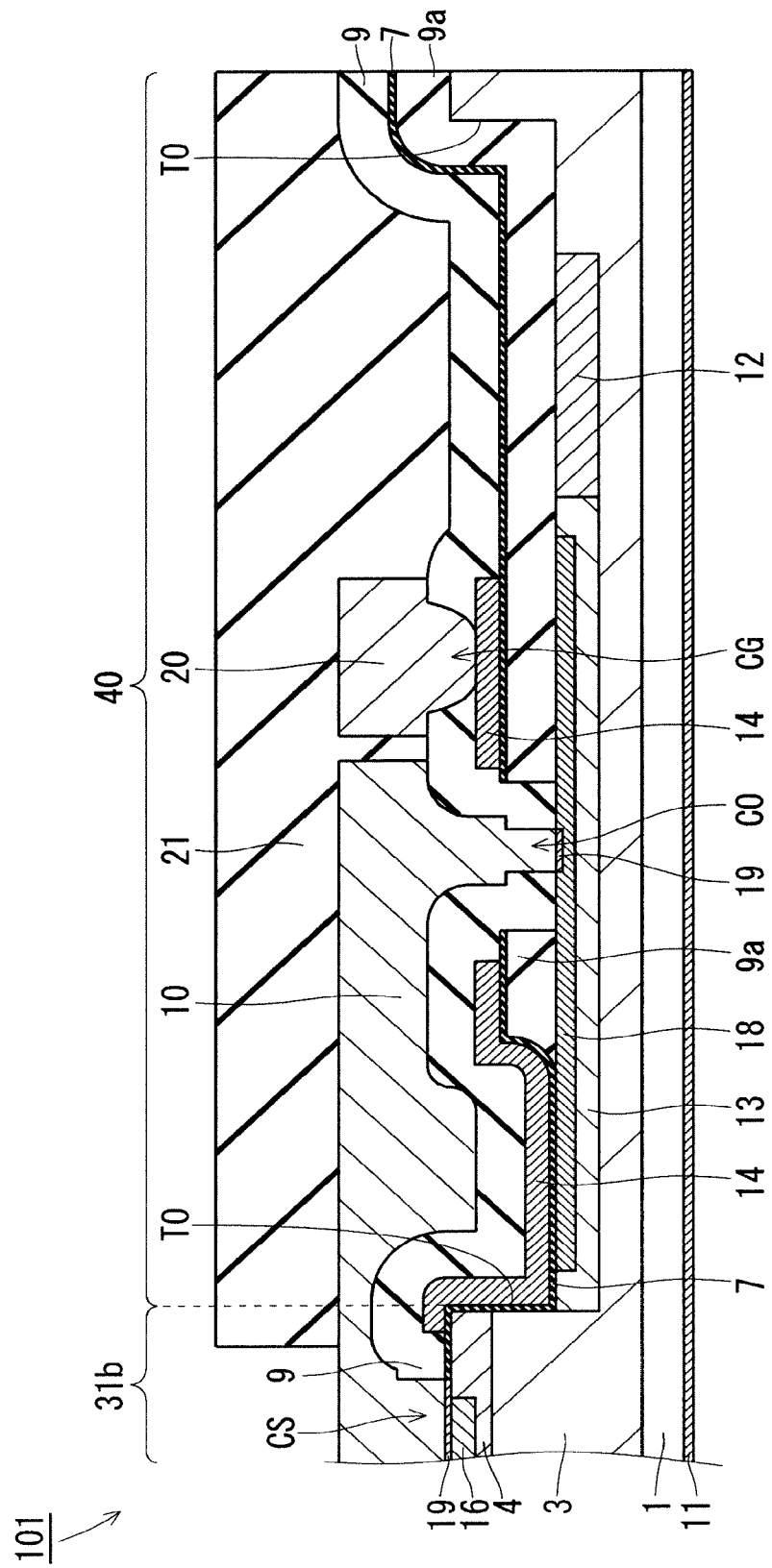
FIG. 3 is a partial cross-sectional view taken along a line in FIG. 1.
Figure 4:
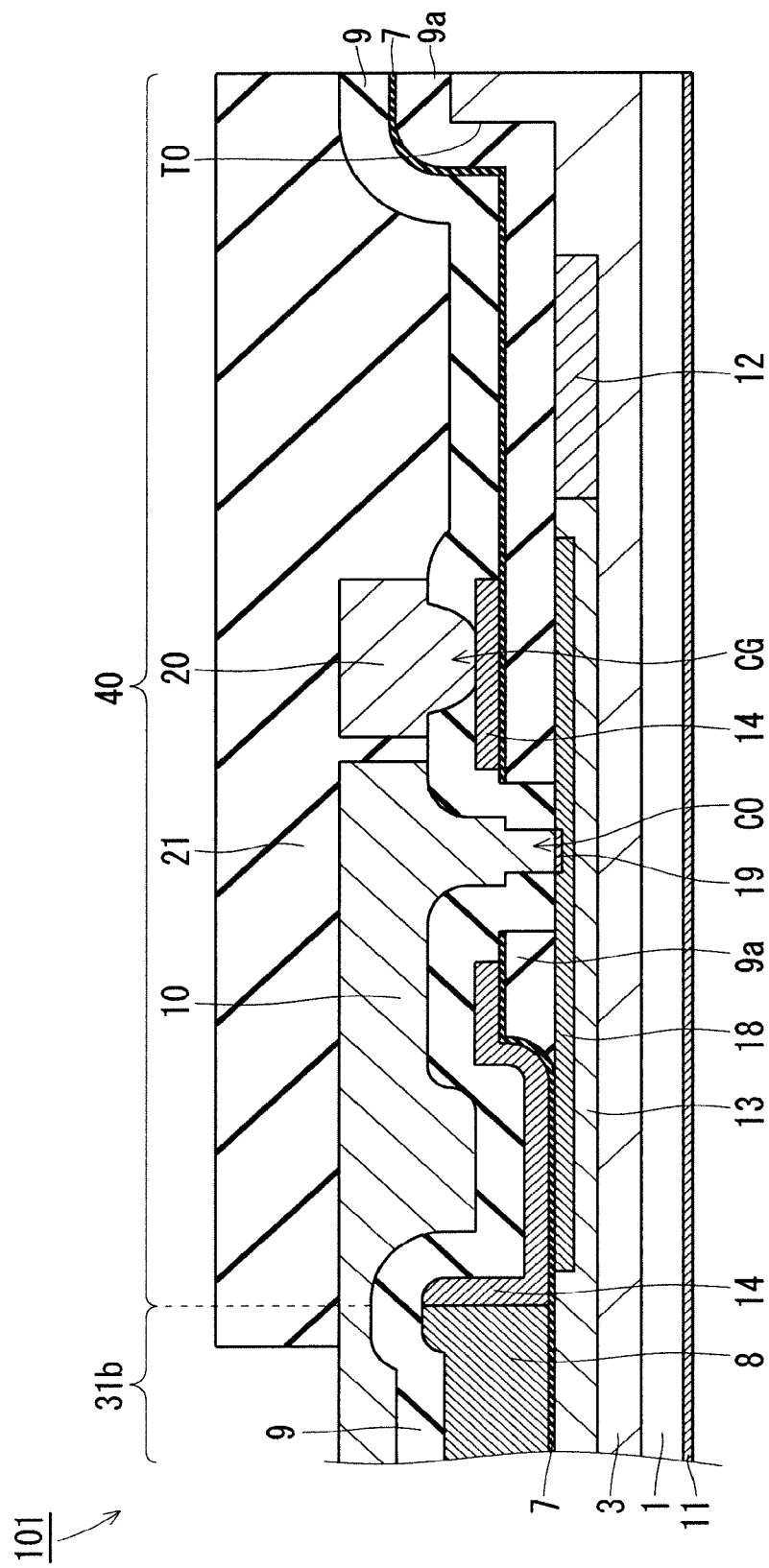
FIG. 4 is a partial cross-sectional view taken along a line IV-IV in FIG. 1.

FIG. 1 is a partial plan view schematically showing a configuration of a MOSFET 101 as a semiconductor device according to a first embodiment. FIG. 2 is a partial cross-sectional view taken along a line II-II in FIG. 1, and shows a periodic structure of a unit cell 31a in an active region 30. FIG. 3 is a partial cross-sectional view taken along a line III-III in FIG. 1. FIG. 4 is a partial cross-sectional view taken along a line IV-IV in FIG. 1. It is noted that a gate insulating film 7 and an interlayer insulating film 9 (FIGS. 2 to 4) are omitted in a plan view of FIG. 1. Also, regarding a source electrode 10 (FIGS. 2 to 4), only respective positions of a source contact CS and an outer contact CO which are included therein are shown. Also, regarding a gate wire portion 20 (FIGS. 3 and 4), only a position of a gate contact CG included therein is shown. The same omissions will be made in the other plan views which will be later described in detail.

The MOSFET 101 includes a current path between the source electrode 10 and a drain electrode 11, which runs along a vertical direction (thickness direction) in FIG. 2. That is, the MOSFET 101 is a vertical semiconductor device.

The MOSFET 101 includes the active region 30 (on the upper left in FIG. 1) and a terminating region 40 located outside the active region 30 (on the lower right in FIG. 1) in a plan layout (a layout seen from a point of view of a viewer of FIG. 1). The active region 30 is a region where a MOS structure of the MOSFET 101 is placed. The terminating region 40 is placed in a terminating end of the MOSFET 101, and has a structure which prevents withstand-voltage performance of the MOSFET 101 from being degraded in a terminating end. Accordingly, it is preferable that the terminating region 40 surrounds the active region 30.

The active region 30 includes the unit cell 31a and an active-region end 31b. The active-region end 31b is a cell placed in an end (outermost edge) of the active region 30. The unit cell 31a is a cell other than the active-region end 31b, and is periodically placed in a region inner than the active-region end 31b. Accordingly, the active-region end 31b is placed between the unit cell 31a and the terminating region 40. Though a width of the active-region end 31b (a lateral dimension in FIG. 1) is not limited to any specific value, the width may be either identical to a width of the unit cell 31a or larger than a width of the unit cell 31a. A channel controlled by a gate electrode 8 embedded in a gate trench TG is provided in each of the unit cells 31a. That is, the MOSFET 101 is a trench-gate semiconductor device. Further, a similar channel may be placed also in the active-region end 31b. The gate electrode 8 extending along a boundary between the above-described cells is embedded in the gate trench TG.

To put a configuration more specifically, the MOSFET 101 (semiconductor device) includes a semiconductor substrate 1, a semiconductor layer provided on the semiconductor substrate 1, the gate insulating film 7, the gate electrode 8, the interlayer insulating film 9, a field insulating film 9a, the source electrode 10 (first main electrode), the drain electrode 11 (second main electrode), a gate connection layer 14, the gate wire portion 20, and a protective insulating layer 21. The semiconductor layer includes a drift layer 3, a well region 4, a source region 5 (first impurity region), a terminating field relaxing region 12, a trench-bottom field relaxing region 13, a well contact region 16, and a trench-bottom high-concentration region 18. The gate trench TG and an outer trench TO are provided in the semiconductor layer.

The semiconductor substrate 1 (FIGS. 2 to 4) is of an n type (first conductivity type). The semiconductor substrate 1 lies over the active region 30 and the terminating region 40 (FIG. 1). The semiconductor substrate 1 is formed of SiC. As SiC, a substance having a hexagonal crystal system is preferably used, and more preferably, a substance of 4H polytype is used. As an impurity providing an n type to SiC, nitride (N) or phosphor (P) can be used, for example.

The drift layer 3 is provided on the semiconductor substrate 1, and lies over the active region 30 and the terminating region 40. The drift layer 3 is of an n type (first conductivity type). It is preferable that the drift layer 3 has an impurity concentration which is lower than an impurity concentration of the semiconductor substrate 1. In the present embodiment, the semiconductor layer including the drift layer 3 is a silicon carbide layer. The silicon carbide layer preferably has a hexagonal crystal structure, and more preferably, is of 4H polytype.

The well region 4 is provided on the drift layer 3 within the active region 30. In other words, the well region 4 is formed in a surface portion of the drift layer 3. The well region 4 extends to a sidewall of the outer trench TO. In a configuration shown in FIG. 3, the well region 4 extends to an open end of the outer trench TO (an upper-right corner of the active-region end 31b in FIG. 3). The well region 4 is of a p type (second conductivity type different from the first conductivity type). As an impurity providing a p type to SiC, aluminum (Al) or boron (B) can be used, for example.

The source region 5 is provided on a part of the well region 4 within the active region 30. The source region 5 is separated from the drift layer 3 by the well region 4. The source region 5 is of an n type.

The well contact region 16 is provided on a part of the well region 4 within the active region 30. The well contact region 16 is of a p type, and has an impurity concentration which is higher than an impurity concentration of the well region 4. The well contact region 16 is surrounded by the well region 4 and the source region 5 in plan view (seen from a point of view of a viewer of FIG. 1). It is noted that the well contact region 16 may be surrounded by only the source region 5 in plan view. In this case, the source region 5 is provided also in a portion where the well region 4 is shown in FIG. 1.

The gate trench TG (FIG. 2) is provided in the semiconductor layer within the active region 30. The gate trench TG includes a sidewall which faces the source region 5, the well region 4, and the drift layer 3. In other words, the gate trench TG extends from a surface (upper face in FIG. 2) of the source region 5, and reaches an inside of the drift layer 3 passing through the source region 5 and the well region 4. In the unit cell 31a, the source region 5 is placed in an open end of the gate trench TG (in other words, a corner of an end of a surface in a mesa structure of the semiconductor layer between the gate trenches TG).

The outer trench TO is provided in the semiconductor layer including the drift layer 3 within the terminating region 40 (in other words, outside the active region 30). The outer trench TO (FIG. 3) includes a sidewall adjacent to the well region 4 and the drift layer 3 within the active region 30. This sidewall may be further adjacent to the source region 5.

A depth of the outer trench TO may be nearly identical to that of the gate trench TG, and in this case, the outer trench TO and the gate trench TG can be formed by one etching operation.

The gate insulating film 7 includes a portion provided in the gate trench TG and a portion provided in the outer trench TO. Also, the gate insulating film 7 includes a portion with which an open end of the gate trench TG (FIG. 2) is covered and a portion with which an open end of the outer trench TO (FIG. 3) is covered. The gate insulating film 7 is a silicon oxide film, for example. This silicon oxide film is typically a thermally-oxidized film.

The gate electrode 8 is embedded in the gate trench TG with the gate insulating film 7 being interposed. In a position spaced away from the gate connection layer 14 (later described in detail) (in other words, a position spaced away from the terminating region 40), an upper face of the gate electrode 8 (refer to FIG. 2) is in a position deeper than a surface of the source region 5 (in other words, an open end of the gate trench TG). That is, an upper face of the gate electrode 8 is in a position deeper than an open end of the gate trench TG. In the foregoing position, an open end of the gate trench TG is covered with the interlayer insulating film 9 with the gate insulating film 7 being interposed. Accordingly, the gate electrode 8 in the foregoing position does not face an open end of the gate trench TG, while facing a sidewall of the gate trench TG with the gate insulating film 7 being interposed. Because of the above-described configuration, in the unit cell 31a, the source region 5 in an open end of the gate trench TG faces the interlayer insulating film 9 with the gate insulating film 7 being interposed, and does not face the gate electrode 8.

The gate connection layer 14 extends from an inside of the terminating region 40 to the active region 30, and is in contact with the gate electrode 8 within the active region 30. A portion where the gate connection layer 14 and the gate electrode 8 are in contact with each other may protrude over an open end of the gate trench TG (FIG. 2) (refer to FIG. 4). The gate connection layer 14 includes a portion placed on the outer trench TO with only the gate insulating film 7 being interposed. The gate connection layer 14 climbs onto an open end of the outer trench TO (an upper-right corner of the active-region end 31b in FIG. 3), from an inside of the terminating region 40. In an open end, the semiconductor layer and the gate connection layer 14 are insulated from each other by the gate insulating film 7. In other words, in an open end, the semiconductor layer and the gate connection layer 14 face each other with the gate insulating film 7 being interposed. It is noted that though the well region 4 is placed in an open end in FIG. 3, the source region 5 (FIG. 2) may be placed there. The gate connection layer 14 is formed of the same material as a material of the gate electrode 8, so that the gate connection layer 14 and the gate electrode 8 can be formed of one conductor layer (typically, a doped polysilicon layer) in a manufacturing process of the MOSFET 101. However, the gate connection layer 14 may be formed of a material different from that of the gate electrode 8. For example, in a case where the gate contact CG (later described in detail) which electrically connects the gate connection layer 14 and the gate wire portion 20 to each other is formed of a metal silicide (nickel silicide, for example), also a part or a whole of the gate connection layer 14 may be formed of metal silicide. For example, a portion of the gate connection layer 14, which is located closer to the gate contact CG, may be formed of metal oxide, and the other portion of the gate connection layer 14, which is located closer to the gate electrode 8, may be formed of the same material as a material of the gate electrode 8.

The gate wire portion 20 is placed in the outer trench TO while being insulated from the semiconductor layer. In other words, the gate wire portion 20 is placed on the semiconductor layer with the field insulating film 9a, the gate insulating film 7, and the interlayer insulating film 9 being interposed. The gate wire portion 20 includes the gate contact CG. The gate contact CG is electrically connected to the gate connection layer 14 via a contact hole provided in the interlayer insulating film 9. As a result of this, the gate wire portion 20 is electrically connected to the gate electrode 8 by the gate connection layer 14. The gate wire portion 20 is connected to a gate pad (not shown) within the terminating region 40. The gate pad is an external terminal for applying a gate potential to the MOSFET 101.

A part of the semiconductor layer is covered with the field insulating film 9a in order to protect a terminating end within terminating region 40. The field insulating film 9a includes a portion which is placed on the trench-bottom high-concentration region 18 (later described in detail) in the outer trench TO. The semiconductor layer provided with the field insulating film 9a, the gate insulating film 7, the gate electrode 8, and the gate connection layer 14 is covered with the interlayer insulating film 9. It is preferable that the field insulating film 9a is thicker than the gate insulating film 7. The field insulating film 9a is placed away from a boundary between the active region 30 and the terminating region 40 in the present embodiment. It is noted that the field insulating film 9a may be omitted in the present embodiment.

The source electrode 10 includes the source contact CS (main contact) and an outer contact CO. The source contact CS is electrically connected to the well region 4 and the source region 5 via a contact hole provided in the interlayer insulating film 9, within the active region 30. The outer contact CO is spaced away from the active region 30, and is in contact with a bottom face of the outer trench TO via a contact hole provided in the interlayer insulating film 9, within the terminating region 40. Each of the source contact CS and the outer contact CO includes a silicide region 19 in a portion thereof which is in contact with the semiconductor layer.

The drain electrode 11 is provided on a face of the semiconductor substrate 1, which is opposite to a face on which the drift layer 3 is provided (a lower face in FIG. 2). Accordingly, the drain electrode 11 is electrically connected to the drift layer 3 via the semiconductor substrate 1. Also, the drain electrode 11 is separated from the well region 4 by at least the drift layer 3, or by the drift layer 3 and the semiconductor substrate 1 in the present embodiment. Also, the drain electrode 11 faces the source electrode 10 with the drift layer 3 being interposed. Preferably, the drain electrode 11 includes a silicide region (not shown) as a portion which is in contact with the semiconductor substrate 1.

The trench-bottom field relaxing region 13 is of a p type. The trench-bottom field relaxing region 13 is provided in the drift layer 3. The trench-bottom field relaxing region 13 is separated from the drain electrode 11 by the drift layer 3. The trench-bottom field relaxing region 13 includes a portion placed within the active region 30 and a portion placed within the terminating region 40.

Within the active region 30 (FIG. 2), it is preferable that the trench-bottom field relaxing region 13 includes a portion which is placed in a position deeper than a bottom face of the gate trench TG, in order to effectively relax an electric field in a bottom face of the gate trench TG. Also, it is preferable that the trench-bottom field relaxing region 13 includes a portion which overlaps the gate trench TG in a plan layout. From the above-described points of view, it is preferable that the french-bottom field relaxing region 13 is placed on a bottom face of the gate trench TG as shown in FIG. 2. This placement is preferable also for easiness in a manufacturing process. However, this placement is a mere example, and the trench-bottom field relaxing region 13 may be placed away from a bottom face of the gate trench TG. Alternatively, the trench-bottom field relaxing region 13 may be placed between adjacent ones of the gate trenches TG in a plan layout. Further alternatively, the trench-bottom field relaxing region 13 may be either in contact with, or spaced away from, the well region 4.

Within the terminating region 40, the trench-bottom field relaxing region 13 is placed in a position deeper than a bottom face of the outer trench TO, and includes a portion which overlaps the outer trench TO in a plan layout. Preferably, as shown in FIGS. 3 and 4, the trench-bottom field relaxing region 13 is in contact with a bottom face of the outer trench TO, and more preferably, the trench-bottom field relaxing region 13 is in contact with a corner where a bottom face and a sidewall of the outer trench TO join each other.

The terminating field relaxing region 12 can be formed on a bottom face of the outer trench TO within the terminating region 40. The terminating field relaxing region 12 is of a p type. The terminating field relaxing region 12 may be continuous with an outer edge of the trench-bottom field relaxing region 13 as shown in FIGS. 3 and 4.

The trench-bottom high-concentration region 18 is provided on the trench-bottom field relaxing region 13 within the terminating region 40. In other words, the trench-bottom high-concentration region 18 is formed in a surface portion of the trench-bottom field relaxing region 13. At least a part of the trench-bottom high-concentration region 18 is placed on a bottom face of the outer trench TO. However, the trench-bottom high-concentration region 18 may include a portion which is placed inside the trench-bottom field relaxing region 13. The trench-bottom high-concentration region 18 extends outward (toward a right side in FIGS. 3 and 4) from a position where the trench-bottom high-concentration region 18 faces the gate connection layer 14 with only the gate insulating film 7 being interposed (from a left side in FIGS. 3 and 4), and continues to extend to a position where the trench-bottom high-concentration region 18 is contact with the outer contact CO of the source electrode 10. Accordingly, the outer contact CO is connected to the trench-bottom field relaxing region 13 via the trench-bottom high-concentration region 18. The trench-bottom high-concentration region 18 may extend further outward, in other words, toward the terminating field relaxing region 12, from a position where the trench-bottom high-concentration region 18 is in contact with the outer contact CO. The trench-bottom high-concentration region 18 is of a p type. The trench-bottom high-concentration region 18 has an impurity concentration which is higher than an impurity concentration of the trench-bottom field relaxing region 13.

It is noted that a region lying over the active region 30 and the terminating region 40 may include a portion having a different sectional structure, in addition to the sectional structure described above in detail (FIGS. 3 and 4).

(Manufacturing Method)

Next, an example of a manufacturing method for the MOSFET 101 will be described below.

First, an n-type SiC substrate of 4H polytype is prepared as the semiconductor substrate 1. By epitaxial growth of SiC on a surface of the semiconductor substrate 1, an n-type (n⁻-type) semiconductor layer with relatively high resistance is formed. A part of the semiconductor layer is used as the drift layer 3 without being further processed.

A recess serving as an alignment mark is formed on a surface of the semiconductor layer by a reactive ion etching (RIE) process. With the alignment mark being used as a reference, the p-type well region 4 and the n-type (n⁺-type) source region 5 with low resistance are formed in a surface portion of the drift layer 3 by ion implantation. As an implantation mask for the source region 5, a resist mask is used, for example. Preferably, the source region 5 is formed so as to have an n-type impurity concentration (donor concentration) which is equal to or higher than $5\times10^{18}$ [cm$^{-3}$] and is equal to or lower than $5\times10^{20}$ [cm$^{-3}$], and the well region 4 is formed so as to have a p-type impurity concentration (acceptor concentration) which is equal to or higher than $1\times10^{16}$ [cm$^{-3}$] and is equal to or lower than $3\times10^{19}$ [cm$^{-3}$]. It is noted that in a typical process, a region which is to serve as the source region 5 is subjected to not only n-type ion implantation for formation of the source region 5, but also p-type ion implantation for formation of the well region 4. In such a case, an n-type impurity concentration of the source region 5 is set to be higher than a p-type impurity concentration of the well region 4 so that the source region 5 can have an n-type conductivity type. An impurity concentration of the well region 4 may be either constant or non-constant along a depth thereof. For example, the well region 4 may have either impurity-concentration distribution in which a concentration becomes lower toward a surface thereof, or impurity-concentration distribution in which a concentration has a peak somewhere along a depth thereof. Subsequently, the p-type well contact region 16 is formed by ion implantation. Preferably, the well contact region 16 is formed so as to have a p-type impurity concentration which is equal to or higher than $1\times10^{19}$ [cm$^{-3}$] and is equal to or lower than $1\times10^{22}$ [cm$^{-3}$]. Incidentally, the sequence of the ion implantation processes can be appropriately altered.

Subsequently, an etching mask for forming the gate trench TG and the outer trench TO is formed on the foregoing semiconductor layer. The etching mask can be formed by patterning using a resist mask, for example. Thereafter, the gate trench TG and the outer trench TO which are deeper than the well region 4 and reach the drift layer 3 are formed by an RIE process.

Subsequently, the p-type trench-bottom field relaxing region 13 is formed on a bottom face of the gate trench TG with the etching mask being left as an implantation mask, and then, the p-type terminating field relaxing region 12 is formed on a bottom face of the outer trench TO. The trench-bottom field relaxing region 13 and the terminating field relaxing region 12 may be formed either simultaneously or at different times. Also, the terminating field relaxing region 12 may have lateral concentration distribution. That is, there may be provided concentration distribution in which a concentration becomes lower step by step toward an outside from an end of the terminating field relaxing region 12, which end is closer to the active region 30, for example.

Subsequently, the p-type trench-bottom high-concentration region 18 is formed by ion implantation. The trench-bottom high-concentration region 18 may be formed either simultaneously with, or at a time different from, at least one of the trench-bottom field relaxing region 13 and the terminating field relaxing region 12. It is noted that the above-described well contact region 16 may be formed simultaneously with the trench-bottom high-concentration region 18 after the gate trench TG is formed. In a case where the trench-bottom high-concentration region 18 and the terminating field relaxing region 12 are formed by different processes, a p-type impurity concentration of the trench-bottom high-concentration region 18 may have either concentration distribution in which a concentration is constant along a depth, or concentration distribution in which a concentration has a specific peak value. Preferably, the trench-bottom high-concentration region 18 is formed so as to have a p-type impurity concentration which is equal to or higher than $1\times10^{18}$ [cm$^{-3}$] and is equal to or lower than $1\times10^{22}$ [cm$^{-3}$]. Terms "p-type impurity concentration", referred to in this specification, of the trench-bottom high-concentration region 18 means a maximum value of a p-type impurity concentration of the trench-bottom high-concentration region 18.

Subsequently, annealing is performed in order to activate an implanted ion. For example, a heat treatment is performed in a temperature range from 1500° C. to 2200° C. inclusive for a time which is equal to or more than 0.5 minutes and is equal to or more than 60 minutes.

Subsequently, the field insulating film 9a is formed by formation of an insulating film and patterning of the formed insulating film. Formation of the insulating film can be achieved by a thermal oxidation process or a chemical vapor deposition (CVD) process. Patterning can be achieved by wet etching or dry etching. At that time, it is preferable that the field insulating film 9a is provided on a portion of a bottom face of the outer trench TO, which portion is located closer to a terminating end than the active-region end 31b, so that the active region 30 can be more effectively utilized. Before that time, the insulating film formed inside the gate trench TG within the active region 30 should be sufficiently removed by wet etching, dry etching, or the like. Further, the gate insulating film 7 is formed in and around the gate trench TG and the outer trench TO by a thermal oxidation process, a CVD process, or the like.

Subsequently, a conductor layer is formed on a whole of the semiconductor layer on which the gate insulating film 7, the field insulating film 9a, and the interlayer insulating film 9 are formed. In the present embodiment, a polysilicon film doped with an impurity is formed by a CVD process. At that time, a sufficient amount of polysilicon is embedded in the gate trench TG. In other words, polysilicon is deposited so as to have a thickness exceeding a depth of the gate trench TG in a position of the gate trench TG. Also, polysilicon is deposited in the outer trench TO.

In this regard, it is mentioned that CVD growth of polysilicon in the gate trench TG not only proceeds from a bottom face of the gate trench TG along a depth, but also proceeds laterally from a sidewall of the gate trench TG. Accordingly, polysilicon is relatively easily embedded in the gate trench TG which has a relatively small width. On the other hand, in the outer trench TO having a width which is larger than a width of the gate trench TG, growth from a sidewall of the outer trench TO hardly contributes except for a neighboring region of a sidewall. For example, in a position inside the outer trench TO, which position is laterally spaced away from a sidewall of the outer trench TO by a distance corresponding a depth of the outer trench TO or more, CVD growth of polysilicon from a sidewall hardly affects. Therefore, a thickness of polysilicon which grows on a position spaced away from a sidewall of the outer trench TO by a certain distance on a bottom face of the outer trench TO, is nearly identical to a thickness of polysilicon which grows on a surface of the semiconductor layer in the active region 30.

As described above, growth in the gate trench TG is further promoted by contribution of CVD growth from a sidewall of the gate trench TG, as compared to growth outside the gate trench TG. Accordingly, a thickness of a polysilicon film on a bottom face of the gate trench TG is larger than a thickness of a polysilicon film outside the gate trench TG. Therefore, a surface of a polysilicon film within the active region 30, which includes a somewhat recessed portion in a position of the gate trench TG, is flat to a certain extent. In other words, irregularities provided by the gate trench TG are made almost flat by a polysilicon film with which the irregularities are covered.

Subsequently, the gate electrode 8 and the gate connection layer 14 are formed from the above-described polysilicon film. More specifically, the polysilicon film is etched back in such a manner that those components can remain. As described above, since the polysilicon film has a large thickness on a bottom face of the gate trench TG, polysilicon can be left to serve as the gate electrode 8 in the gate trench TG without protecting the gate trench TG with a mask. On the other hand, in order to leave the polysilicon film for the gate connection layer 14, it is necessary to previously form a mask corresponding to a pattern of the gate connection layer 14 at a time of etching-back. In this regard, it is mentioned that the gate connection layer 14 should be connected with the gate electrode 8 located outside the outer trench TO for the sake of a function thereof as wiring. For this reason, a mask having a pattern corresponding to the gate connection layer 14 should reach a sidewall of the outer trench TO, which is located closer to the active region 30 in a plan layout. In this regard, it is difficult in an actual process to form a mask so that a position of an end of the mask is completely aligned with a position of a sidewall of the outer trench TO because of an error in overlapping patterns. Thus, a certain amount of process margin should be provided. Specifically, a mask for etching-back is formed so as to invade the active region 30 from a sidewall of the outer trench TO, which is located closer to the active region 30. That is, in order to surely prevent disconnection between the gate electrode 8 and the gate connection layer 14, a mask for etching-back is formed so that a bottom face of the outer trench TO and a corner of an open end of the outer trench TO, which end is located closer to the active region 30, are covered therewith.

A length of a portion of a mask for etching-back, which portion invades the active region 30 from a position of a sidewall of the outer trench TO, is preferably equal to or larger than 0.1 μm and is equal to or smaller than 3 μm. If the length is too small, disconnection between the gate electrode 8 and the gate connection layer 14 is more likely to occur for the above-described reasons. To provide a margin of approximately 3 μm could almost certainly avoid such a problem as described above. Additionally, if the foregoing length is unnecessarily large, an area which can be effectively used in the active region 30 is decreased. Thus, in order to ensure predetermined performance such as on-resistance, a size of the MOSFET 101 shall be increased. Also, a width of the active-region end 31b should be increased, and to this end, an interval between portions of the trench-bottom field relaxing regions 13 which are adjacent to each other with the active-region end 31b being interposed may become larger than an interval between portions of the trench-bottom field relaxing regions 13 which are adjacent to each other with the unit cell 31a being interposed. As a result of this, a field relaxing effect produced by the trench-bottom field relaxing region 13 may be unsatisfactorily exerted near the active-region end 31b.

For the above-described reasons, a mask for etching-back which includes a portion lying over the terminating region 40 and the active region 30 is formed by patterning. A resist mask may be used as the foregoing mask for etching-back, and to use a resist mask makes patterning easy. With the use of the thus formed mask for etching-back, etching-back is performed on a polysilicon film until the gate insulating film 7 on the semiconductor layer is exposed outside the gate trench TG. In order to surely remove an unnecessary portion of polysilicon, over-etching should be performed. By selecting an etching condition which allows a ratio of an etching rate of polysilicon to a material of the gate insulating film 7 to be sufficiently large, it is possible to achieve satisfactory over-etching.

In etching-back, polysilicon embedded in the gate trench TG can remain as the gate electrode 8 because a thickness thereof is large as described above. At that time, under the influence of etching-back, a surface of a polysilicon film remaining as the gate electrode 8 in the gate trench TG is located deeper than an open end of the gate trench TG (FIG. 2).

Subsequently, the mask for etching-back is removed. Then, the interlayer insulating film 9 is formed so that the terminating region 40 and the active region 30 are covered therewith. Thereafter, contact holes for the source contact CS and the outer contact CO are formed by dry etching, for example. Also, a contact hole for the gate contact CG is formed by dry etching, for example. After that, the source electrode 10 including the source contact CS and the outer contact CO is formed. Also, the gate wire portion 20 including the gate contact CG is formed. Then, the protective insulating layer 21 is formed.

Subsequently, the drain electrode 11 is formed on a back face of the semiconductor substrate 1. As a result of this, the MOSFET 101 is obtained.

(Comparative Example)

It is assumed that a MOSFET of a comparative example is a MOSFET in which the trench-bottom field relaxing region 13 is provided over a portion where the trench-bottom high-concentration region 18 (FIGS. 3 and 4) is provided and the trench-bottom high-concentration region 18 is omitted.

During high-speed switching of the MOSFET, a transient current for charging a pn junction capacitance of the trench-bottom field relaxing region 13 flows into the outer contact CO of the source electrode 10 through the trench-bottom field relaxing region 13. At that time, voltage drop corresponding to a product of the foregoing transient current and parasitic resistance of the trench-bottom field relaxing region 13 occurs in the trench-bottom field relaxing region 13. As electric resistance of the trench-bottom field relaxing region 13 becomes higher, the voltage drop is increased. While an increase of an impurity concentration of the trench-bottom field relaxing region 13 can reduce electric resistance, such increase of an impurity concentration may possibly degrade an intrinsic function of the trench-bottom field relaxing region 13. Especially, at a time of a drive at high dV/dt (for example, a high-speed switching drive at 10 V/ns or higher), voltage drop caused by a transient current is increased, so that dielectric breakdown of the gate insulating film 7 directly above a path of the transient current may possibly occur. Also, even though such breakdown as described above may not occur, switching loss of the MOSFET is increased.

Also, during a short circuit of a load of the MOSFET, a high voltage is instantaneously applied to the drain electrode 11. Accordingly, from the trench-bottom field relaxing region 13 to the drift layer 3, a reverse voltage is applied and a depletion layer extends. Also at that time, in the same manner as described above, a charging current for the depletion layer which is caused by application of a high dV/dt flows through the trench-bottom field relaxing region 13. Because of resultant voltage drop, a concern about reliability of the gate insulating film 7 is raised for the same reasons as described above.

Further, during a short circuit of a load of the MOSFET, a short-circuit current flowing from the drain electrode 11 concentrates on a region where the depletion layer does not greatly extends. A response speed in extension of the depletion layer at that time is rate-determined by a time constant which depends on a product C×R of a depletion-layer capacitance C and resistance R of a path of a charging current. Accordingly, a depletion layer cannot extend at a high speed from a portion of the trench-bottom field relaxing region 13, which portion has high resistance R. As a result of this, before the depletion layer fully extends, a short-circuit current concentrates locally on a neighborhood of the foregoing portion of the trench-bottom field relaxing region 13. Therefore, the foregoing portion is more susceptible to short-circuit breakdown than the other portions. Presence of such the more susceptible portion could reduce a short-circuit tolerance of the MOSFET.

(Effects)

Unlike the above-described comparative example, according to the present embodiment, the trench-bottom high-concentration region 18 on the trench-bottom field relaxing region 13 extends from a position where it faces the gate connection layer 14 with only the gate insulating film 7 being interposed, to a position where it is in contact with the outer contact CO of the source electrode 10. As a result of this, during high-speed switching or a short circuit of a load, voltage drop caused by a transient current for charging a pn junction formed by the field relaxing region and the drift layer 3 is reduced. Therefore, breakdown of the gate insulating film 7 below the gate connection layer 14 can be suppressed.

Also, the foregoing charging/discharging current flows through the trench-bottom high-concentration region 18, which has low resistance because of a high impurity concentration thereof. As a result of this, switching loss caused by a charging/discharging current can be reduced. Also, a response speed in extension of a depletion layer during a short circuit of a load is increased, so that a short-circuit tolerance of the MOSFET 101 can be improved.

The field insulating film 9a on the trench-bottom high-concentration region 18 allows insulation between the trench-bottom high-concentration region 18 and the gate connection layer 14 to be more certainly ensured.

In the present embodiment, the field insulating film 9a is placed away from a boundary between the active region 30 and the terminating region 40. If the field insulating film 9a invades the active region 30 beyond the foregoing boundary, an area of a portion which can be effectively used by providing a transistor element (effective area) in the active region 30 is reduced. According to the present embodiment, reduction in an effective area can be avoided.

An avalanche field intensity of the drift layer 3 is enhanced because the drift layer 3 is a silicon carbide layer. In this case, dielectric breakdown of a switching element is likely to occur particularly in the gate insulating film 7, not in a semiconductor region. According to the present embodiment, such breakdown can be effectively suppressed. Also, it is known that electron trap is more likely to be formed between a semiconductor layer and a gate insulating film in a case where the semiconductor layer is formed of SiC, as compared to a case where Si, a semiconductor which is more generally used, is used. For this reason, in a silicon-carbide semiconductor device, a concern about reliability of a gate insulating film is intensified. Therefore, an effect produced by the present embodiment which allows reduction of an electric field applied to a gate insulating film, is more significant.

It is noted that a surface of a silicon carbide layer (upper face in FIG. 2) is preferably a face (0001) in a hexagonal crystal system. It is preferable that the face (0001) has an off angle of approximately 10° or smaller, being not a face (0001) in a strict sense. An orientation of an off angle (off orientation) is in a [11-20]-axis direction, for example. It is noted that a face (000-1) may be used, and the same off angle as described above may be provided in a case where a face (000-1) is used. Also, as an alternative to the above-described faces, a face (1-100) or a face (03-38) may be used.

The drift layer 3 may be made of a wide-bandgap semiconductor other than SiC. A wide-bandgap semiconductor other than SiC includes $Ga_2O_3$, GaN (gallium nitride), or diamond, for example. Generally, a semiconductor device using a wide-bandgap semiconductor is expected to be put to a use at a high temperature and at a high voltage, in particular. At a high temperature, reliability of an insulating film tends to be degraded, and so the effects produced by applying the present embodiment are significant. Also, along with an increase of a withstand voltage, a voltage which is to be applied to an insulating film is increased, and so, the effects produced by applying the present embodiment are significant.

Also, the drift layer 3 may be made of a non-wide-bandgap semiconductor such as silicon, in place of a wide-bandgap semiconductor. Also in this case, the above-described basic effects of the present embodiment can be attained.

Next, effects produced by the terminating field relaxing region 12 will be described. Generally, a terminating field relaxing region is a region including a p-type impurity which has a field relaxing effect, such as a junction termination extension (JTE) region or a field limiting ring (FLR) region. Those regions are formed in an outer edge of an active region where a MOSFET cell is placed, and suppress breakdown of a semiconductor device due to concentration of an electric field on an outermost edge of the active region. In a case of a planar semiconductor device, a terminating field relaxing region such as a JTE region or an FLR region is formed on a surface of a drift layer in which an outer trench is not formed. On the other hand, in a case of a trench-gate semiconductor device, to form a terminating field relaxing region on a surface of a drift layer outside a trench would not allow satisfactory relaxing of field concentration in a bottom portion of a gate trench in an end of an active region, in an off state. In other words, an electric field concentrates on a pn junction formed by a trench-bottom field relaxing region formed on a bottom face of a gate trench in an end of an active region, and a drift layer. As a result of this, avalanche breakdown may possibly occur at a drain voltage which is lower than a withstand voltage estimated from a impurity concentration and a thickness of a drift layer. In contrast thereto, in a case where the terminating field relaxing region 12 is formed on a bottom face of the outer trench TO according to the present embodiment, local electric-field concentration on the trench-bottom field relaxing region 13 located in an outermost edge of the active region 30 is relaxed, so that adequate withstandability to avalanche can be ensured. It is noted that respective depths of the gate trench TG and the outer trench TO are not necessarily nearly identical to each other in order to attain the above-described effects, and it is sufficient if the terminating field relaxing region 12 is formed at about the same depth as the trench-bottom field relaxing region 13.

(Modifications)

Figure 5:
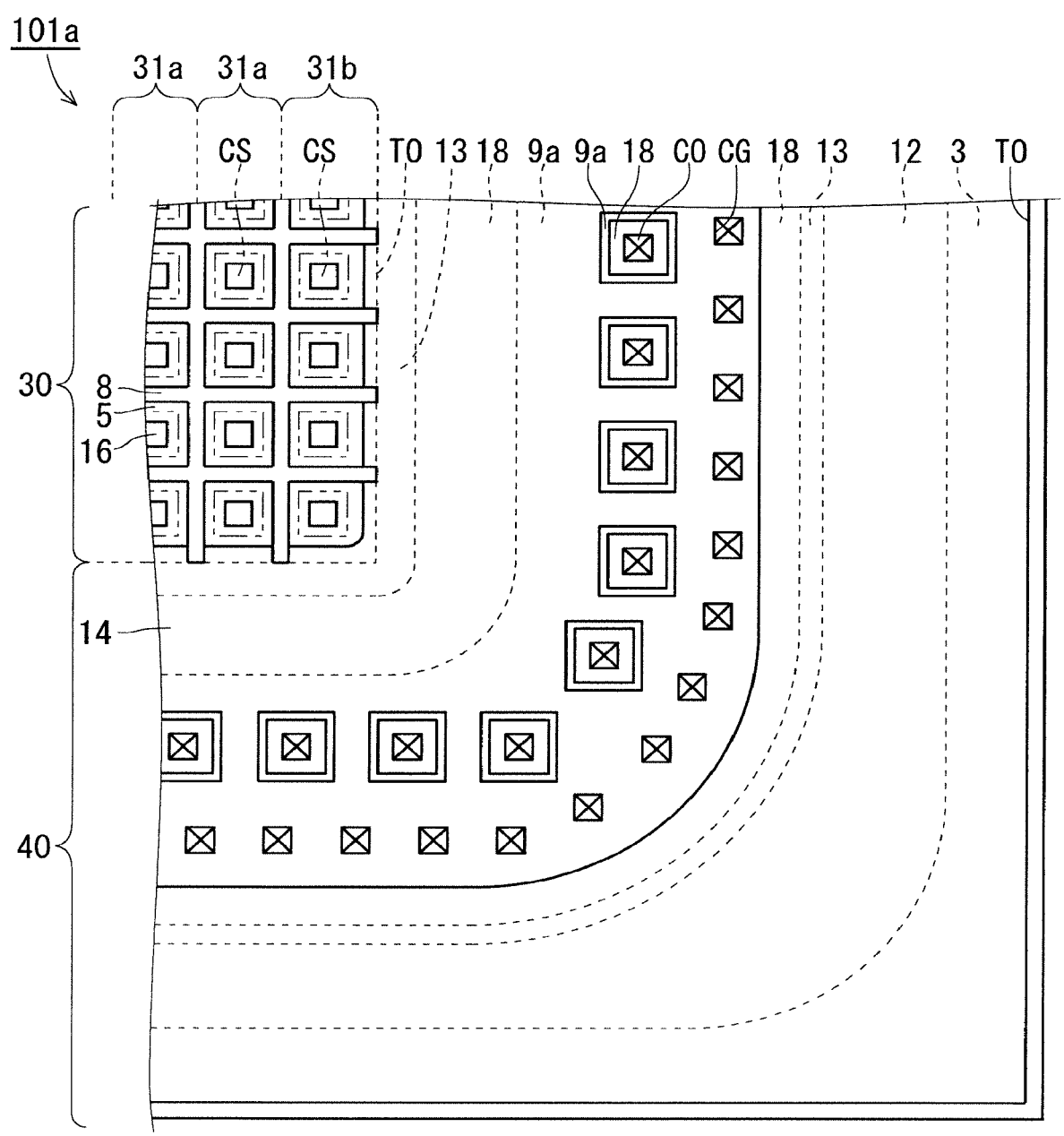
FIG. 5 is a partial plan view schematically showing a configuration of a semiconductor device according to a first modification of the first embodiment of the present invention.

FIG. 5 is a partial plan view schematically showing a configuration of a MOSFET 101a (semiconductor device) according to a first modification of the present embodiment. Whereas a cell structure in the active region 30 is in a shape of a stripe in plan view in the MOSFET 101 (FIG. 1), a cell structure is in a shape which forms a grid pattern in the present modification. It is noted that a shape of a cell structure is not limited to a shape of a stripe or a shape which forms a grid pattern. For example, a cell structure may have a shape of a polygon or waves.

Figure 6:
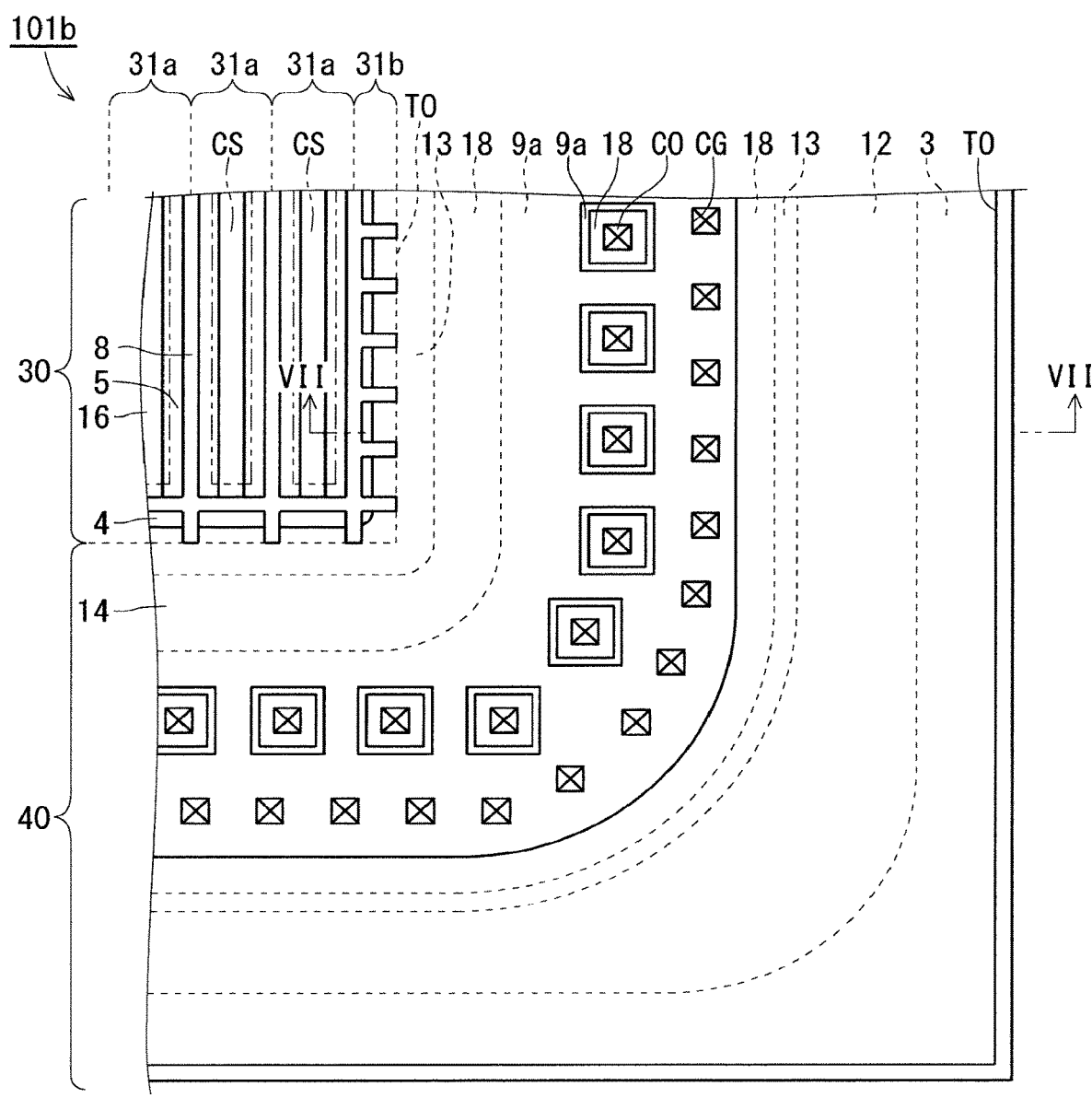
FIG. 6 is a partial plan view schematically showing a configuration of a semiconductor device according to a second modification of the first embodiment of the present invention.
Figure 7:
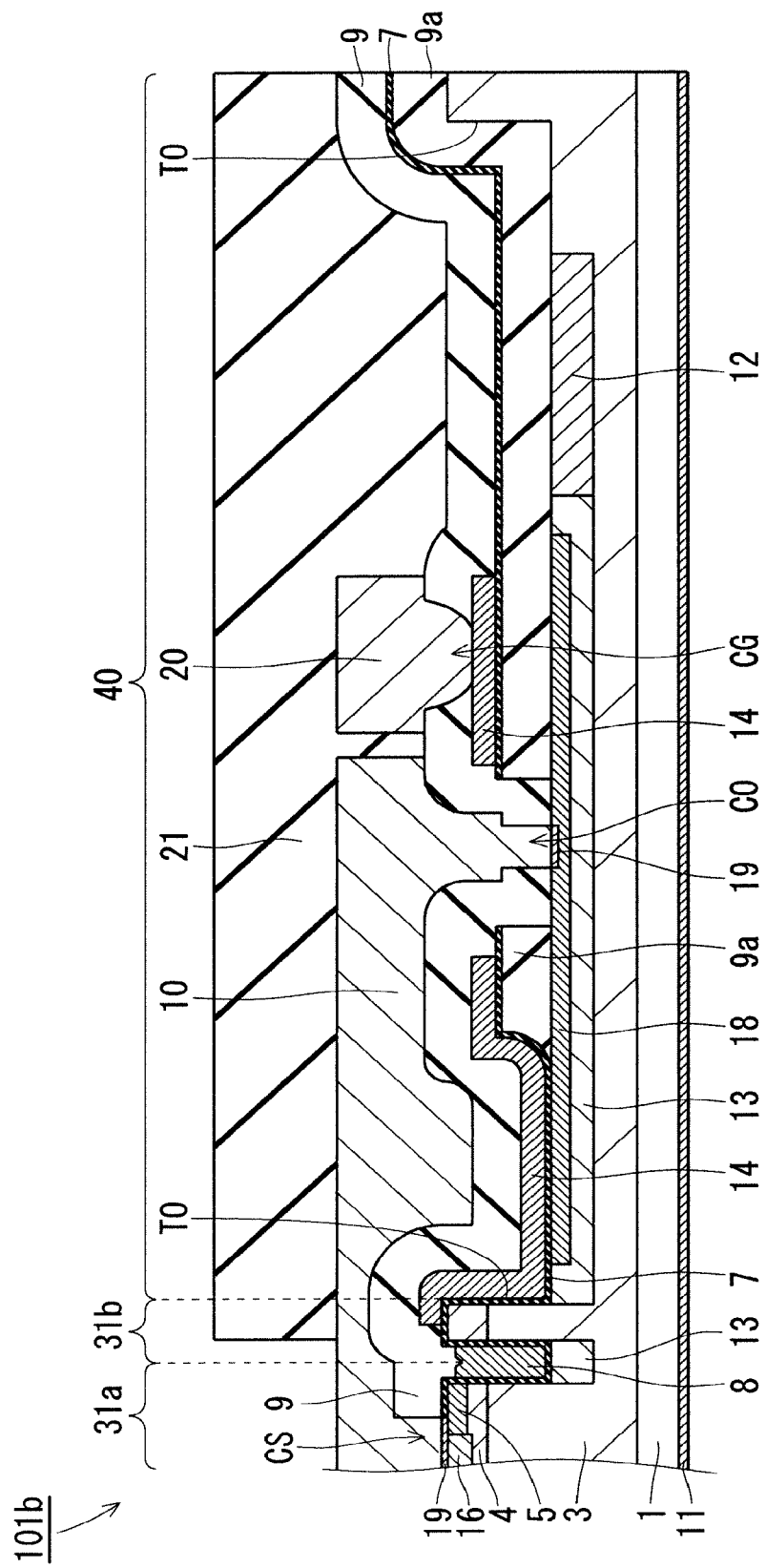
FIG. 7 is a partial cross-sectional view taken along a line VII-VII in FIG. 6.

FIG. 6 is a partial plan view schematically showing a configuration of a MOSFET 101b (semiconductor device) according to a second modification of the present embodiment. FIG. 7 is a partial cross-sectional view taken along a line VII-VII in FIG. 6. Whereas the active-region end 31b has a configuration analogous to that of the unit cell 31a in the MOSFET 101 (FIG. 1), the above-described two components considerably differ from each other in the present modification. More specifically, in the present modification, the active-region end 31b does not include the source contact CS. For this reason, the active-region end 31b does not function as a MOSFET element, and mainly functions to be connected to the gate connection layer 14. Thus, in the present modification, the active-region end 31b can be regarded as a dummy cell. Omission of the source contact CS can make a width of the active-region end 31b smaller than a width of the unit cell 31a. According to the present modification, a distance between adjacent portions of the trench-bottom field relaxing region 13 near the active-region end 31b being a dummy cell is reduced. As a result of this, reliability of the gate insulating film 7 in the active-region end 31b in an off state can be further improved. Also, a corner of an open end of the outer trench TO, which corner is located closer to the active region 30, is formed by the well region 4. The foregoing corner is not necessarily required to be formed by the source region 5 because the active-region end 31b is a dummy cell in the present modification. The foregoing corner is formed by the well region 4 having resistance which is higher than resistance of the source region 5, so that reliability of the gate insulating film 7 in the corner is improved.

Figure 8:
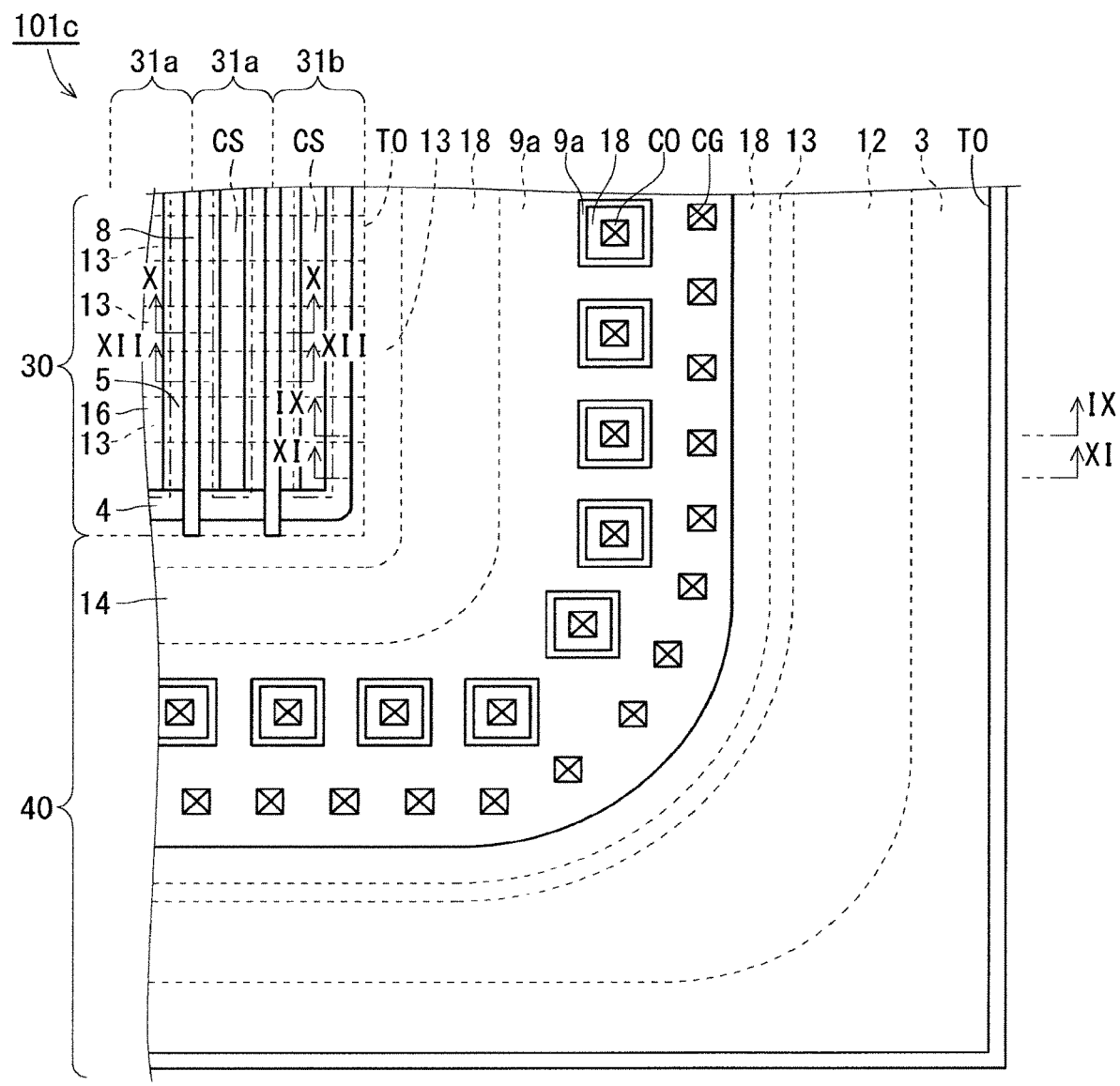
FIG. 8 is a partial plan view schematically showing a configuration of a semiconductor device according to a third modification of the first embodiment of the present invention.
Figure 9:
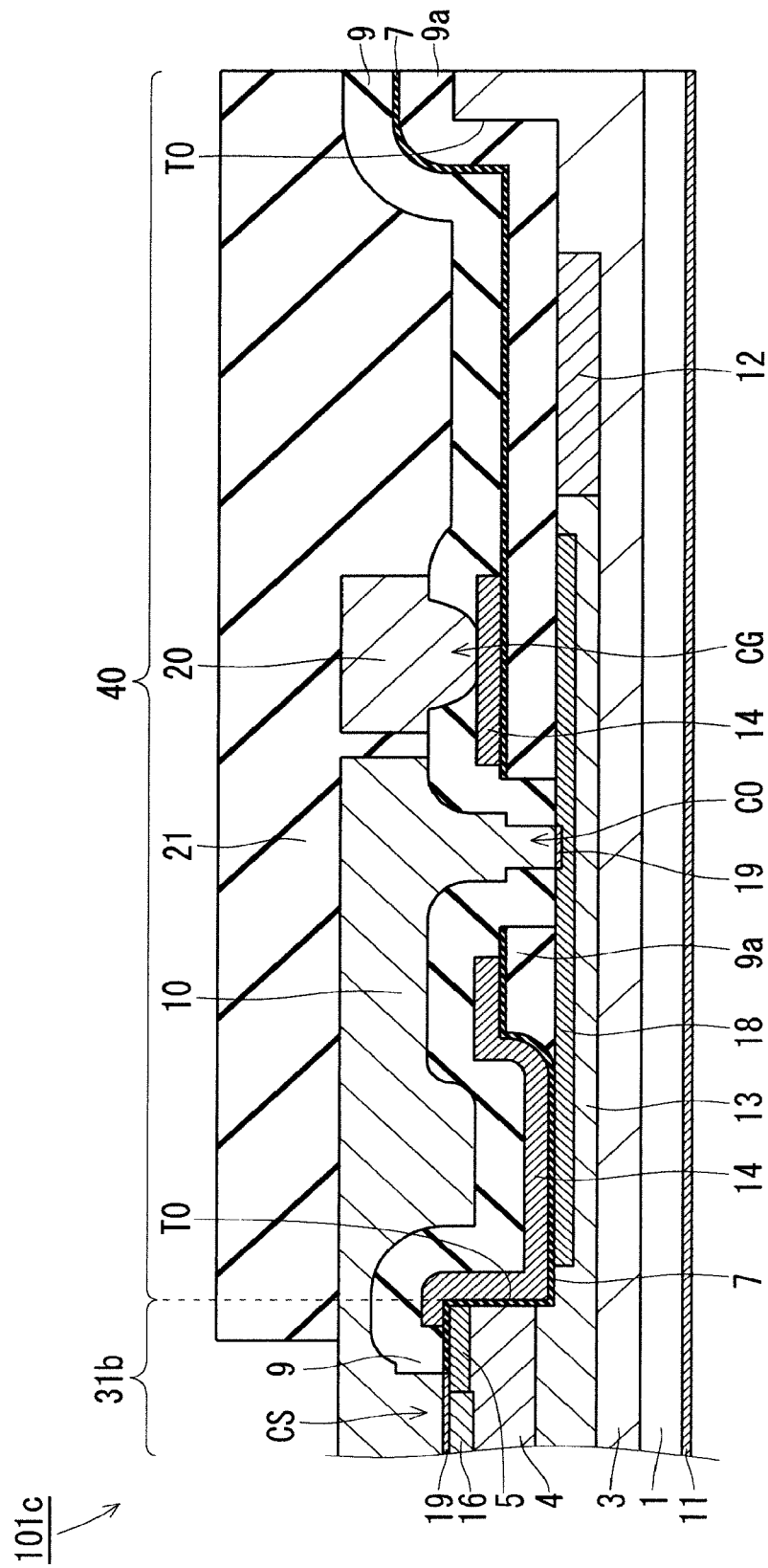
FIG. 9 is a partial cross-sectional view taken along a line IX-IX in FIG. 8.
Figure 10:
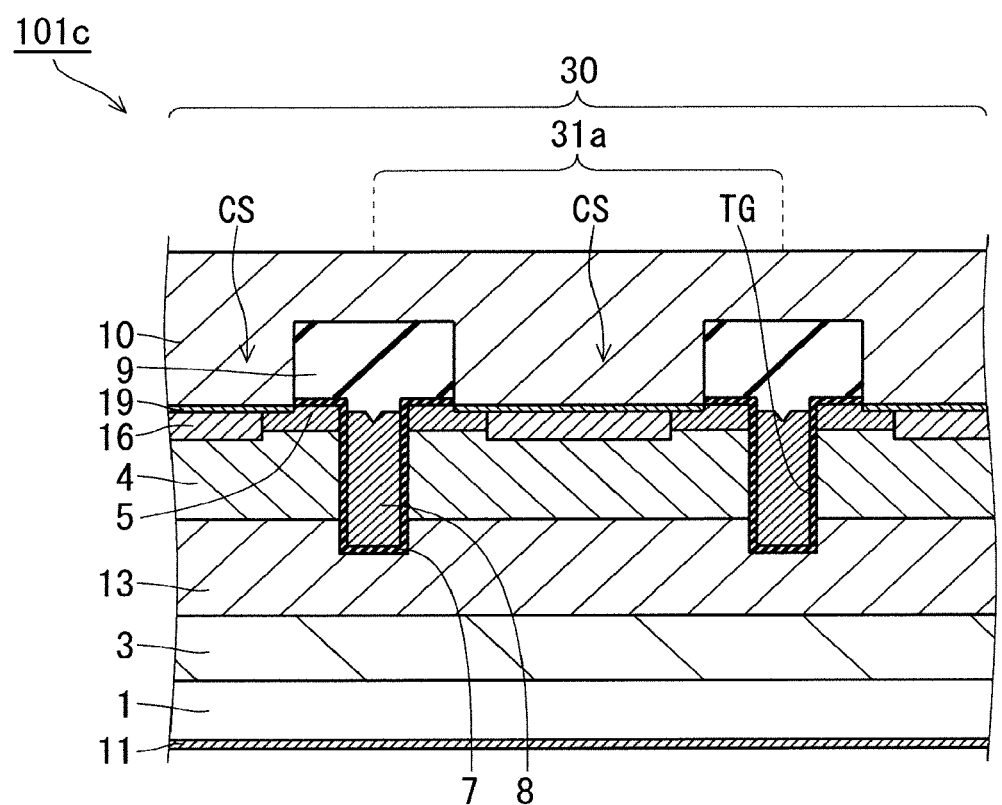
FIG. 10 is a partial cross-sectional view taken along a line X-X in FIG. 8.
Figure 11:
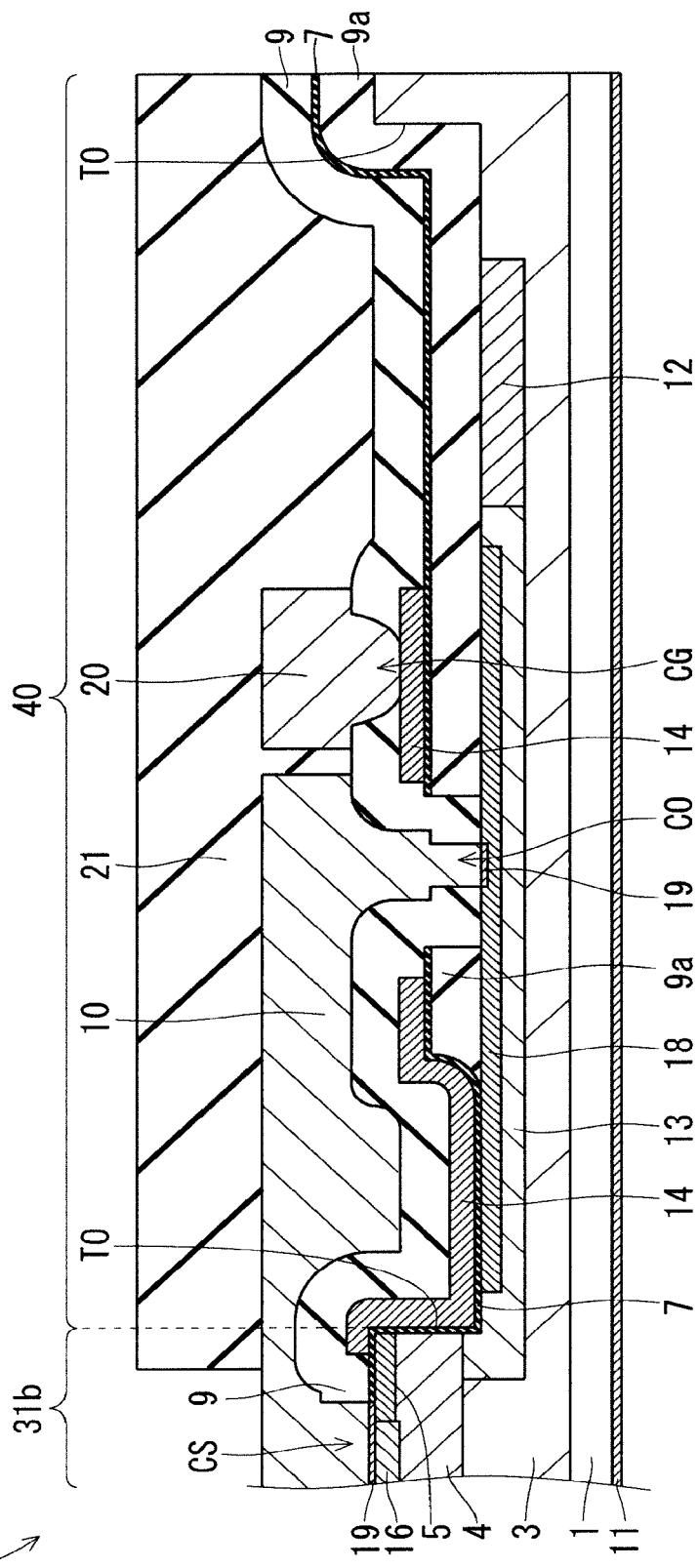
FIG. 11 is a partial cross-sectional view taken along a line XI-XI in FIG. 8.
Figure 12:
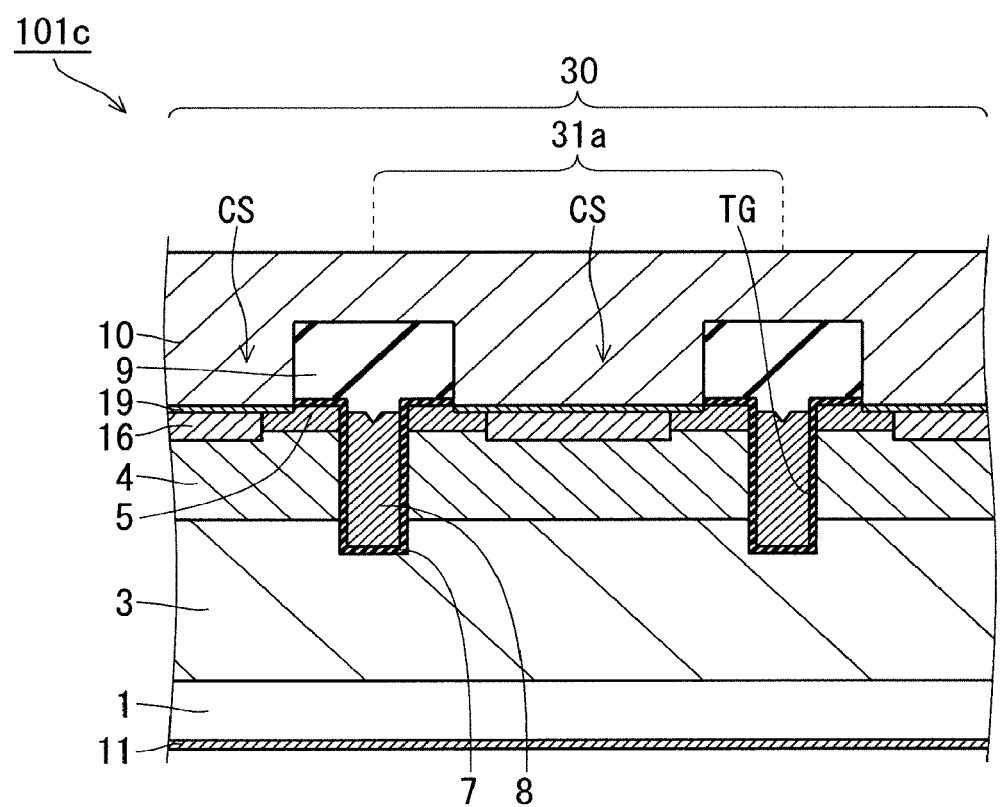
FIG. 12 is a partial cross-sectional view taken along a line XII-XII in FIG. 8.

FIG. 8 is a partial plan view schematically showing a configuration of a MOSFET 101c (semiconductor device) according to a third modification of the present embodiment. FIG. 9 is a partial cross-sectional view taken along a line IX-IX in FIG. 8. FIG. 10 is a partial cross-sectional view taken along a line X-X in FIG. 8. FIG. 11 is a partial cross-sectional view taken along a line XI-XI in FIG. 8. FIG. 12 is a partial cross-sectional view taken along a line XII-XII in FIG. 8. Whereas the trench-bottom field relaxing region 13 is provided over a bottom face of the gate trench TG within the active region 30 in the MOSFET 101 (FIG. 1), the trench-bottom field relaxing region 13 is provided in a form of stripes within the active region 30 in the present modification. A periodic direction in which presence and absence of the trench-bottom field relaxing region 13 repeatedly alternate in a form of strips is along a direction in which the gate trench TG extends (a vertical direction in FIG. 8). Accordingly, as shown in FIGS. 10 and 11, a bottom face of the gate trench TG includes a portion covered with the trench-bottom field relaxing region 13 and a portion not covered with the trench-bottom field relaxing region 13. Even though a bottom face of the gate trench TG includes a portion not covered with the trench-bottom field relaxing region 13, serious inconvenience is not caused as long as a field relaxing effect can be satisfactorily produced by the trench-bottom field relaxing region 13 located near the portion. According to the present modification, the trench-bottom field relaxing region 13 is not formed on all portions of a bottom face of the gate trench TG in plan view. Thus, an on current which flows through an inverted channel in an on state hardly suffers from current constriction under the influence of a pseudo junction-field effect transistor (J-FET) between the trench-bottom field relaxing region 13 and the well region 4. Therefore, not only switching loss, but also conduction loss, can be reduced. Additionally, it is preferable that the trench-bottom field relaxing region 13 includes a portion placed on a bottom face of the gate trench TG and a portion placed on a bottom face of the outer trench TO and the two portions are continuous with each other, as shown in FIG. 8. As a result of this, the trench-bottom field relaxing region 13 within the active region 30 and the trench-bottom field relaxing region 13 within the terminating region 40 are electrically connected to each other.

Figure 14:
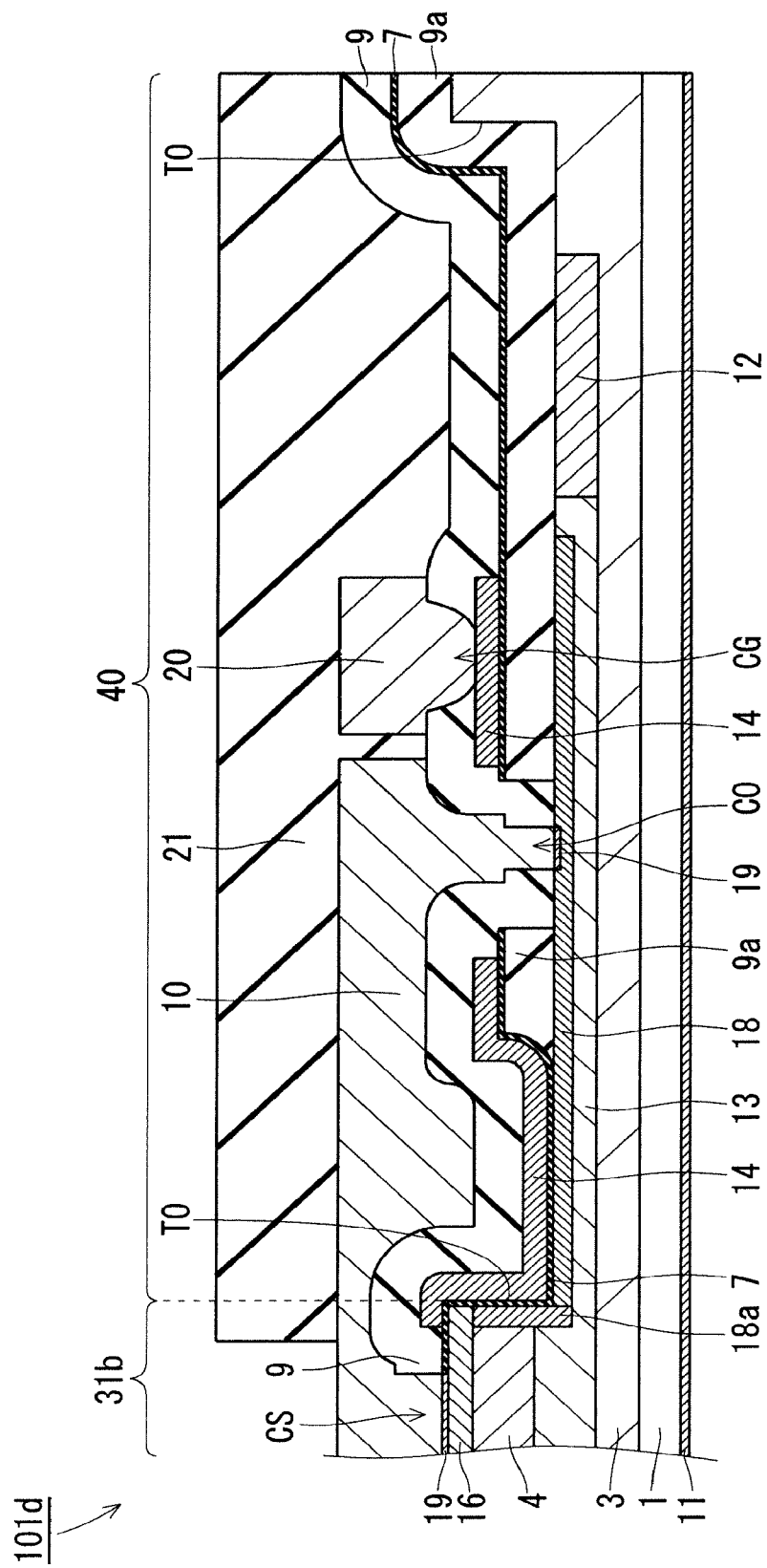
FIG. 14 is a partial cross-sectional view taken along a line XIV-XIV in FIG. 13.
Figure 15:
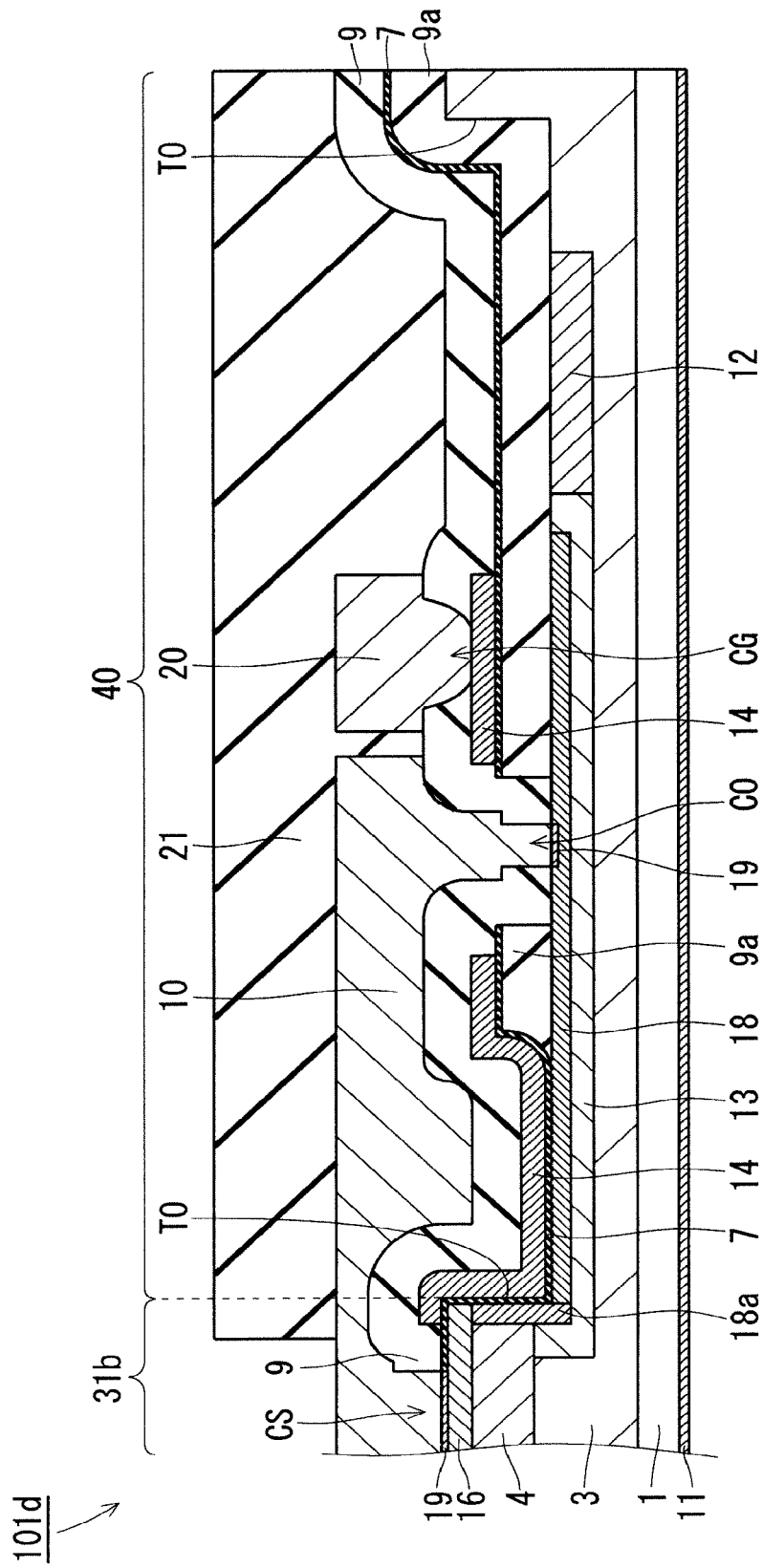
FIG. 15 is a partial cross-sectional view taken along a line XV-XV in FIG. 13.

FIG. 13 is a partial plan view schematically showing a configuration of a MOSFET 101d (semiconductor device) according to a fourth modification of the present embodiment. FIG. 14 is a partial cross-sectional view taken along a line XIV-XIV in FIG. 13. FIG. 15 is a partial cross-sectional view taken along a line XV-XV in FIG. 13. According to the present modification, the trench-bottom high-concentration region 18 is connected to the well contact region 16 via a trench-sidewall high-concentration well 18a provided on a sidewall of the outer trench TO. This configuration can be easily obtained by using an ion beam travelling along a direction inclined with respect to the semiconductor substrate 1 (an ion beam travelling from the upper right to the lower left in FIGS. 14 and 15) at a time of ion implantation for forming the trench-bottom high-concentration region 18, for example. According to the present modification, resistance of a current path of a charging/discharging current for a pn junction of the trench-bottom field relaxing region 13 during switching is further reduced. Accordingly, the above-described effects produced by the present embodiment can be further enhanced.

In each of the above-described modifications, the other components than specifically described can be omitted as appropriate. Conversely, also in a case where the above-described arbitrary component is appropriately added, the above-described effects can be produced.

Second Embodiment (Configuration)

Figure 16:
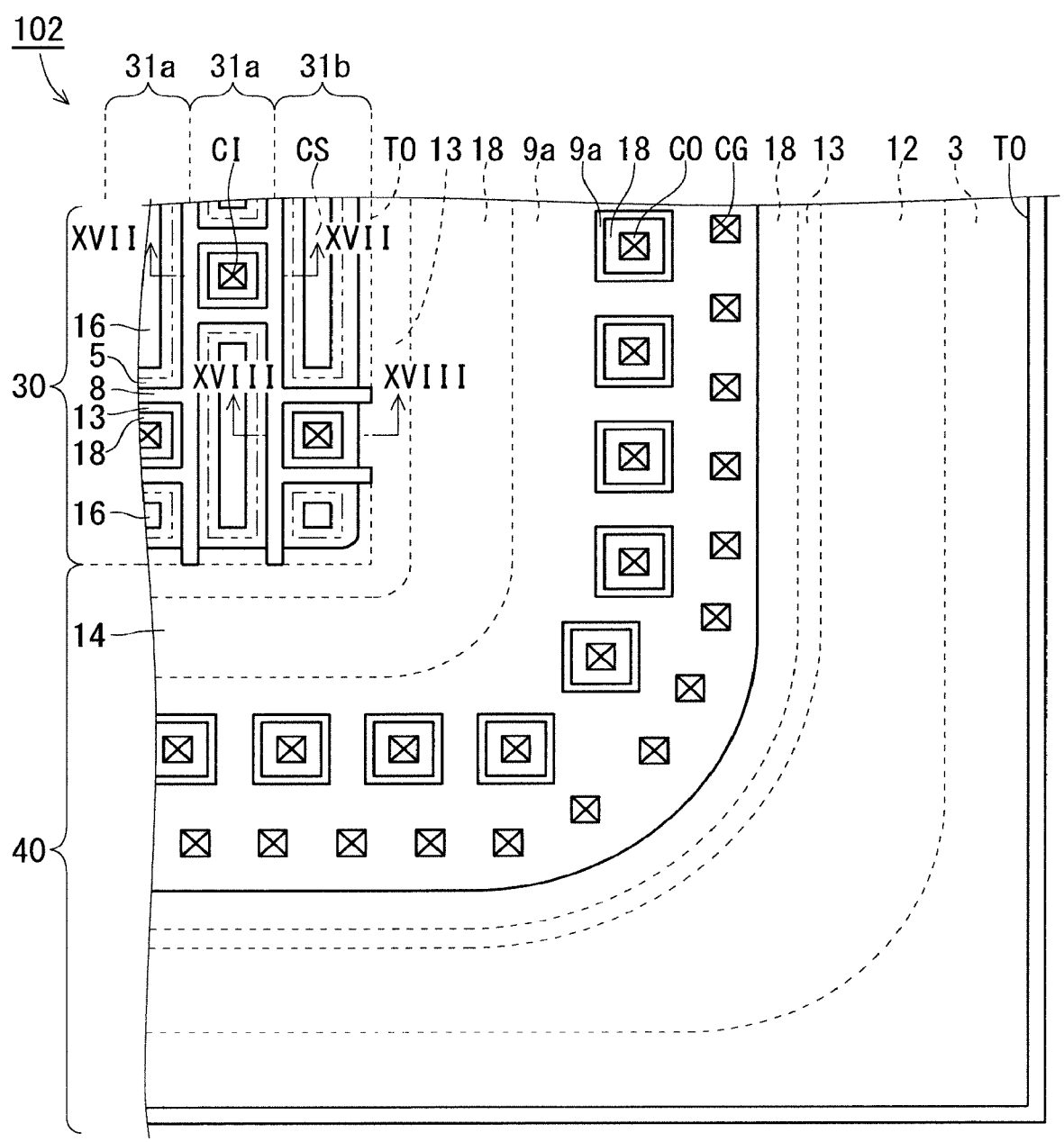
FIG. 16 is a partial plan view schematically showing a configuration of a semiconductor device according to a second embodiment of the present invention.
Figure 17:
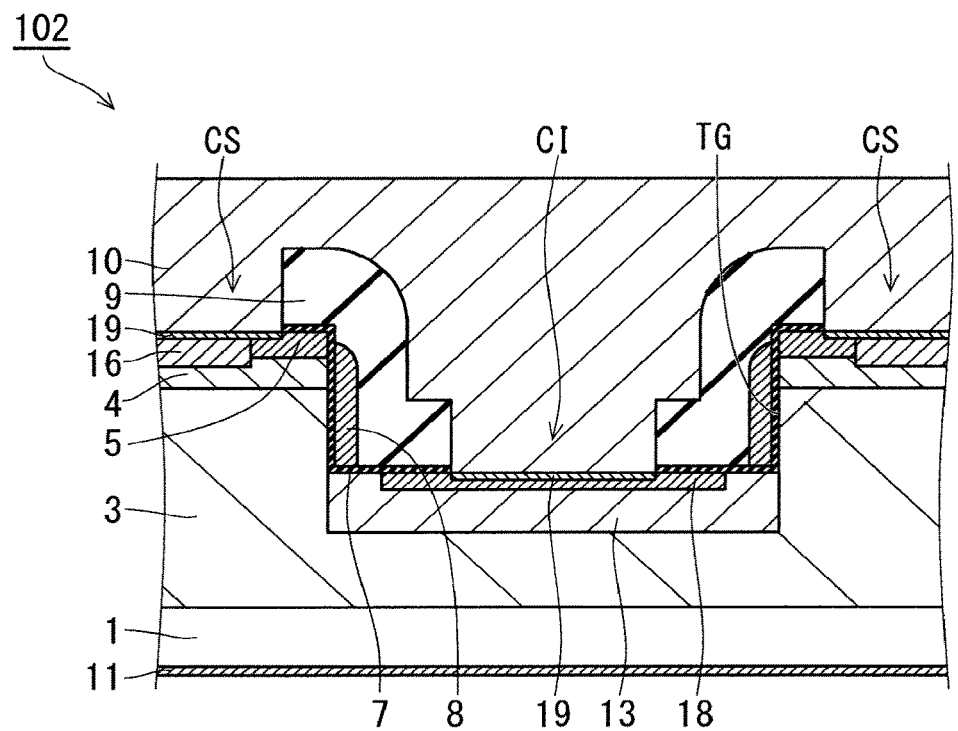
FIG. 17 is a partial cross-sectional view taken along a line XVII-XVII in FIG. 16.
Figure 18:
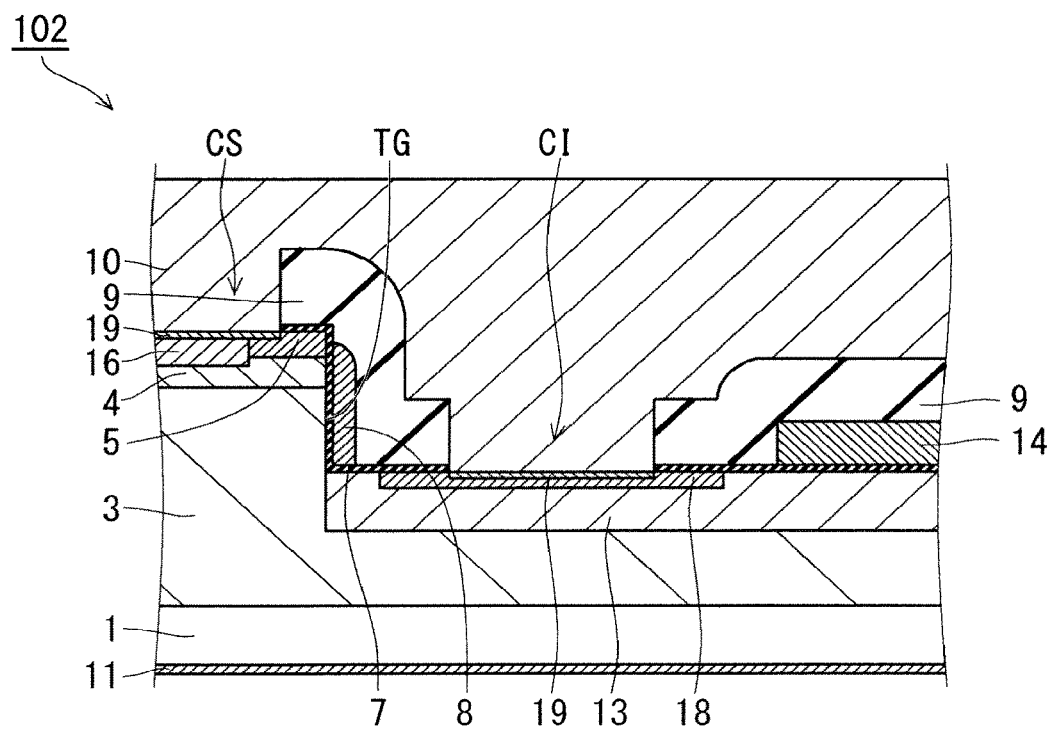
FIG. 18 is a partial cross-sectional view taken along a line XVIII-XVIII in FIG. 16.

FIG. 16 is a partial plan view schematically showing a configuration of a MOSFET 102 (semiconductor device) according to a second embodiment. FIG. 17 is a partial cross-sectional view taken along a line XVII-XVII in FIG. 16. FIG. 18 is a partial cross-sectional view taken along a line XVIII-XVIII in FIG. 16.

In the MOSFET 102, a source electrode 10 includes an inner contact CI which is in contact with a bottom face of a gate trench TG within an active region 30. A portion of the gate trench TG where the inner contact CI is placed in plan view locally has a large width. A bottom face of that portion of the gate trench TG is formed by the trench-bottom field relaxing region 13 and the trench-bottom high-concentration region 18 provided on the trench-bottom field relaxing region 13. Thus, the trench-bottom high-concentration region 18 includes a portion placed on a bottom face of the gate trench TG, and this portion is in contact with the inner contact CI. The inner contact CI includes a silicide region 19 in a portion being in contact with a semiconductor layer. The inner contact CI may be placed in either an end of the active region 30 or a portion inner than the end of the active region 30.

It is noted that since the configuration is nearly identical to the above-described configuration of the first embodiment in the other respects than described above, the same or corresponding components are denoted by the same reference numerals and description of such components will not be repeated.

(Effects)

According to the present embodiment, the inner contact CI which is in contact with a bottom face of the gate trench TG is provided. As a result of this, below a gate insulating film 7 on a bottom face of the gate trench TG, voltage drop caused by a charging/discharging current for a pn junction formed by the trench-bottom high-concentration region 18 and a drift layer 3 can be suppressed. Accordingly, reliability of the gate insulating film 7 within the active region 30 where the gate trench TG is provided can be enhanced. Also, switching loss caused by a charging/discharging current can be reduced. Also, a response speed in extension of a depletion layer during a short circuit of a load is increased, so that a short-circuit tolerance of the MOSFET 102 can be improved.

A charging/discharging current from the trench-bottom field relaxing region 13 near the active-region end 31b can be divided into the inner contact CI within the active region 30 and the outer contact CO within the terminating region 40. As a result of this, voltage drop can be suppressed particularly near the active-region end 31b.

(Modifications)

Figure 19:
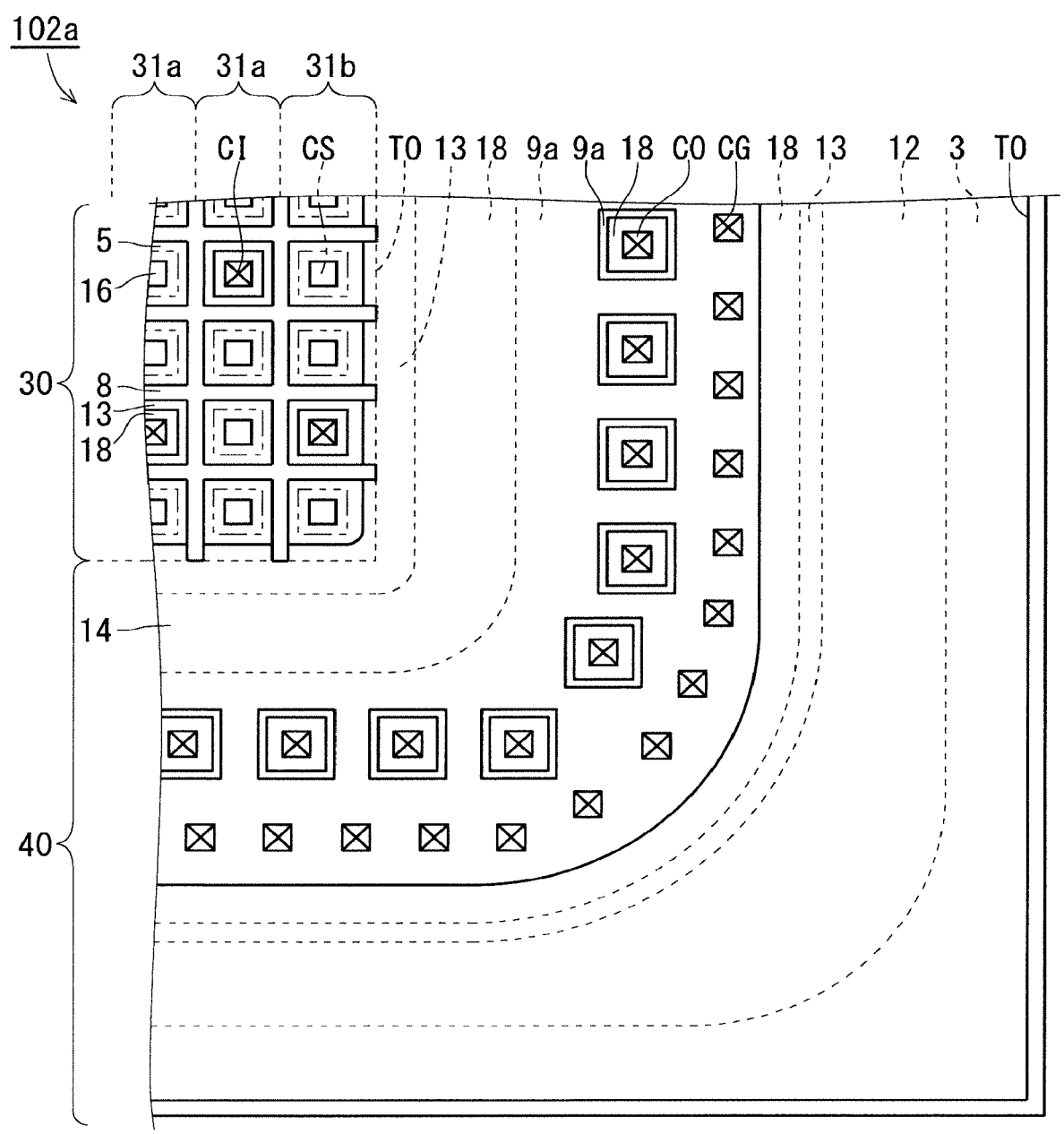
FIG. 19 is a partial plan view schematically showing a configuration of a semiconductor device according to a first modification of the second embodiment of the present invention.

FIG. 19 is a partial plan view schematically showing a configuration of a MOSFET 102a (semiconductor device) according to a first modification of the present embodiment. In the present modification, unlike the MOSFET 102 (FIG. 16), the gate electrode 8 extends so as to form a grid pattern. In other words, cell structures are arranged in a grid pattern.

Figure 20:
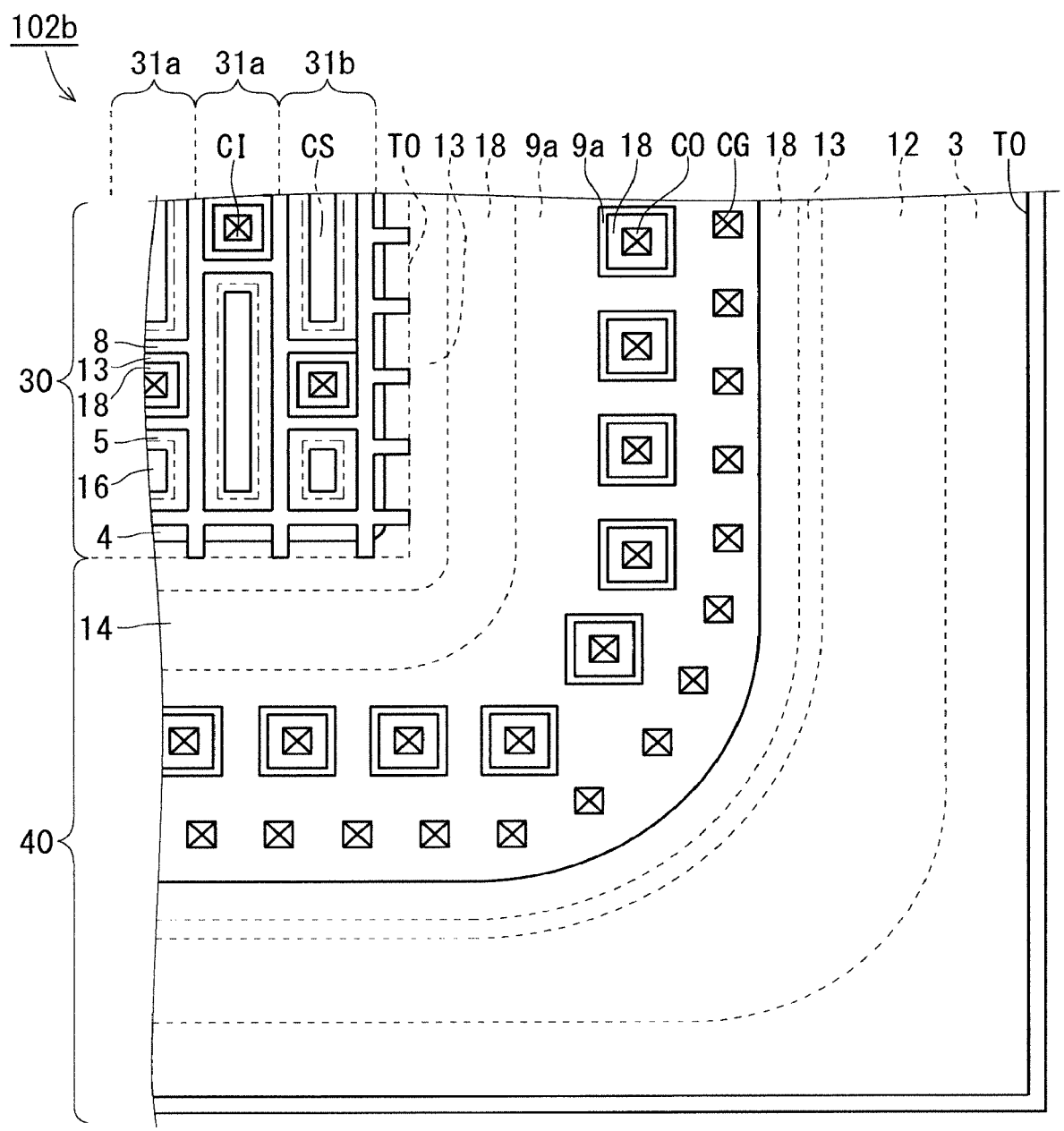
FIG. 20 is a partial plan view schematically showing a configuration of a semiconductor device according to a second modification of the second embodiment of the present invention.

FIG. 20 is a partial plan view schematically showing a configuration of a MOSFET 102b (semiconductor device) according to a second modification of the present embodiment. In the present modification, like the MOSFET 101b (FIG. 6), the active-region end 31b serving as a dummy cell is provided.

Figure 21:
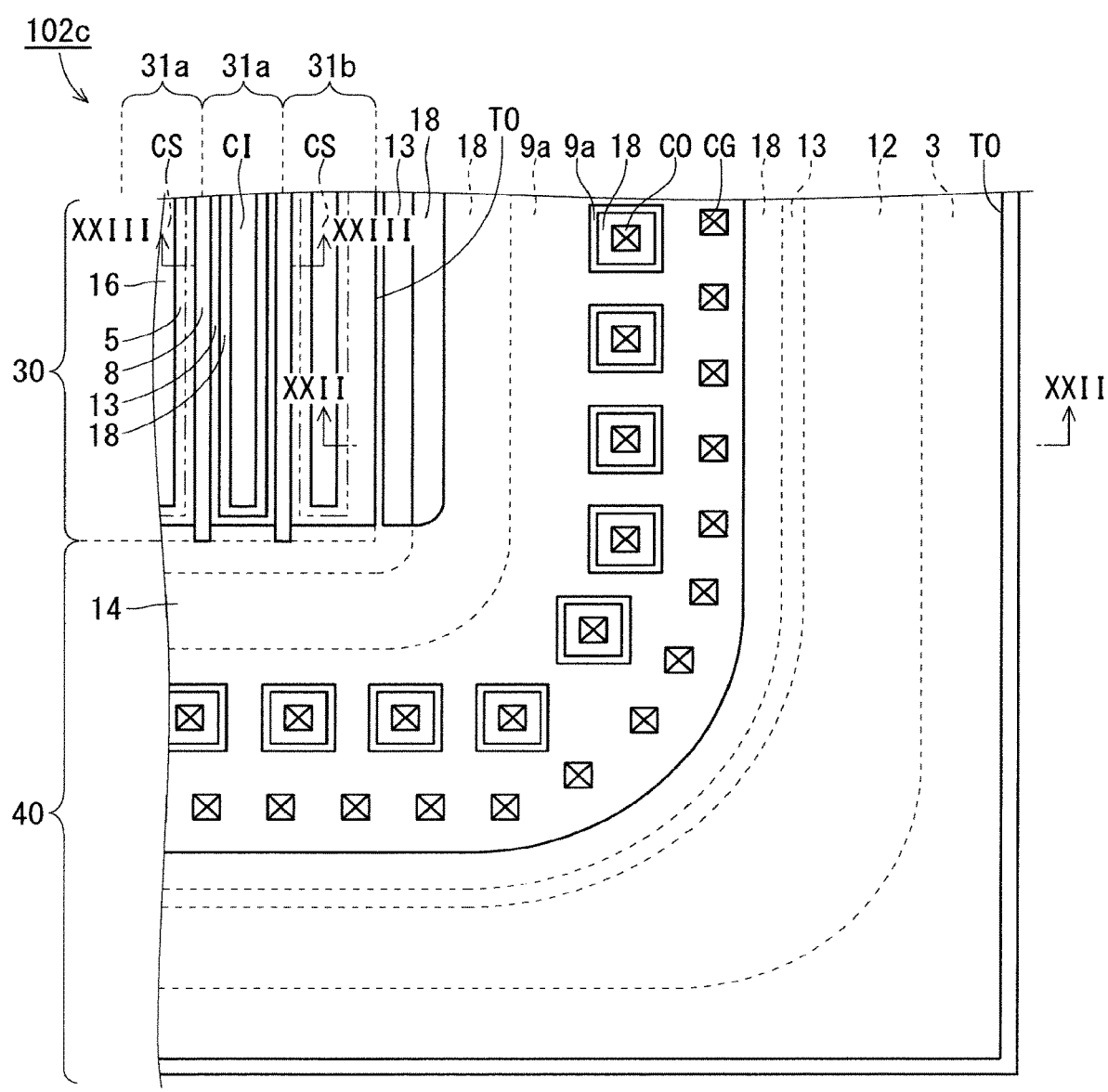
FIG. 21 is a partial plan view schematically showing a configuration of a semiconductor device according to a third modification of the second embodiment of the present invention.
Figure 22:
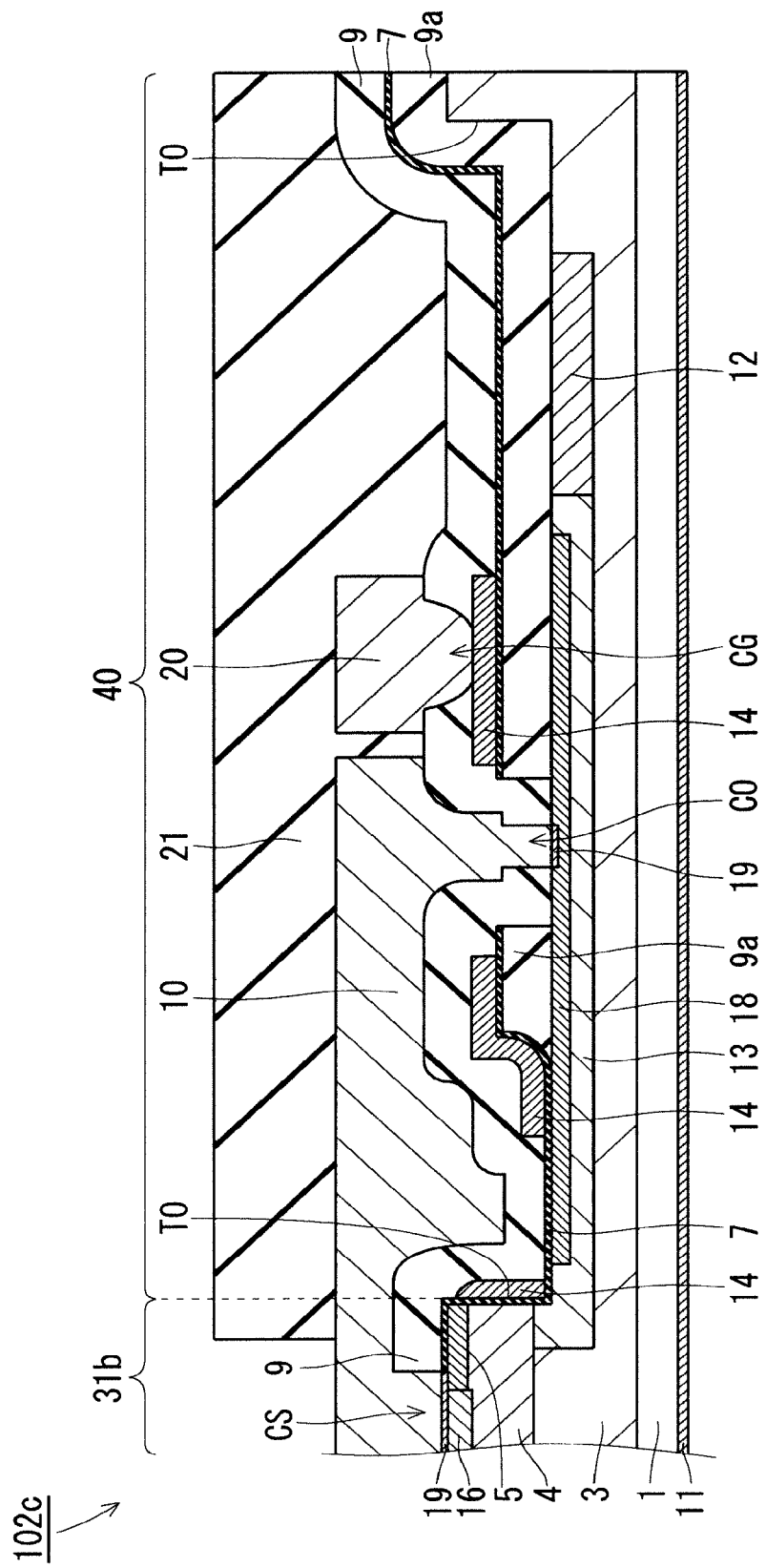
FIG. 22 is a partial cross-sectional view taken along a line XXII-XXII in FIG. 21.
Figure 23:
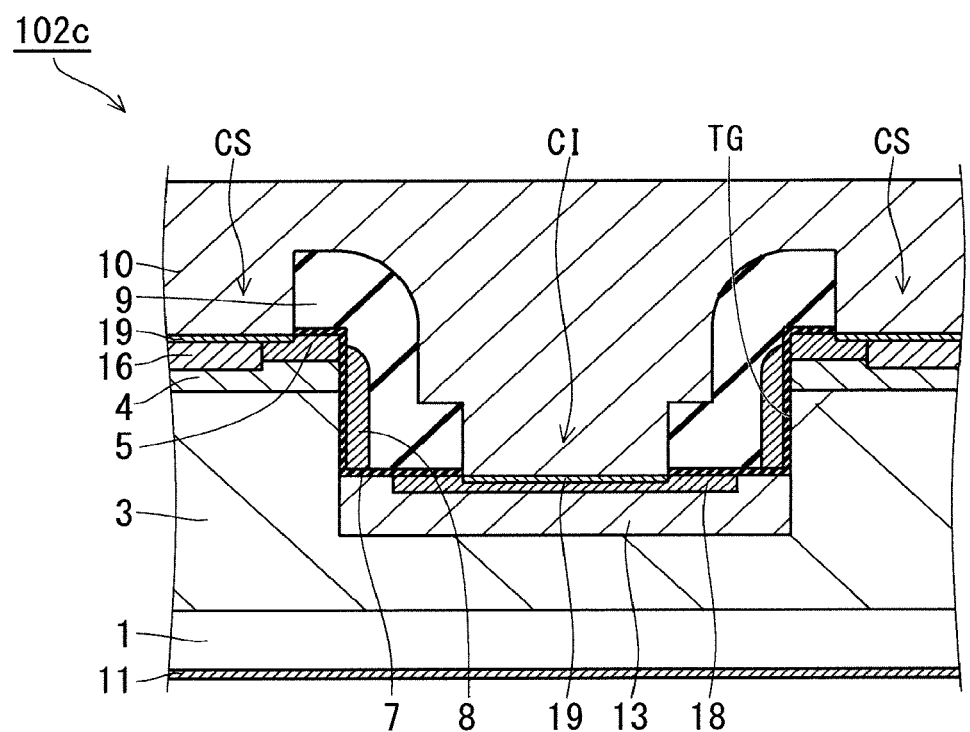
FIG. 23 is a partial cross-sectional view taken along a line XXIII-XXIII in FIG. 21.

FIG. 21 is a partial plan view schematically showing a configuration of a MOSFET 102c (semiconductor device) according to a third modification of the present embodiment. FIG. 22 is a partial cross-sectional view taken along a line XXII-XXII in FIG. 21. FIG. 23 is a partial cross-sectional view taken along a line XXIII-XXIII in FIG. 21. In the present modification, the unit cell 31a which includes the source contact CS and can function as a transistor element and the unit cell 31a including the inner contact CI are arranged in a form of stripes.

As above, modifications of a cell structure within the active region 30 have been described. However, a cell structure within the active region 30 is not limited to those structures.

Third Embodiment (Configuration and Effects)

Figure 24:
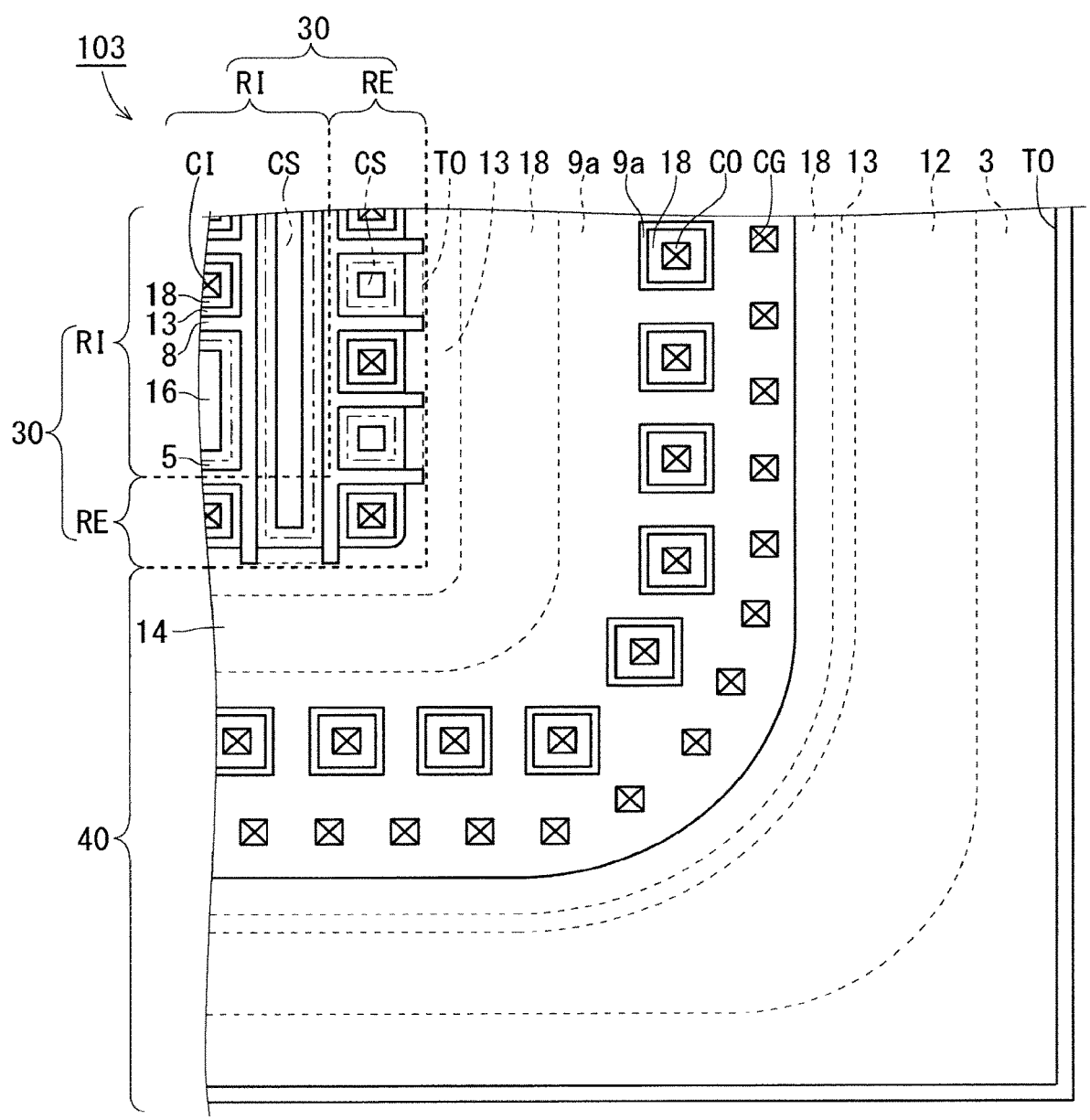
FIG. 24 is a partial plan view schematically showing a configuration of a semiconductor device according to a third embodiment of the present invention.

FIG. 24 is a partial plan view schematically showing a configuration of a MOSFET 103 (semiconductor device) according to a third embodiment. In the MOSFET 103, an active region 30 includes an end region RE located in an end of the active region 30 and an inner region RI located inner than the end region RE. An area which is occupied by an inner contact CI per unit area in the end region RE is larger than an area which is occupied by the inner contact CI per unit area in the inner region RI. It is noted that since the configuration is nearly identical to the above-described configuration of the second embodiment in the other respects than described above, the same or corresponding components are denoted by the same reference numerals and description of such components will not be repeated.

A charging/discharging current for a pn junction formed by a trench-bottom field relaxing region 13 between the end region RE and the outer contact CO is divided into an outer contact CO and the inner contact CI, and thus, is reduced. Nonetheless, the trench-bottom field relaxing region 13 is provided over a wide range between the end region RE and the outer contact CO, as shown in the drawings. A current flows from such a wide range toward each inner contact CI within the end region RE. Accordingly, in a configuration of the MOSFET 102 (FIG. 16: second embodiment), for example, a high current tends to flow toward each inner contact CI. In a path through which such a high current flows, a decrease of reliability of a gate insulating film 7, an increase of switching loss, or reduction in a short-circuit tolerance, as described above, are likely to be caused.

In contrast thereto, according to the present embodiment, an area which is occupied by the inner contact CI per unit area in the end region RE is larger than an area which is occupied by the inner contact CI per unit area in the inner region RI. Accordingly, a magnitude of a current flowing toward each inner contact CI within the end region RE can be reduced. Therefore, a decrease of reliability of the gate insulating film 7, an increase of switching loss, or reduction in a short-circuit tolerance can be further suppressed.

(Modifications)

Figure 25:
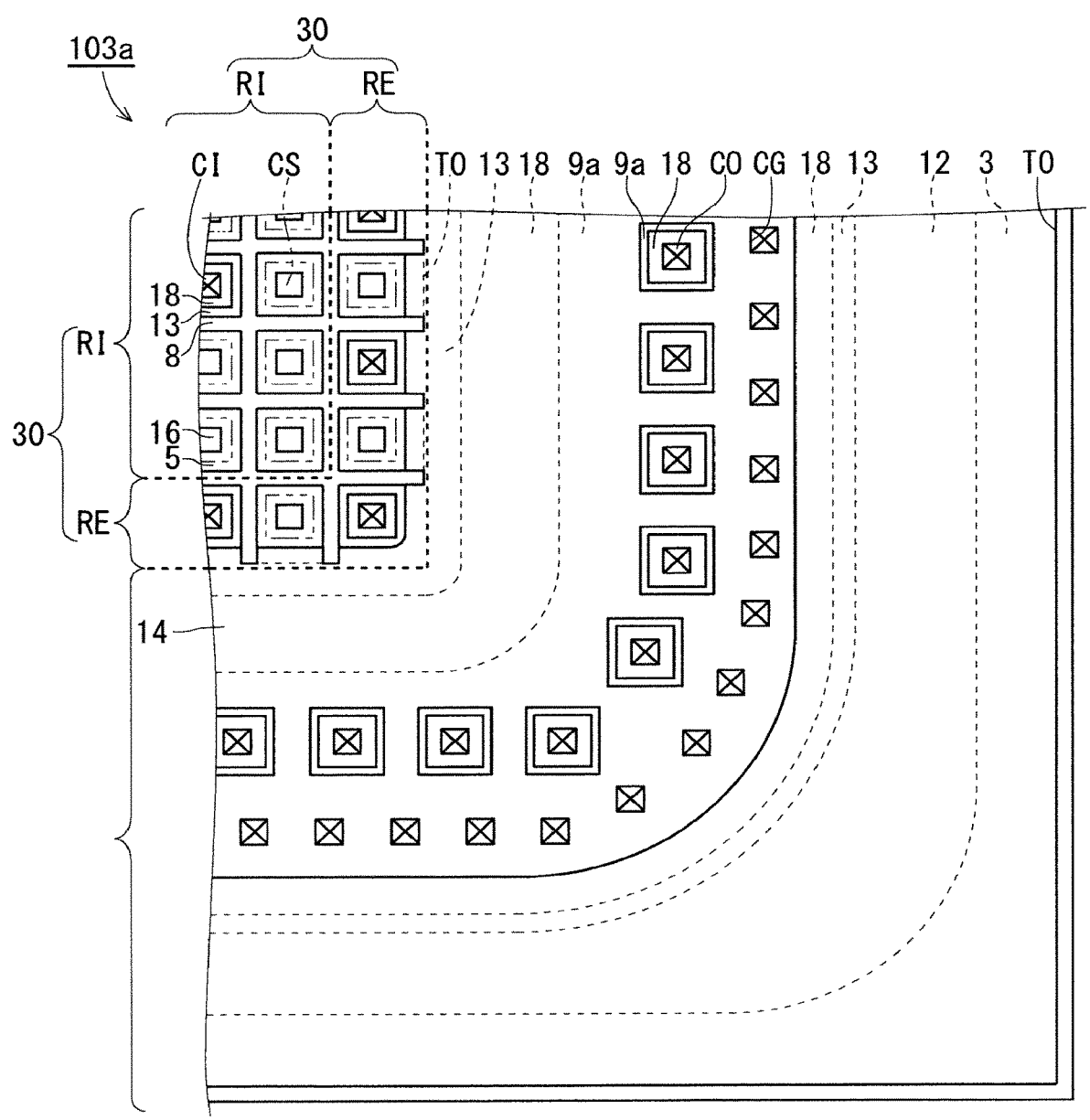
FIG. 25 is a partial plan view schematically showing a configuration of a semiconductor device according to a first modification of the third embodiment of the present invention.

FIG. 25 is a partial plan view schematically showing a configuration of a MOSFET 103a (semiconductor device) according to a first modification of the present embodiment. In the present modification, unlike the MOSFET 103 (FIG. 24), the gate electrode 8 extends so as to form a grid pattern. In other words, cell structures are arranged in a grid pattern.

Figure 26:
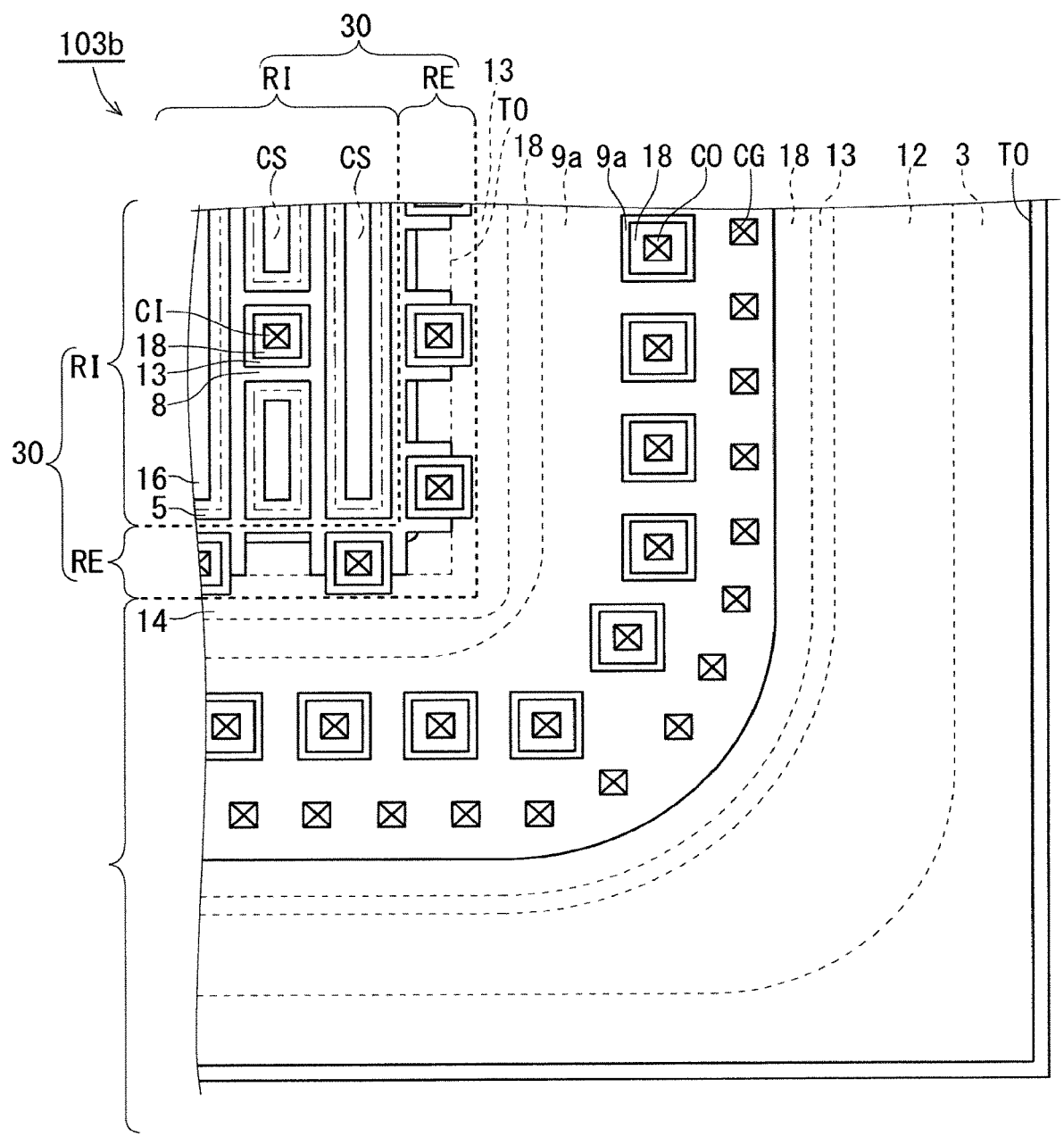
FIG. 26 is a partial plan view schematically showing a configuration of a semiconductor device according to a second modification of the third embodiment of the present invention.

FIG. 26 is a partial plan view schematically showing a configuration of a MOSFET 103b (semiconductor device) according to a second modification of the present embodiment. In the present modification, a dummy cell described above with regard to the MOSFET 101b (FIG. 6) is provided in a part of the end region RE.

Figure 27:
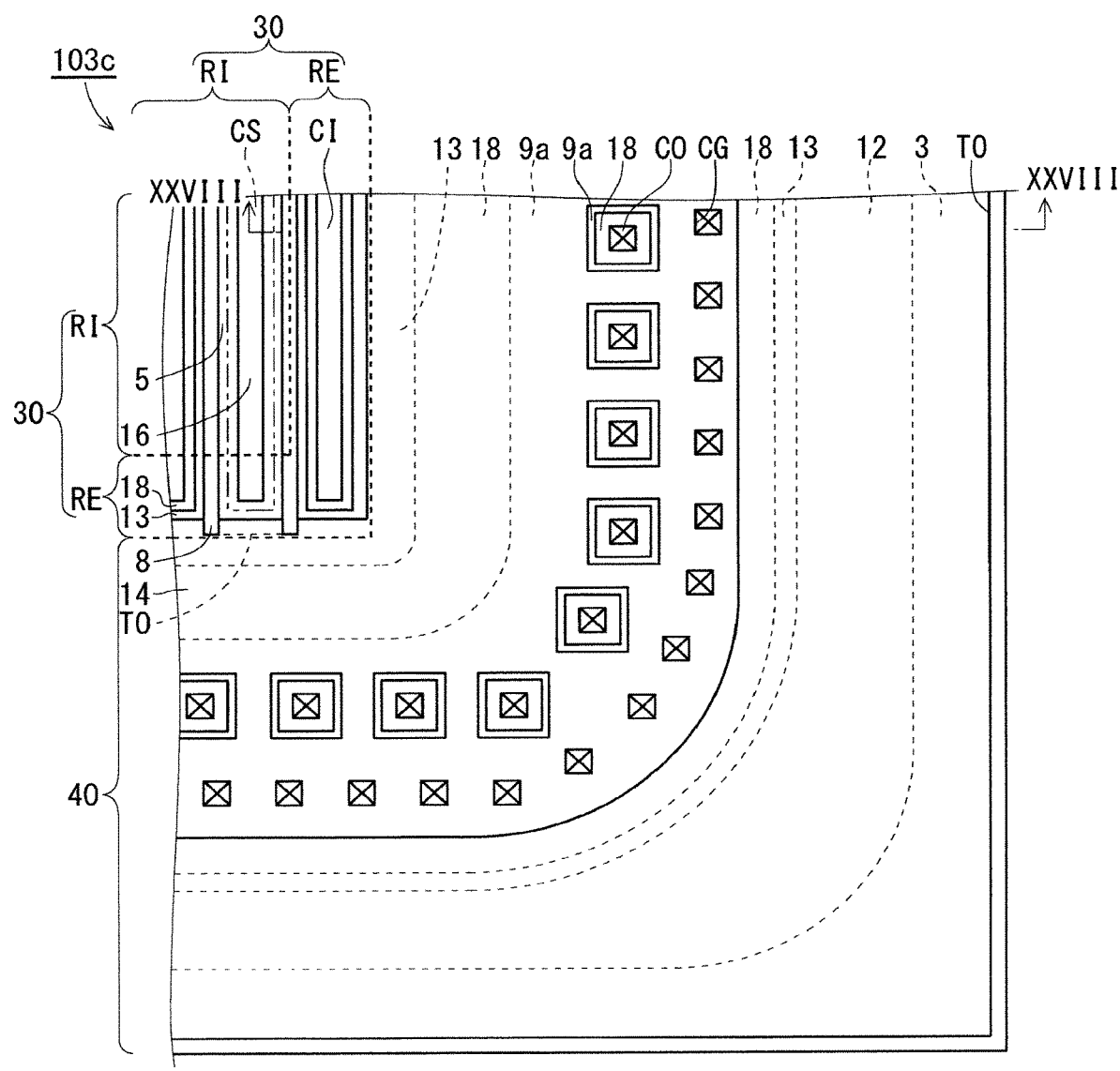
FIG. 27 is a partial plan view schematically showing a configuration of a semiconductor device according to a third modification of the third embodiment of the present invention.
Figure 28:
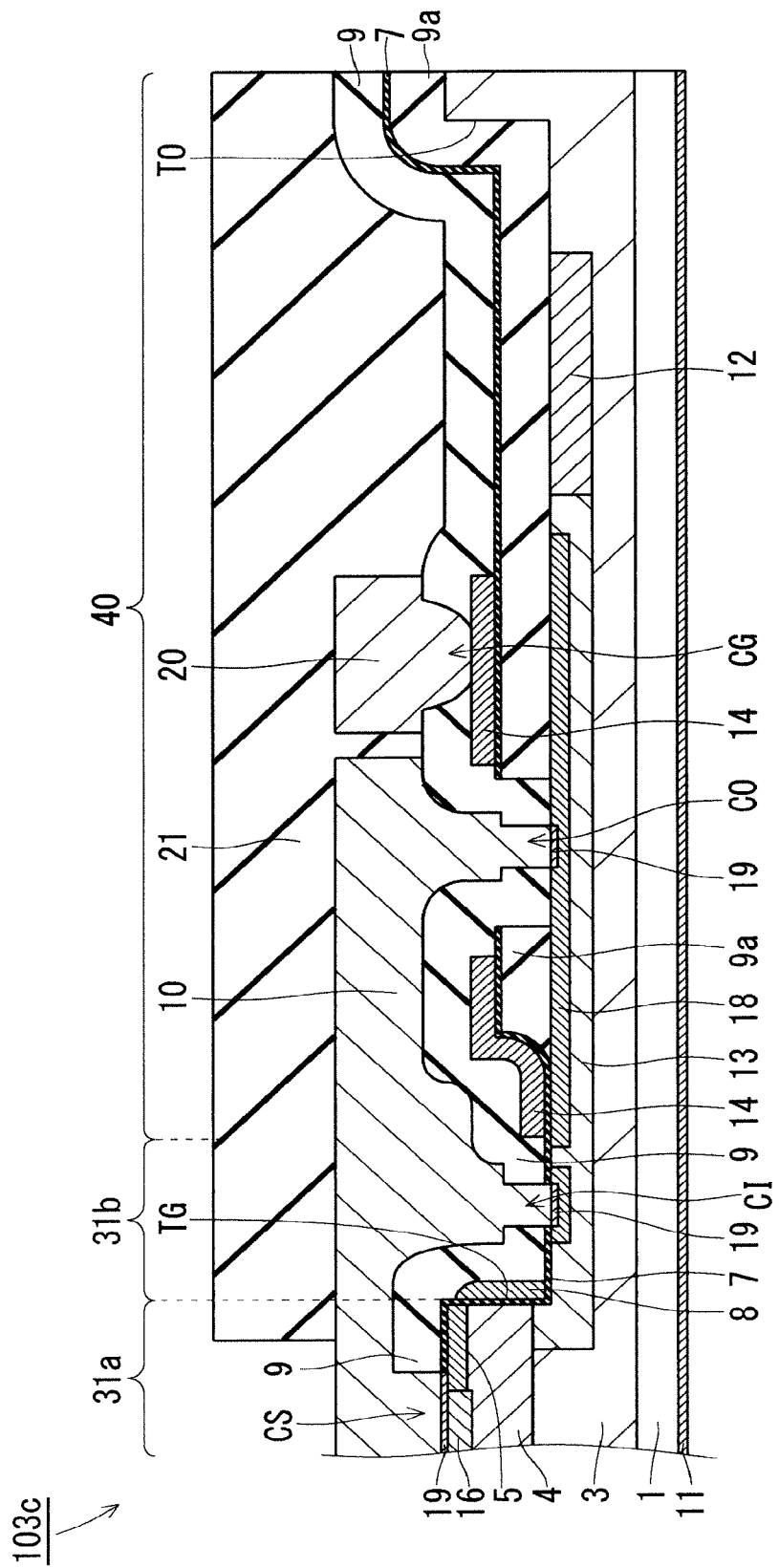
FIG. 28 is a partial cross-sectional view taken along a line XXVIII-XXVIII in FIG. 27.

FIG. 27 is a partial plan view schematically showing a configuration of a MOSFET 103c (semiconductor device) according to a third modification of the present embodiment. FIG. 28 is a partial cross-sectional view taken along a line XXVIII-XXVIII in FIG. 27. In the present modification, a unit cell which includes a source contact CS and can function as a transistor element and a unit cell including the inner contact CI are arranged in a form of stripes within the active region 30. Arrangement in a form of stripes is designed so that a unit cell including the inner contact CI is placed in the end region RE.

Figure 29:
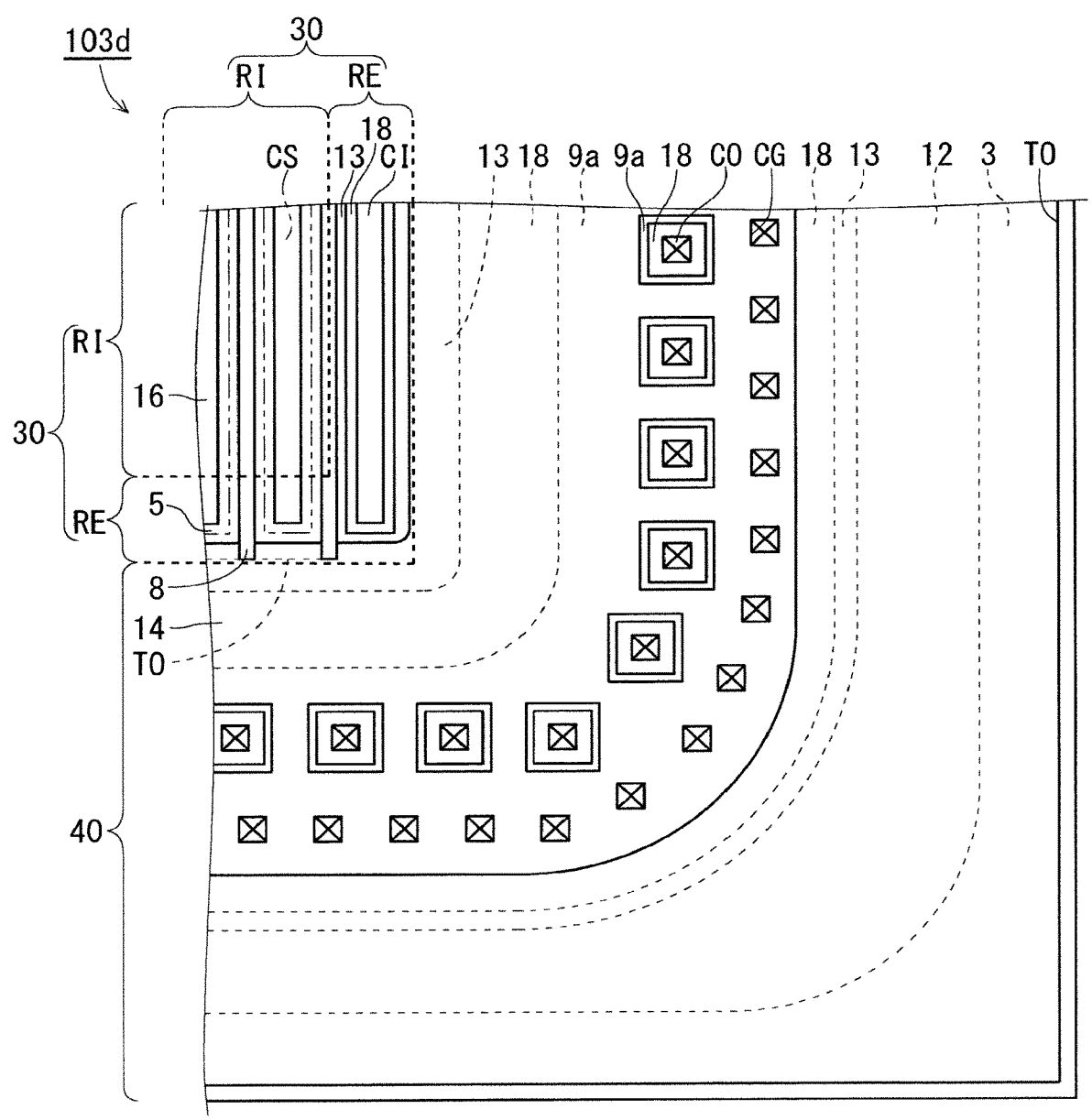
FIG. 29 is a partial plan view schematically showing a configuration of a semiconductor device according to a fourth modification of the third embodiment of the present invention.

FIG. 29 is a partial plan view schematically showing a configuration of a MOSFET 103d (semiconductor device)

according to a fourth modification of the present embodiment. In the present modification, a unit cell which includes the source contact CS and can function as a transistor element and a unit cell including the inner contact CI are arranged in a form of stripes within the active region 30. One of unit cells repeatedly placed in a form of stripes, which is placed in an endmost portion, is set to be a unit cell including the inner contact CI. In a portion inner than the endmost portion, a unit cell including the source contact CS is repeatedly placed.

As above, modifications of a cell structure in the active region 30 have been described. However, a cell structure in the active region 30 is not limited to those structures.

Fourth Embodiment (Configuration and Effects)

Figure 30:
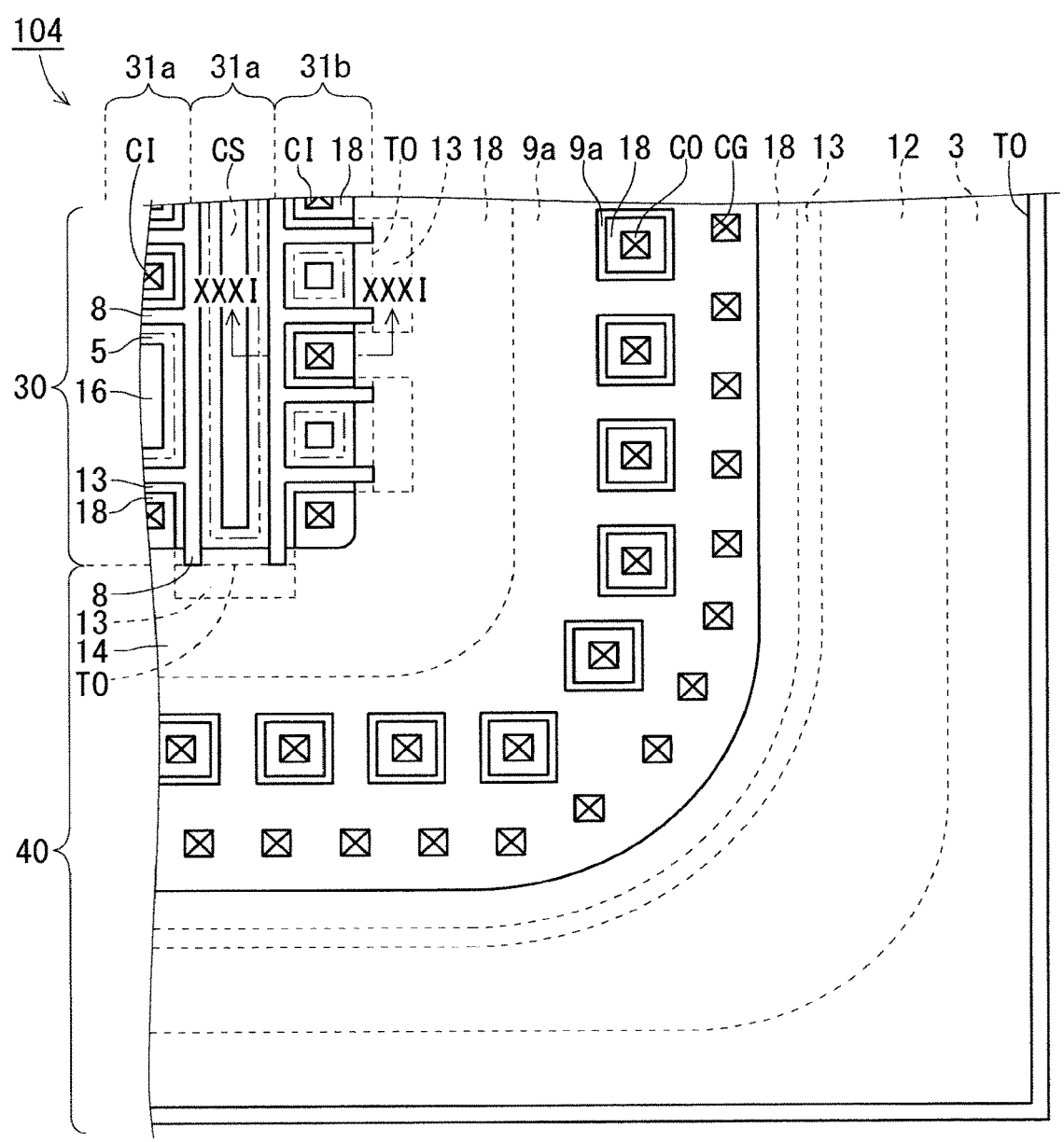
FIG. 30 is a partial plan view schematically showing a configuration of a semiconductor device according to a fourth embodiment of the present invention.

FIG. 30 is a partial plan view schematically showing a configuration of a MOSFET 104 (semiconductor device) according to a fourth embodiment. FIG. 31 is a partial cross-sectional view taken along a line XXXI-XXXI in FIG. 30. In the MOSFET 104, a trench-bottom high-concentration region 18 extends from an outer contact CO to an inner contact CI. It is noted that since the configuration is nearly identical to the above-described configuration of the second or third embodiment in the other respects than described above, the same or corresponding components are denoted by the same reference numerals and description of such components will not be repeated.

A charging/discharging current for a pn junction which is formed by a trench-bottom field relaxing region 13 between an active-region end 31b and the outer contact CO is divided into the outer contact CO and the inner contact CI, and thus, is reduced. Nonetheless, the trench-bottom field relaxing region 13 is provided over a wide range between the active-region end 31b and the outer contact CO, as shown in the drawings. A current flows from such a wide range toward each inner contact CI within the active-region end 31b. Accordingly, in a configuration of the MOSFET 102 (FIG. 16: second embodiment), for example, a high current tends to flow toward each inner contact CI. In a path through which such a high current flows, a decrease of reliability of a gate insulating film 7, an increase of switching loss, or reduction in a short-circuit tolerance, as described above, are likely to be caused.

In contrast thereto, according to the present embodiment, the trench-bottom high-concentration region 18 extends from the outer contact CO to the inner contact CI. In other words, the trench-bottom high-concentration region 18 extends along a path through which the above-described high charging/discharging current flows. Accordingly, resistance of a current path through which a high charging/discharging current flows is reduced. Therefore, a decrease of reliability of the gate insulating film 7, an increase of switching loss, or reduction in a short-circuit tolerance can be further suppressed.

(Modification)

Figure 32:
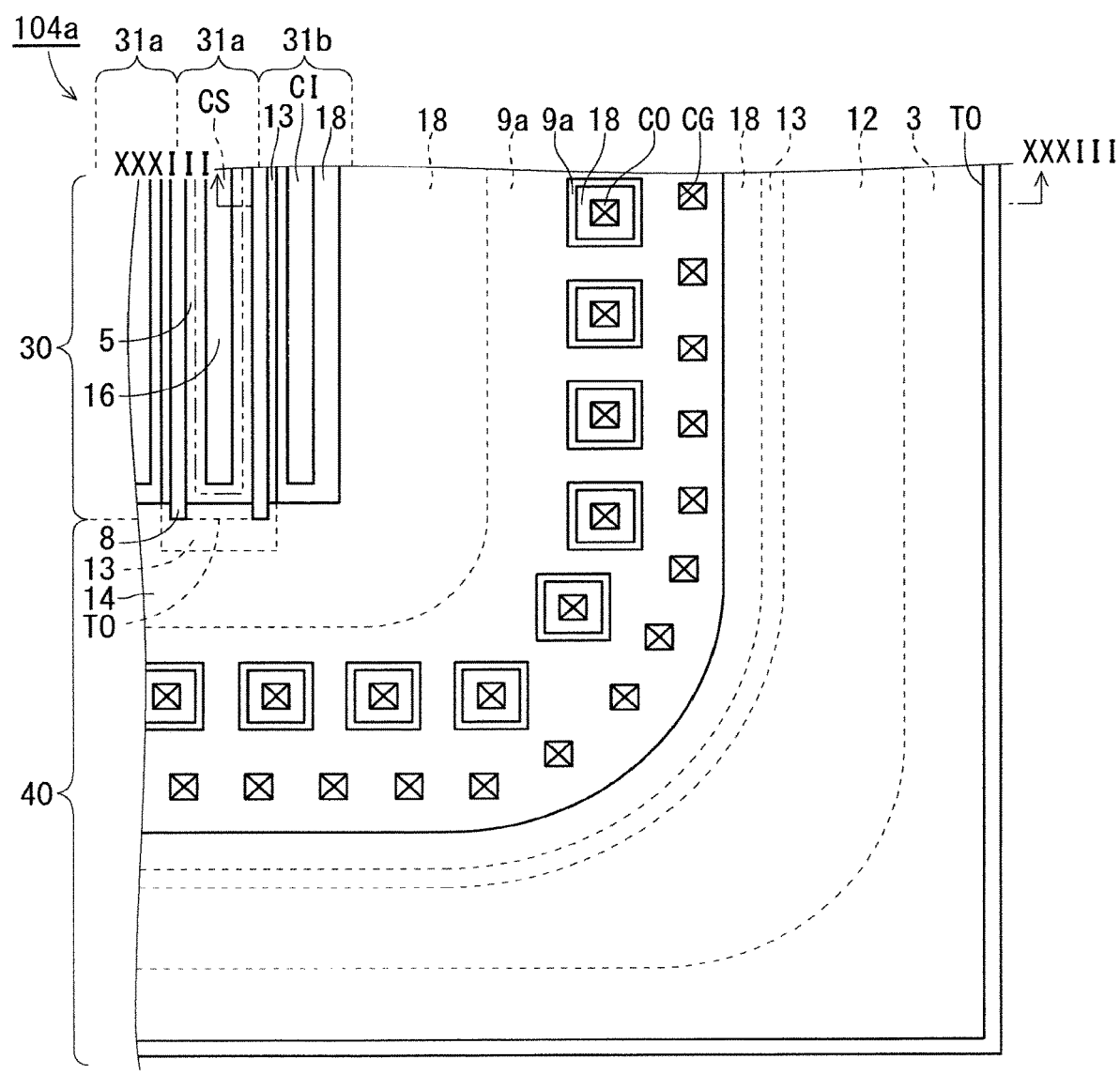
FIG. 32 is a partial plan view schematically showing a configuration of a semiconductor device according to a first modification of the fourth embodiment of the present invention.
Figure 33:
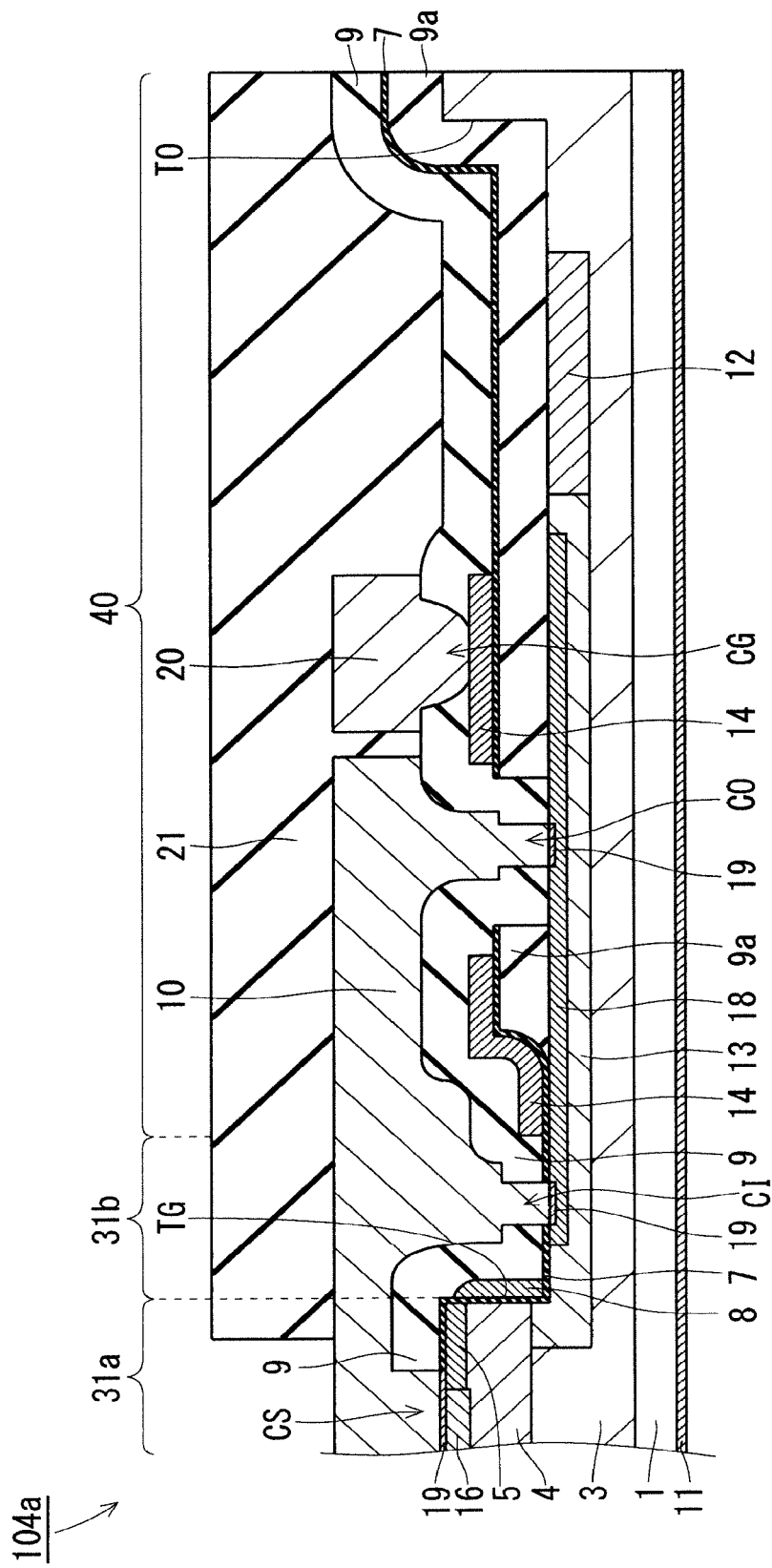
FIG. 33 is a partial cross-sectional view taken along a line XXXIII-XXXIII in FIG. 32.

FIG. 32 is a partial plan view schematically showing a configuration of a MOSFET 104a (semiconductor device) according to a first modification of the present embodiment. FIG. 33 is a partial cross-sectional view taken along a line XXXIII-XXXIII in FIG. 32. In the present modification, a unit cell which includes a source contact CS and can function as a transistor element and a unit cell including the inner contact CI are arranged in a form of stripes within an active region 30. Arrangement in a form of stripes is designed so that a unit cell including the inner contact CI is placed in an end of the active region 30. Additionally, a cell structure in the active region 30 is not limited to those in the present embodiment and its modification.

Fifth Embodiment (Configuration)

Figure 34:
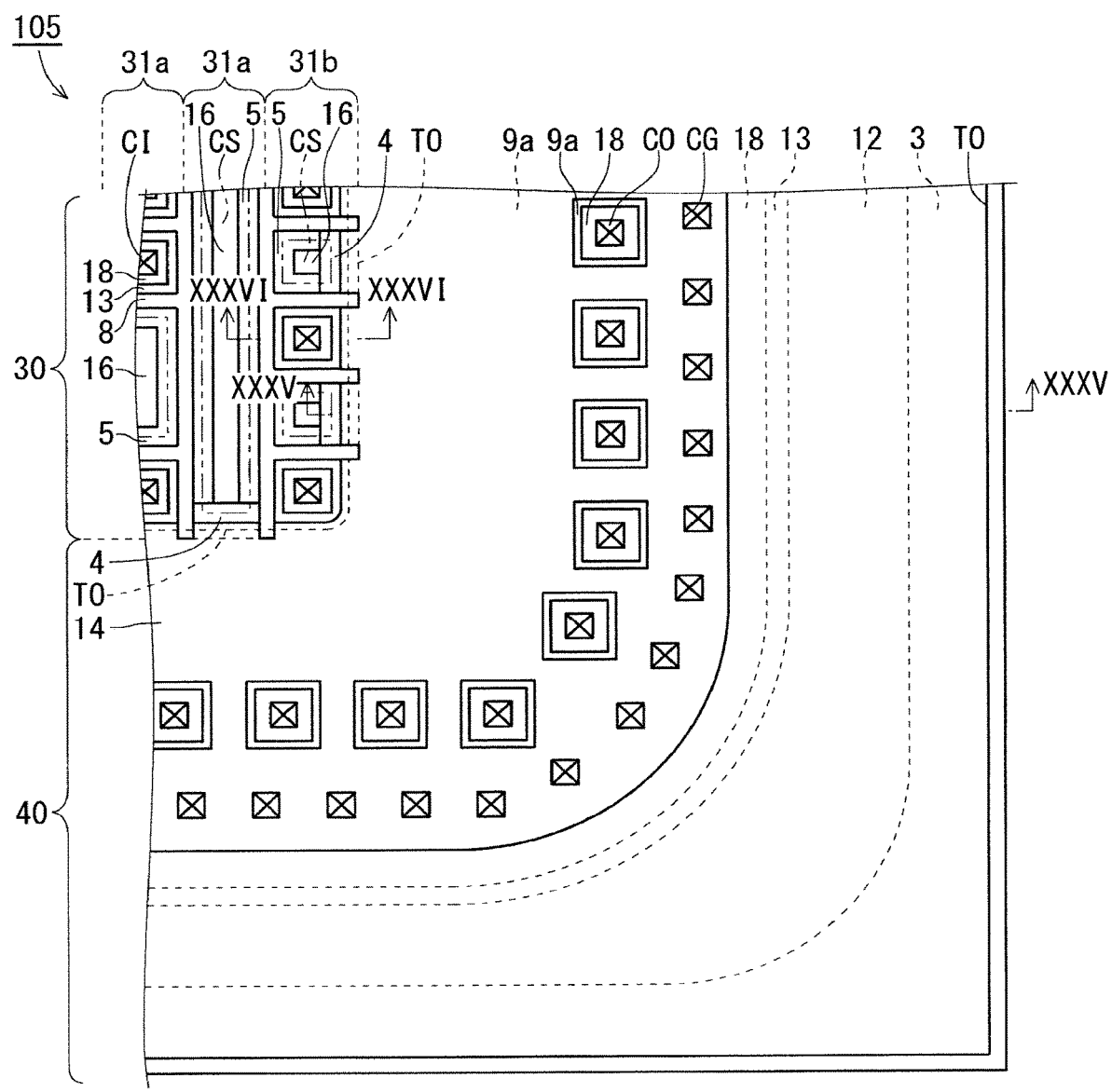
FIG. 34 is a partial plan view schematically showing a configuration of a semiconductor device according to a fifth embodiment of the present invention.
Figure 35:
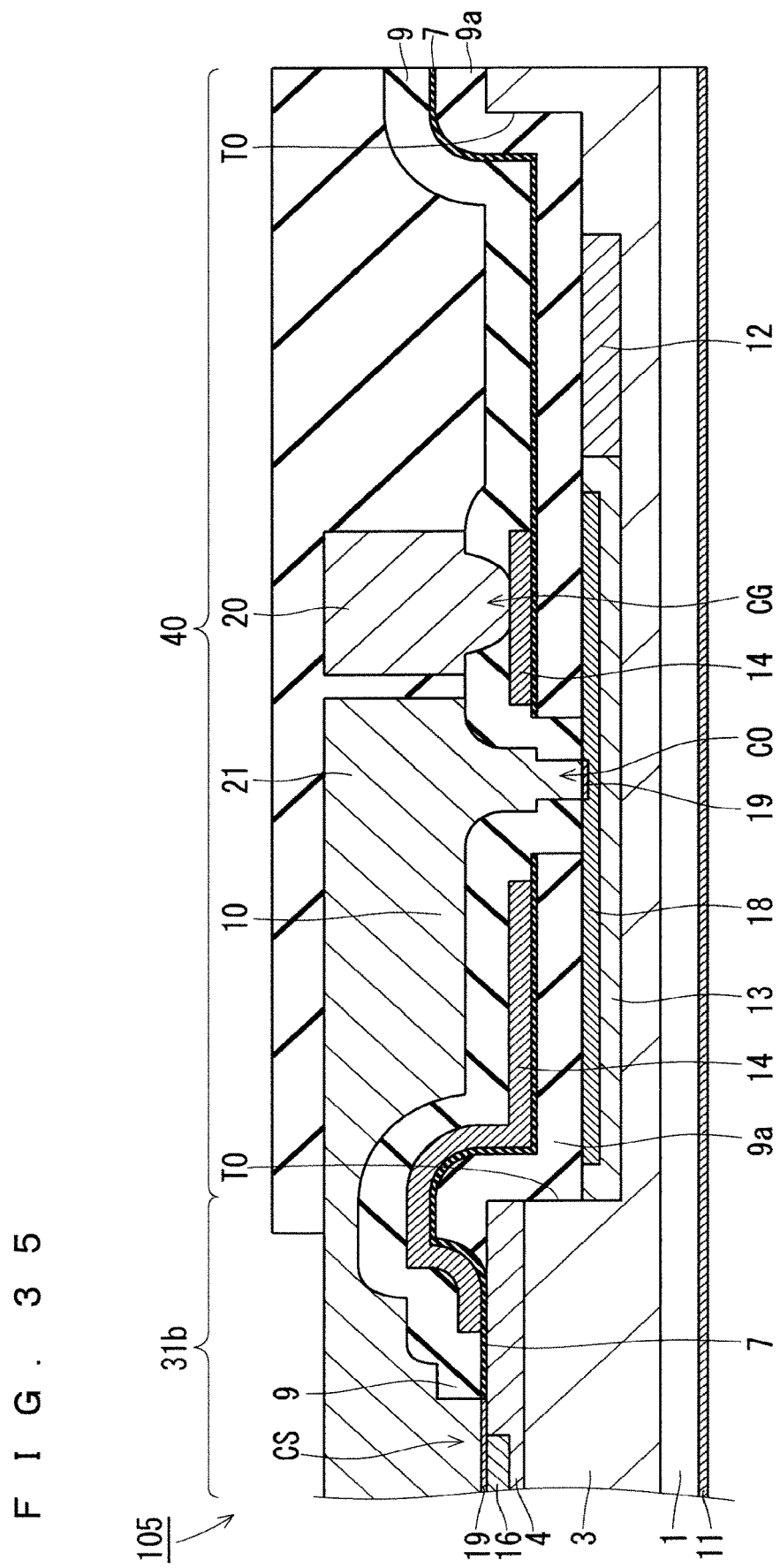
FIG. 35 is a partial cross-sectional view taken along a line XXXV-XXXV in FIG. 34.
Figure 36:
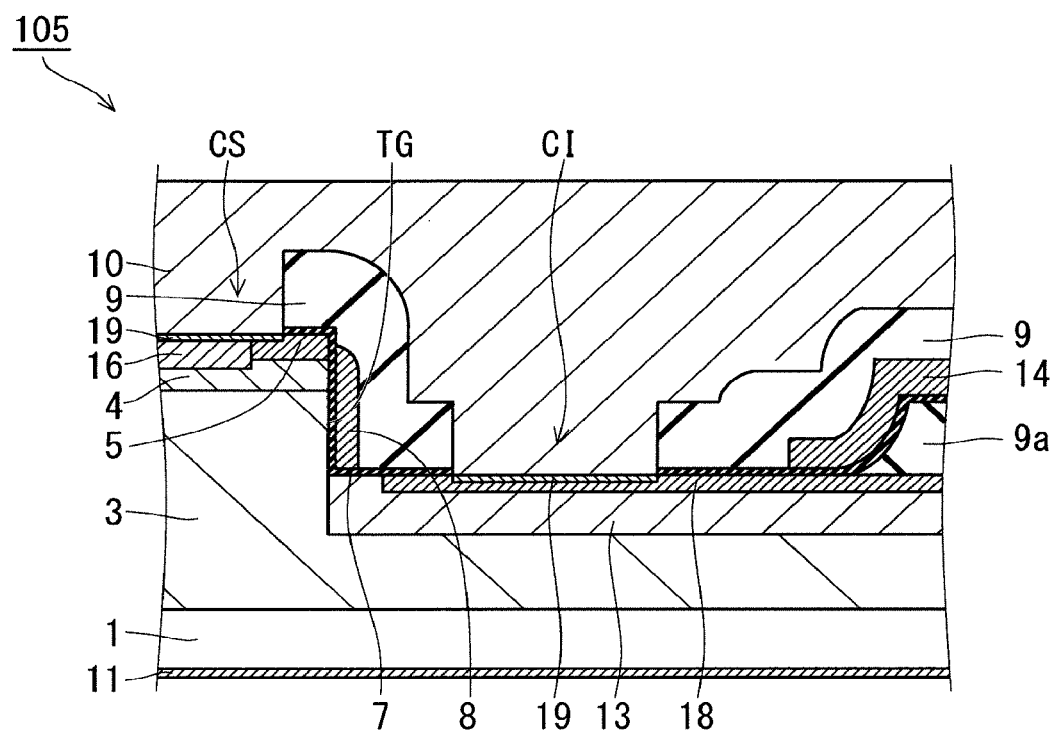
FIG. 36 is a partial cross-sectional view taken along a line XXXVI-XXXVI in FIG. 34.

FIG. 34 is a partial plan view schematically showing a configuration of a MOSFET 105 (semiconductor device) according to a fifth embodiment. FIG. 35 is a partial cross-sectional view taken along a line XXXV-XXXV in FIG. 34. FIG. 36 is a partial cross-sectional view taken along a line XXXVI-XXXVI in FIG. 34.

In the MOSFET 105, a field insulating film 9a reaches an open end of an outer trench TO. As shown in FIG. 35, a gate connection layer 14 extends from an inside of the outer trench TO toward an active region 30 to an outside of the outer trench TO (from the right side toward the left side in FIG. 35), and climbs onto an open end of the outer trench TO (an upper-right corner of an active-region end 31b in FIG. 35) with the field insulating film 9a and a gate insulating film 7 on the field insulating film 9a being interposed. Accordingly, unlike the MOSFET 101 (FIG. 3: first embodiment), a configuration in which the gate connection layer 14 and an open end of the outer trench TO face each other with only the gate insulating film 7 being interposed, is not provided. The field insulating film 9a in addition to the gate insulating film 7 is placed between the gate connection layer 14 and an open end of the outer trench TO, without fail. Preferably, the well region 4 is provided in an open end of the outer trench TO.

Further, the field insulating film 9a completely insulates the gate connection layer 14 and a trench-bottom high-concentration region 18 from each other. Accordingly, unlike the MOSFET 101 (FIG. 3), a configuration in which the gate connection layer 14 and the trench-bottom high-concentration region 18 face each other with only the gate insulating film 7 being interposed, is not provided. The field insulating film 9a in addition to the gate insulating film 7 is provided between the gate connection layer 14 and the trench-bottom high-concentration region 18, without fail.

It is noted that since the configuration is nearly identical to the above-described configurations of the first to fourth embodiments in the other respects than described above, the same or corresponding components are denoted by the same reference numerals and description of such components will not be repeated.

(Effects)

According to the present embodiment, as shown in FIG. 35, the field insulating film 9a in addition to the gate insulating film 7 is provided between the gate connection layer 14 and an open end of the outer trench TO, without fail. As a result of this, on an open end of the outer trench TO, reliability of the gate insulating film 7 can be improved.

The gate connection layer 14 is insulated from the trench-bottom high-concentration region 18 which serves as a main path of a charging/discharging current for a pn junction of the trench-bottom field relaxing region 13 during switching, by not only the gate insulating film 7, but also the field insulating film 9a. As a result of this, dielectric breakdown is prevented from occurring between the trench-bottom high-concentration region 18 and the gate connection layer 14 due to voltage drop caused by the foregoing charging/discharging current.

(Modifications)

Figure 37:
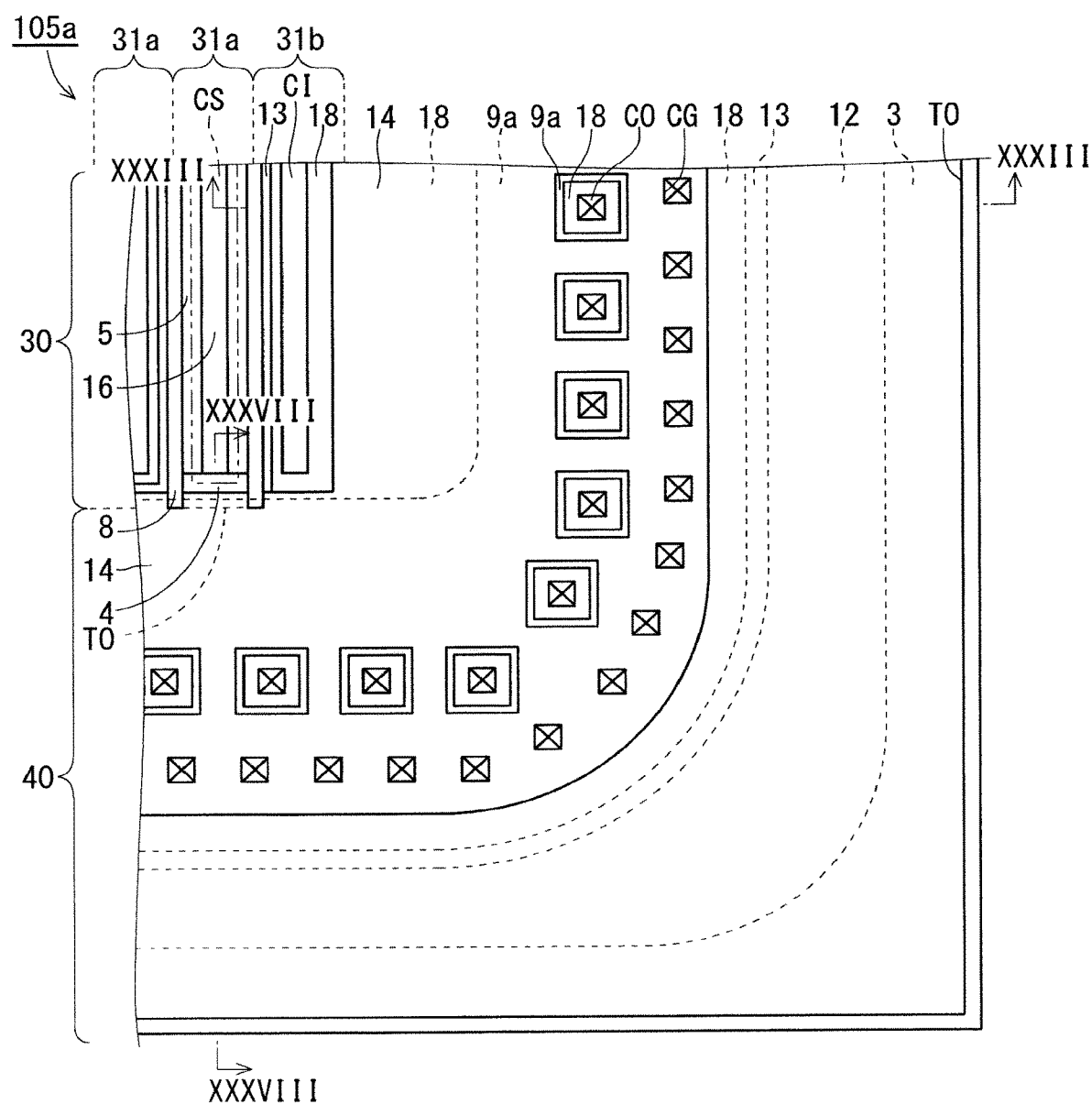
FIG. 37 is a partial plan view schematically showing a configuration of a semiconductor device according to a first modification of the fifth embodiment of the present invention.
Figure 38:
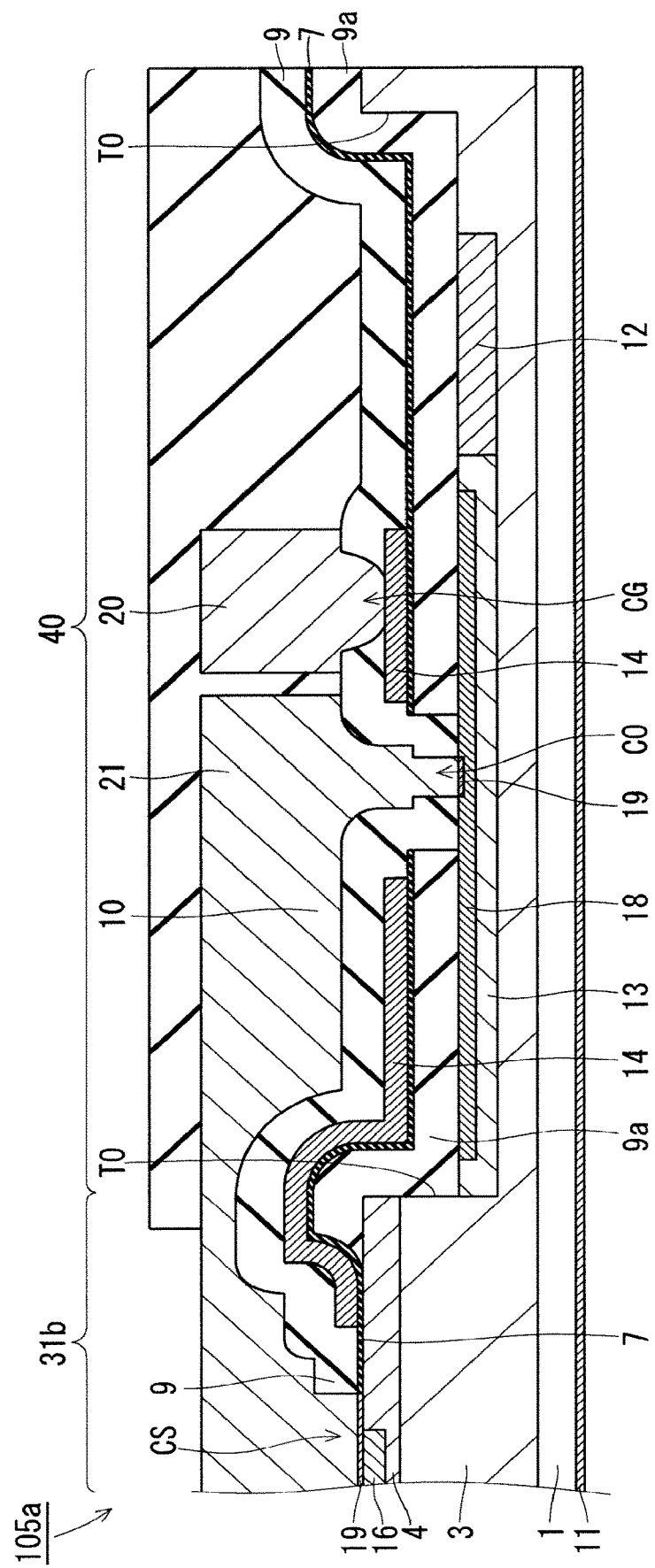
FIG. 38 is a partial cross-sectional view taken along a line XXXVIII-XXXVIII in FIG. 37.

FIG. 37 is a partial plan view schematically showing a configuration of a MOSFET 105a (semiconductor device)

according to a first modification of the present embodiment. FIG. 38 is a partial cross-sectional view taken along a line XXXVIII-XXXVIII in FIG. 37. It is noted that a cross-sectional view taken along line XXXIII-XXXIII in FIG. 37 is similar to FIG. 33 (the first modification of the fourth embodiment). Also in the present modification, as shown in FIG. 38, the field insulating film 9a in addition to the gate insulating film 7 is provided between the gate connection layer 14 and an open end of the outer trench TO, without fail. In the meantime, in the present modification, the gate connection layer 14 includes a portion which is insulated from the trench-bottom high-concentration region 18 by only the gate insulating film 7 as shown in FIG. 33.

Figure 39:
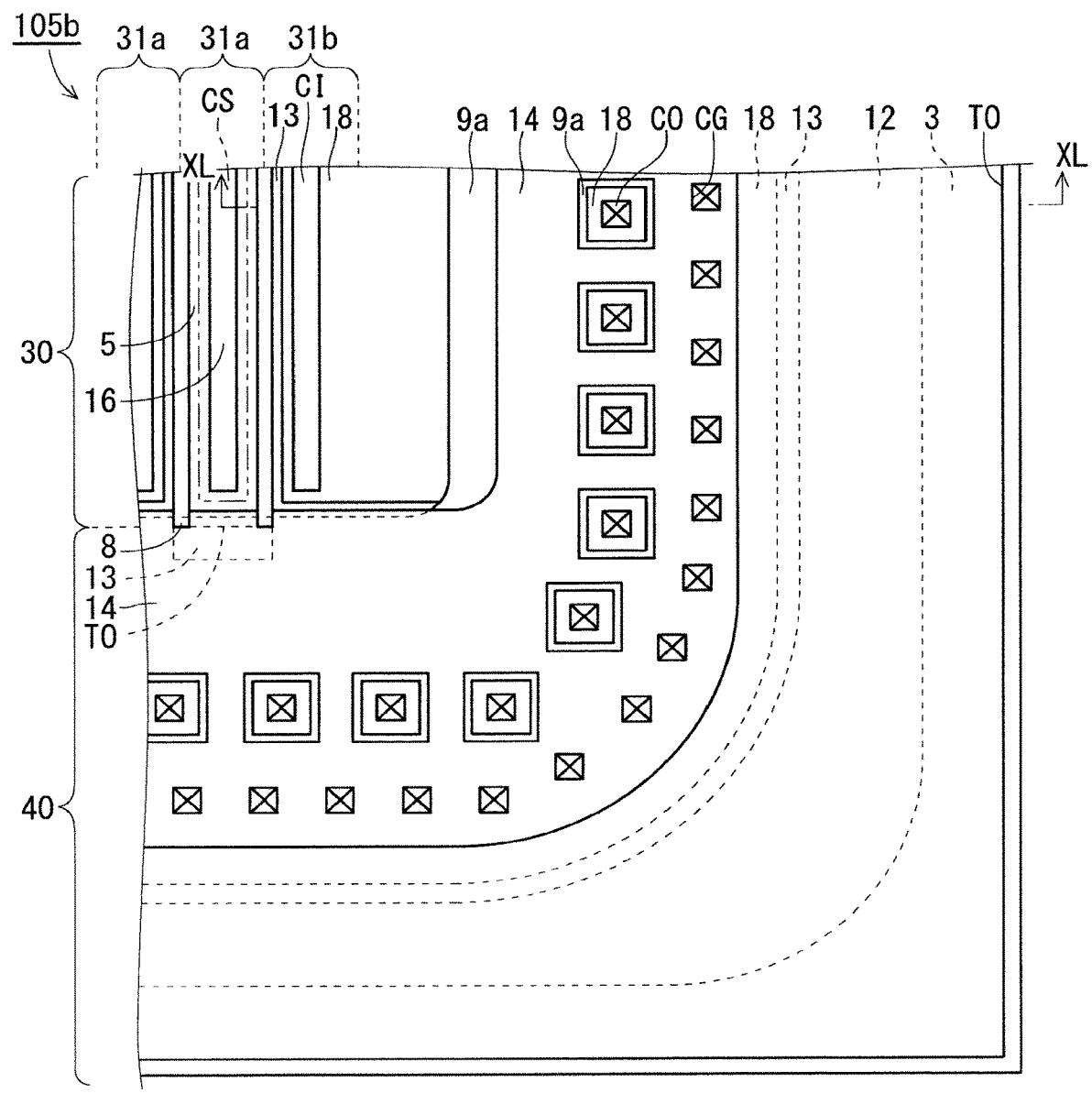
FIG. 39 is a partial plan view schematically showing a configuration of a semiconductor device according to a second modification of the fifth embodiment of the present invention.
Figure 40:
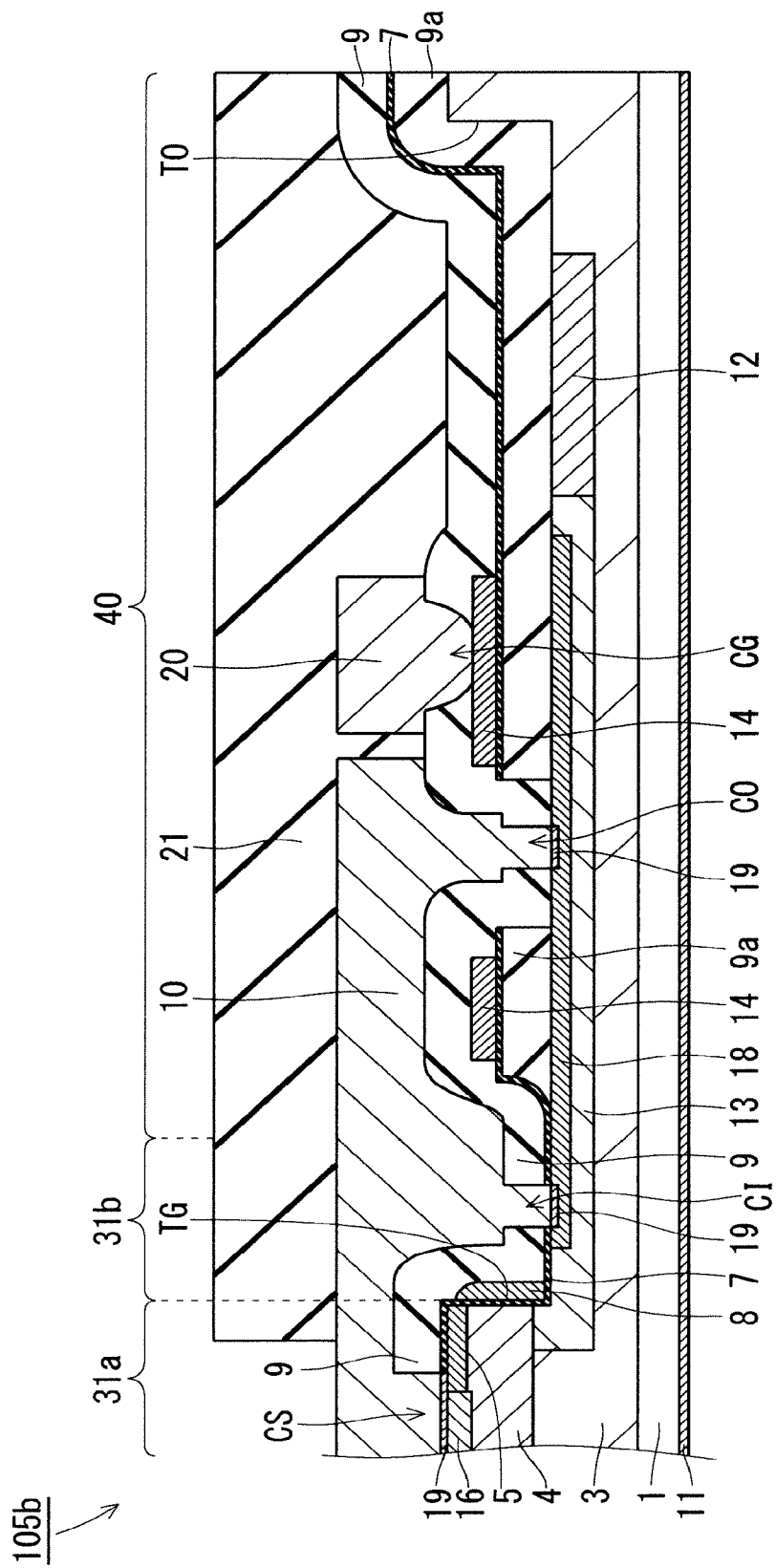
FIG. 40 is a partial cross-sectional view taken along a line XL-XL in FIG. 39.

FIG. 39 is a partial plan view schematically showing a configuration of a MOSFET 105b (semiconductor device) according to a second modification of the present embodiment. FIG. 40 is a partial cross-sectional view taken along a line XL-XL in FIG. 39. In the present modification, unlike the above-described first modification, the field insulating film 9a completely insulates the gate connection layer 14 and the trench-bottom high-concentration region 18 from each other.

Sixth Embodiment

While a MOSFET has been described as a semiconductor device in the above-described first to fifth embodiments, a semiconductor device is not limited to a MOSFET. A sixth embodiment will describe a case where a semiconductor device is an IGBT.

Figure 41:
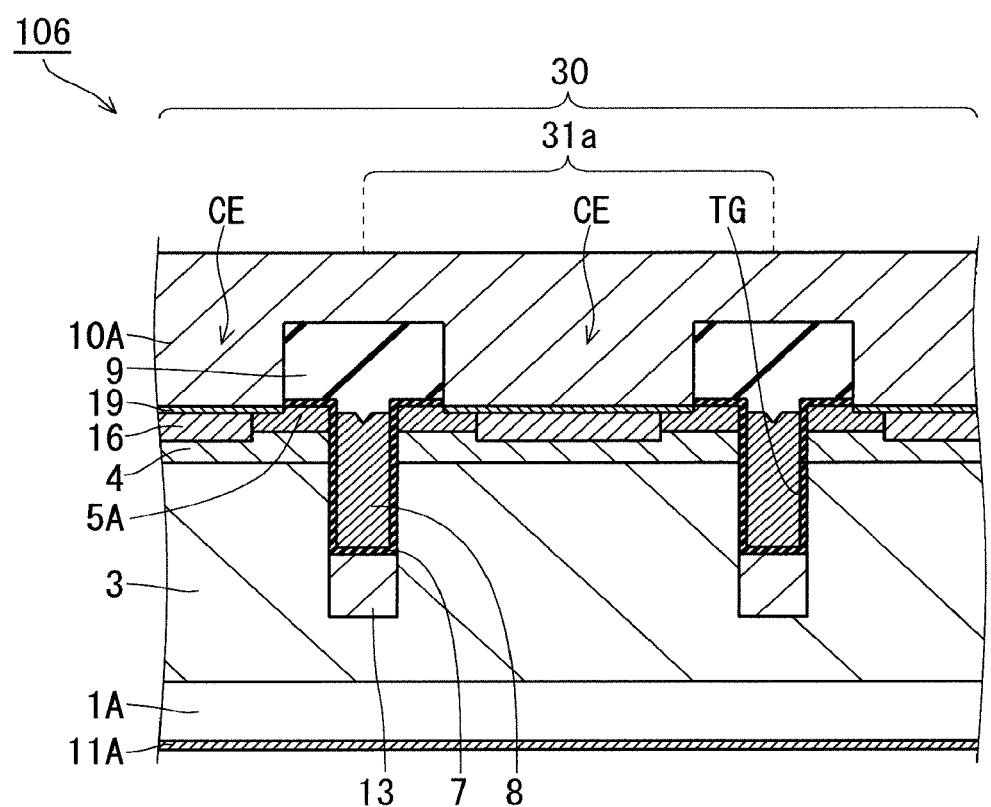
FIG. 41 is a partial cross-sectional view schematically showing a configuration of a semiconductor device according to a sixth embodiment of the present invention.

FIG. 41 is a partial cross-sectional view schematically showing a configuration of an IGBT 106 (semiconductor device) according to the present embodiment. The IGBT 106 includes a semiconductor substrate 1A (a second impurity region) in place of the semiconductor substrate 1 of the MOSFET 101 (FIG. 2). Whereas the semiconductor substrate 1 is of an n type, the semiconductor substrate 1A is of a p type. Thus, the semiconductor substrate 1A can function as a collector region in the IGBT 106. Also, the IGBT 106 includes an emitter region 5A (first impurity region), an emitter electrode 10A (first main electrode), and a collector electrode 11A (second main electrode) as components corresponding to the source region 5, the source electrode 10, and the drain electrode 11 of the MOSFET 101 (FIG. 2), respectively. In other words, in a manufacturing process of the MOSFET 101 (FIG. 2), by using the p-type semiconductor substrate 1A in place of the n-type semiconductor substrate 1, it is possible to obtain the IGBT 106. In the IGBT 106, the semiconductor substrate 1A is electrically connected to a drift layer 3 and the collector electrode 11A. Accordingly, the collector electrode 11A is electrically connected to the drift layer 3 via the semiconductor substrate 1A. Also, the semiconductor substrate 1A is separated from a well region 4 by the drift layer 3. The emitter electrode 10A includes an emitter contact CE (main contact) as a component corresponding to the source contact CS.

According to the present embodiment, in an IGBT, effects similar to those produced in the above-described first to fifth embodiments can be produced. It is noted that since the configuration is nearly identical to the above-described configurations of the first to fifth embodiments in the other respects than described above, the same or corresponding components are denoted by the same reference numerals and description of such components will not be repeated.

Besides, an IGBT can be obtained by other processes than described above. For example, an IGBT can be obtained by the following process.

Referring to FIG. 2, first, a structure shown therein is provided on an upper face of the semiconductor substrate 1. Secondly, the semiconductor substrate 1 is removed. Thirdly, a p-type collector region (second impurity region) is formed on a lower face of the drift layer 3 which is exposed as a result of removal of the semiconductor substrate 1. Formation of the collector region can be achieved by ion implantation into a lower face of the drift layer 3, for example. Then, the collector electrode 11A is formed on the collector region.

Seventh Embodiment

Figure 42:
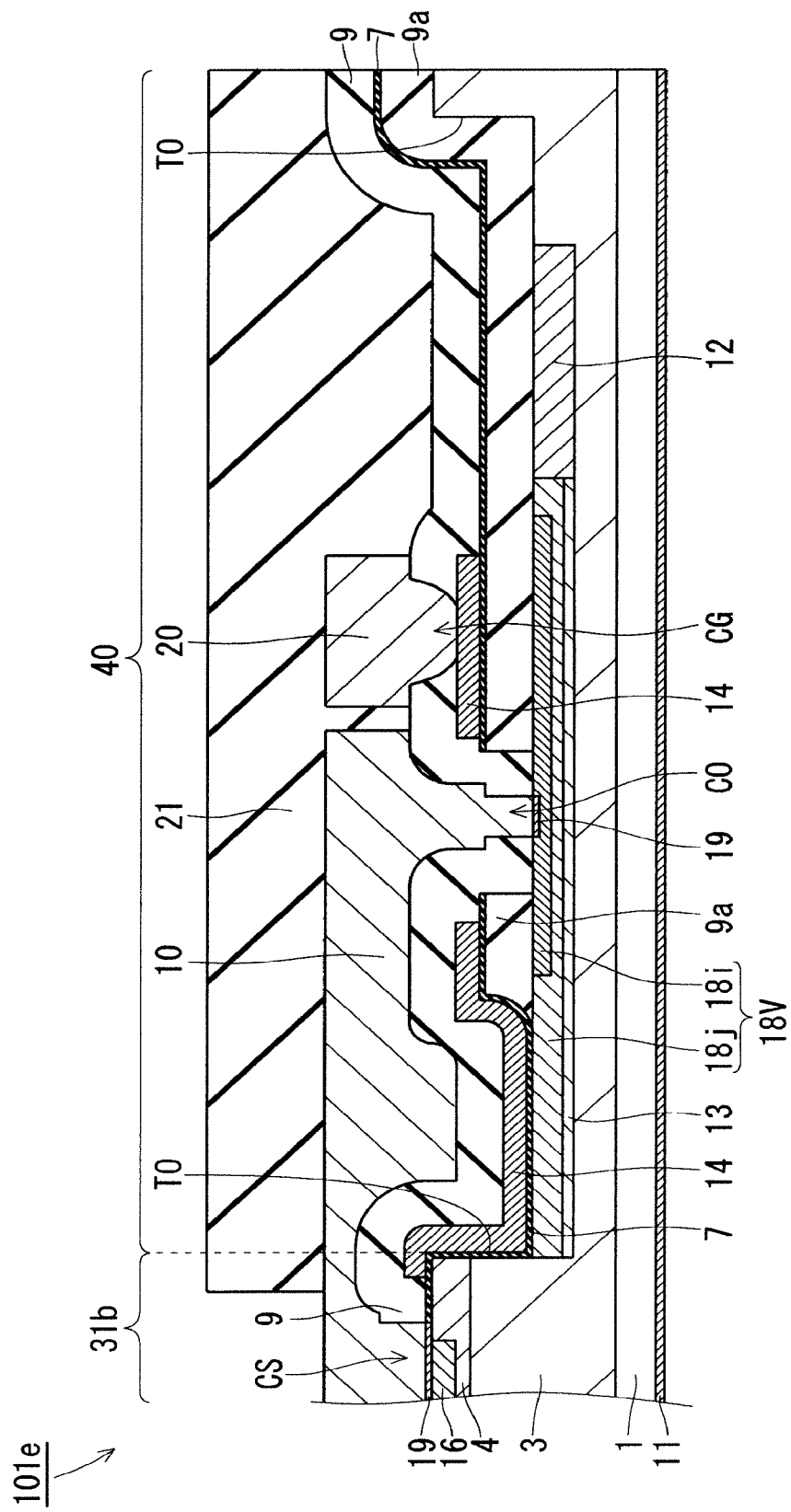
FIG. 42 is a partial cross-sectional view schematically showing a configuration of a semiconductor device according to a seventh embodiment of the present invention.

FIG. 42 is a partial cross-sectional view schematically showing a configuration of a MOSFET 101e (semiconductor device) according to a seventh embodiment. The MOSFET 101e includes a trench-bottom high-concentration region 18V in place of the trench-bottom high-concentration region 18 (FIG. 3: first embodiment). The trench-bottom high-concentration region 18V includes a first portion 18i which is in contact with an outer contact CO of a source electrode 10, and a second portion 18j having a p-type impurity concentration which is lower than a p-type impurity concentration of the first portion 18i. The second portion 18j is in contact with a gate connection layer 14 with only a gate insulating film 7 being interposed. The first portion 18i is not in contact with the gate insulating film 7. In other words, the first portion 18i is separated from the gate insulating film 7. Not the first portion 18i but the second portion 18j is in contact with the gate insulating film 7. The second portion 18j is placed within a terminating region 40, and forms a part of an outer trench TO.

It is noted that the first portion 18i and the second portion 18j can be formed in the same manner as the trench-bottom high-concentration region 18 (FIG. 3). More specifically, the first portion 18i and the second portion 18j can be formed either by the same process or by different processes. All of the first portion 18i, the second portion 18j, and a terminating field relaxing region 12 may be formed by the same process.

In the MOSFET 101 (FIG. 3: first embodiment), the trench-bottom high-concentration region 18 should have a sufficiently high impurity concentration in order to ensure that the outer contact CO has a p-type ohmic property with sufficiently low resistance. Such a high impurity concentration would probably make a surface of a semiconductor rougher after annealing for activation. When a surface of a portion of the trench-bottom high-concentration region 18, which portion is in contact with the gate connection layer 14 with only the gate insulating film 7 being interposed, is made rough to a great degree as described above, long-term reliability of the gate insulating film 7 on the foregoing portion may possibly be adversely affected.

In contrast thereto, according to the present embodiment, the trench-bottom high-concentration region 18V includes the first portion 18i and the second portion 18j. Since the first portion 18i having a relatively high impurity concentration is in contact with the outer contact CO, it is ensured that the outer contact CO has a p-type ohmic property with sufficiently low resistance. Further, not the first portion 18i having a relatively high impurity concentration, but the second portion 18j having a relatively low impurity concentration is in contact with the gate connection layer 14 with only the gate insulating film 7 being interposed, so that a portion having a rough surface in the trench-bottom high-concentration region 18V is prevented from being in contact with the gate connection layer 14 with only the gate insulating film 7 being interposed. As a result of this, the above-described decrease of long-term reliability of the gate insulating film 7 can be avoided.

While a semiconductor device having a MOS structure has been described in detail in each of the above embodiments, a metal insulator semiconductor (MIS) structure may be employed, other than a MOS structure. In other words, an insulating film other than an oxide film may be employed as a gate insulating film. Also, while a case where a first conductivity type is an n type and a second conductivity type is a p type has been described in detail, those conductivity types may be interchanged.

While properties, materials, dimensions, shapes, positional interrelationships, conditions for implementation, or the like of respective components have been described in some portions in the above-described embodiments, those are mere examples in all aspects, and each of the embodiments is not limited to those described. Accordingly, numerous modifications which are not illustratively described are conceivable within the scope of each of the embodiments. For example, there are included a case where an arbitrary component is transformed, is added, or is omitted, and further a case where at least one component in at least one embodiment is extracted and is combined with a component in another embodiment. Also, unless contradiction arises, a component which has been described as being "one" in each of the above-described embodiments may be "one or more". Further, each of components forming the invention is a conceptual unit, and there are included a case where one component includes a plurality of structures, a case where one component corresponds to a part of a certain structure. Also, description in the present specification should be referred to for all objects of the present invention, and no portion therein acknowledges being conventional arts.

EXPLANATION OF REFERENCE SIGNS

CE: emitter contact (main contact), CG: gate contact, CI: inner contact, CO: outer contact, CS: source contact (main contact), RE: end region, TG: gate trench, RI: inner region, TO: outer trench, 1: semiconductor substrate, 1A: semiconductor substrate (second impurity region), 3: drift layer, 4: well region, 5: source region (first impurity region), 5A: emitter region (first impurity region), 7: gate insulating film, 8: gate electrode, 9: interlayer insulating film, 9a: field insulating film, 10: source electrode (first main electrode), 10A: emitter electrode (first main electrode), 11: drain electrode (second main electrode), 11A: collector electrode (second main electrode), 12: terminating field relaxing region, 13: trench-bottom field relaxing region, 14: gate connection layer, 16: well contact region, 18, 18V: trench-bottom high-concentration region, 18a: trench-sidewall high-concentration well, 18i: first portion, 18j: second portion, 19: silicide region, 20: gate wire portion, 21: protective insulating layer, 30: active region, 31a: unit cell, 31b: active-region end, 40: terminating region, 101 to 105, 101a to 101e, 102a to 102c, 103a to 103d, 104a, 105a, 105b: MOSFET (semiconductor device), 106: IGBT (semiconductor device)

The invention claimed is:
1. A semiconductor device comprising:
a drift layer that lies over an active region and a region outside the active region and is of a first conductivity type;
a well region that is provided on the drift layer within the active region and is of a second conductivity type different from the first conductivity type;
a first impurity region that is provided on the well region, is separated from the drift layer by the well region, and is of the first conductivity type;
a gate trench that is provided within the active region and includes a sidewall facing the first impurity region, the well region, and the drift layer;
an outer trench provided in the drift layer outside the active region;
a gate insulating film provided in the gate trench and the outer trench;
a gate electrode provided in the gate trench with the gate insulating film being interposed;
a gate connection layer that is in contact with the gate electrode and includes a portion placed on the outer trench with the gate insulating film being interposed;
a first main electrode including a main contact that is electrically connected to the well region and the first impurity region within the active region, and an outer contact that is spaced away from the active region and is in contact with a bottom face of the outer trench;
a second main electrode that is electrically connected to the drift layer, is separated from the well region by at least the drift layer, and faces the first main electrode with the drift layer being interposed;
a trench-bottom field relaxing region that is provided in the drift layer, is separated from the second main electrode by the drift layer, and is of the second conductivity type; and
a trench-bottom high-concentration region that is of the second conductivity type, has an impurity concentration higher than an impurity concentration of the trench-bottom field relaxing region, is provided on the trench-bottom field relaxing region, and extends from a position where the trench-bottom high-concentration region faces the gate connection layer with the gate insulating film being interposed, to a position where the trench-bottom high-concentration region is in contact with the outer contact of the first main electrode.

2. The semiconductor device according to claim 1, wherein
the gate connection layer includes a portion placed on the outer trench with only the gate insulating film being interposed, and
the trench-bottom high-concentration region extends from a position where the trench-bottom high-concentration region faces the gate connection layer with only the gate insulating film being interposed, to a position where the trench-bottom high-concentration region is in contact with the outer contact of the first main electrode.

3. The semiconductor device according to claim 1, wherein
the first main electrode includes an inner contact that is in contact with a bottom face of the gate trench, and
the trench-bottom high-concentration region is in contact with the inner contact.

4. The semiconductor device according to claim 3, wherein
the active region includes an end region located in an end of the active region, and an inner region located inner than the end region, and
an area occupied by the inner contact per unit area in the end region is larger than an area occupied by the inner contact per unit area in the inner region.

5. The semiconductor device according to claim 3, wherein the trench-bottom high-concentration region extends from the outer contact to the inner contact.

6. The semiconductor device according to claim 1, further comprising
a field insulating film including a portion placed on the trench-bottom high-concentration region in the outer trench.

7. The semiconductor device according to claim 6, wherein
the field insulating film reaches an open end of the outer trench, and
the gate connection layer extends from an inside of the outer trench toward the active region to an outside of the outer trench and climbs onto the open end of the outer trench with the field insulating film and the gate insulating film on the field insulating film being interposed.

8. The semiconductor device according to claim 6, wherein
the field insulating film insulates the gate connection layer and the trench-bottom high-concentration region from each other.

9. The semiconductor device according to claim 6, wherein
the trench-bottom high-concentration region includes a first portion that is in contact with the outer contact of the first main electrode, and a second portion having an impurity concentration lower than an impurity concentration of the first portion,
the second portion is in contact with the gate connection layer with only the gate insulating film being interposed, and
the first portion is spaced away from the gate insulating film.

10. The semiconductor device according to claim 1, further comprising
a second impurity region that is electrically connected to the drift layer and the second main electrode, is separated from the well region by the drift layer, and is of the second conductivity type.

11. The semiconductor device according to claim 1, wherein
the drift layer is a silicon carbide layer.

12. The semiconductor device according to claim 1, wherein
the gate connection layer is formed of the same material as a material of the gate electrode.

* * * * *